(12) United States Patent
Ahn et al.

(10) Patent No.: US 11,152,534 B2
(45) Date of Patent: Oct. 19, 2021

(54) TRANSFER HEAD AND METHOD OF MANUFACTURING MICRO LED DISPLAY USING SAME

(71) Applicant: POINT ENGINEERING CO., LTD., Asan (KR)

(72) Inventors: Bum Mo Ahn, Suwon (KR); Seung Ho Park, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 147 days.

(21) Appl. No.: 16/534,699

(22) Filed: Aug. 7, 2019

(65) Prior Publication Data

US 2021/0043797 A1    Feb. 11, 2021

(51) Int. Cl.
    *H01L 33/00*      (2010.01)
    *H01L 27/15*      (2006.01)
    *H01L 33/48*      (2010.01)
    *H01L 25/075*     (2006.01)

(52) U.S. Cl.
    CPC ...... *H01L 33/0095* (2013.01); *H01L 25/0753* (2013.01); *H01L 27/156* (2013.01); *H01L 33/48* (2013.01)

(58) Field of Classification Search
    CPC ............. H01L 33/0095; H01L 25/0753; H01L 27/156; H01L 33/48
    See application file for complete search history.

(56) References Cited

U.S. PATENT DOCUMENTS

| | | | | |
|---|---|---|---|---|
| 2013/0130440 | A1* | 5/2013 | Hu | ............ H01L 33/0093 438/107 |
| 2017/0345692 | A1* | 11/2017 | Liu | ............ H05K 1/115 |
| 2018/0204973 | A1* | 7/2018 | Jeung | ............ H01L 33/32 |
| 2019/0115233 | A1* | 4/2019 | Chen | ............ F15D 1/00 |

FOREIGN PATENT DOCUMENTS

| | | |
|---|---|---|
| KR | 100731673 B1 | 6/2007 |
| KR | 20140112486 A | 9/2014 |
| KR | 20170019415 A | 2/2017 |
| KR | 20170024906 A | 3/2017 |
| KR | 20170026959 A | 3/2017 |
| KR | 101754528 B | 7/2017 |
| KR | 101757404 B1 | 7/2017 |

* cited by examiner

*Primary Examiner* — Bradley Smith

(57) ABSTRACT

The present invention relates to a transfer head and a method of manufacturing a micro LED display using the same. In particular, the present invention relates to a transfer head and a method of manufacturing a micro LED display using the same, the transfer head mounting normal micro LEDs on a display substrate without performing a complicated process of sorting out defective micro LEDs from the micro LEDs mounted on the display substrate and replacing the defective micro LEDs with normal micro LEDs.

5 Claims, 26 Drawing Sheets

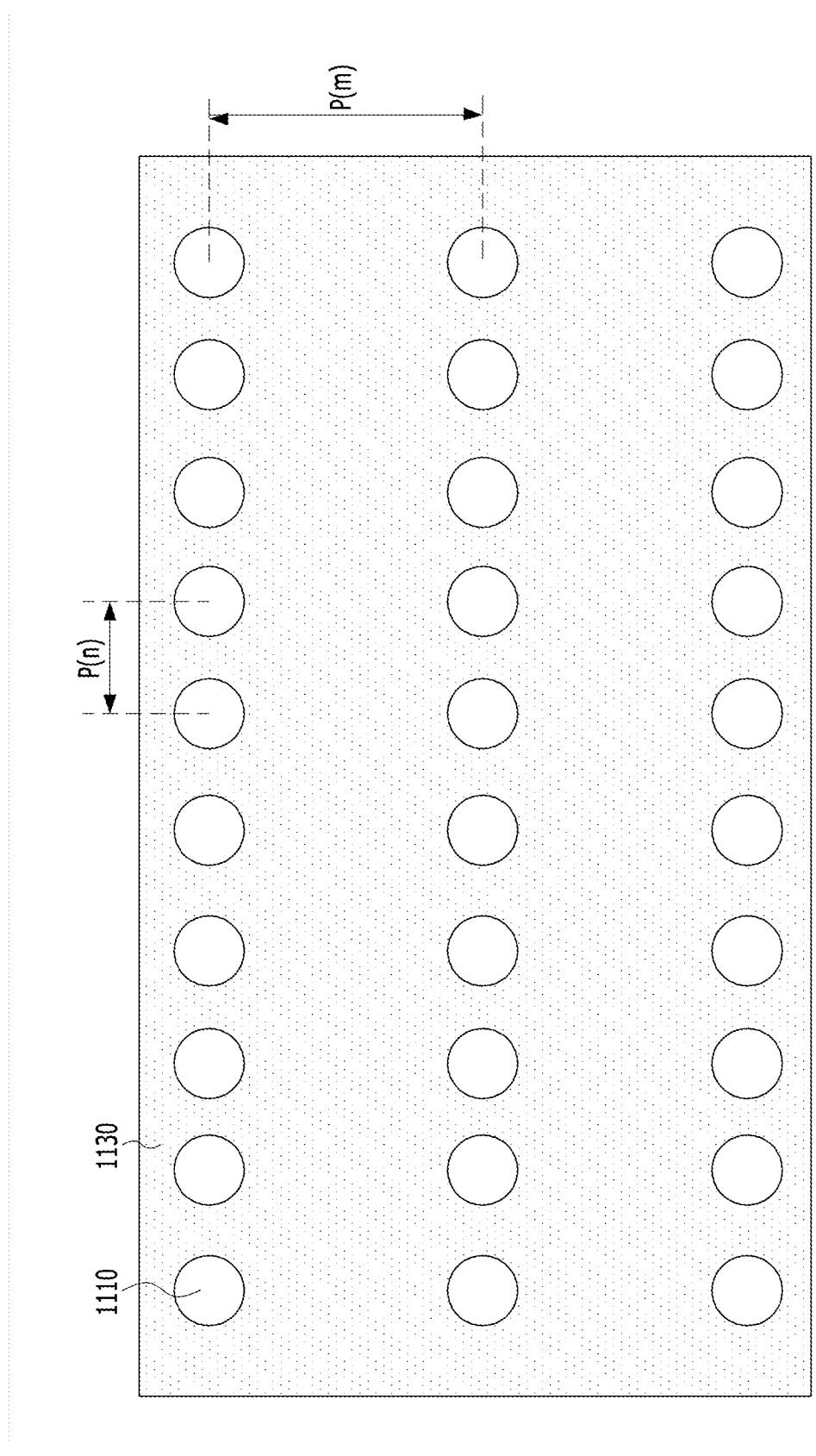

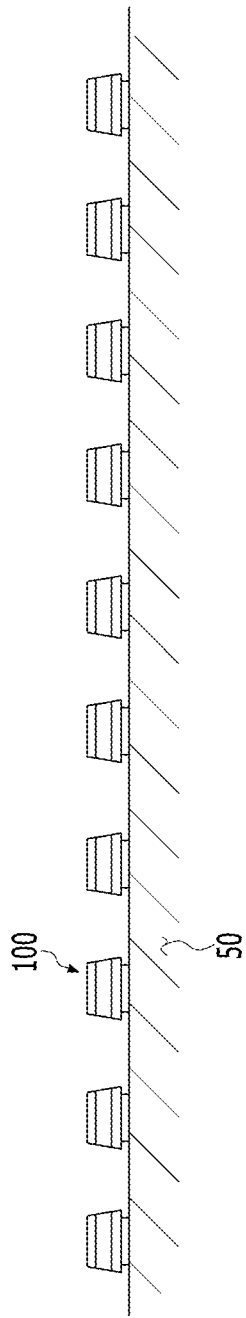
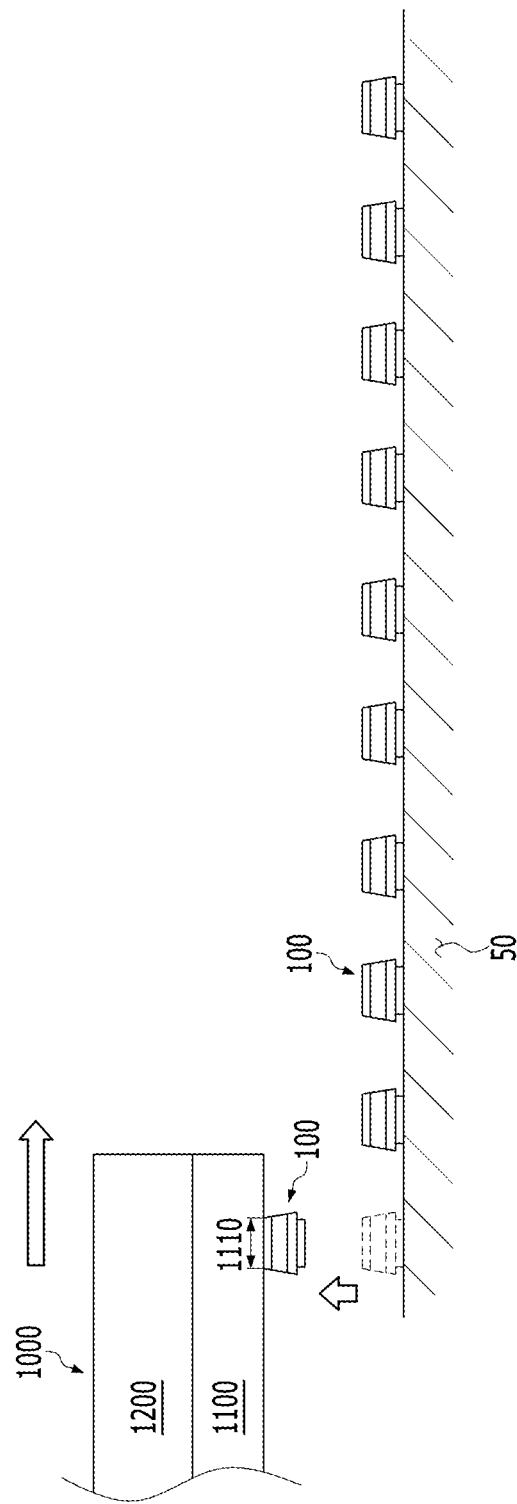

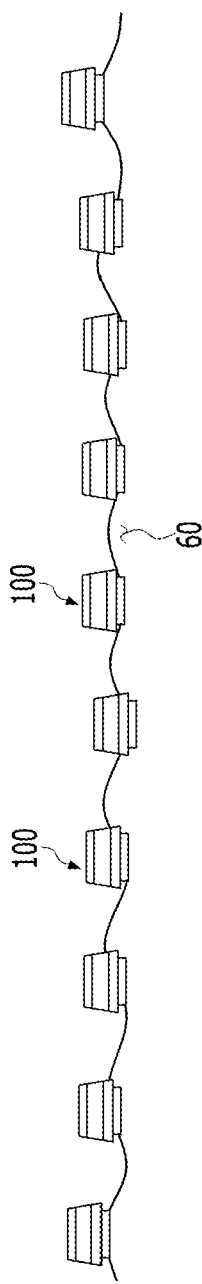
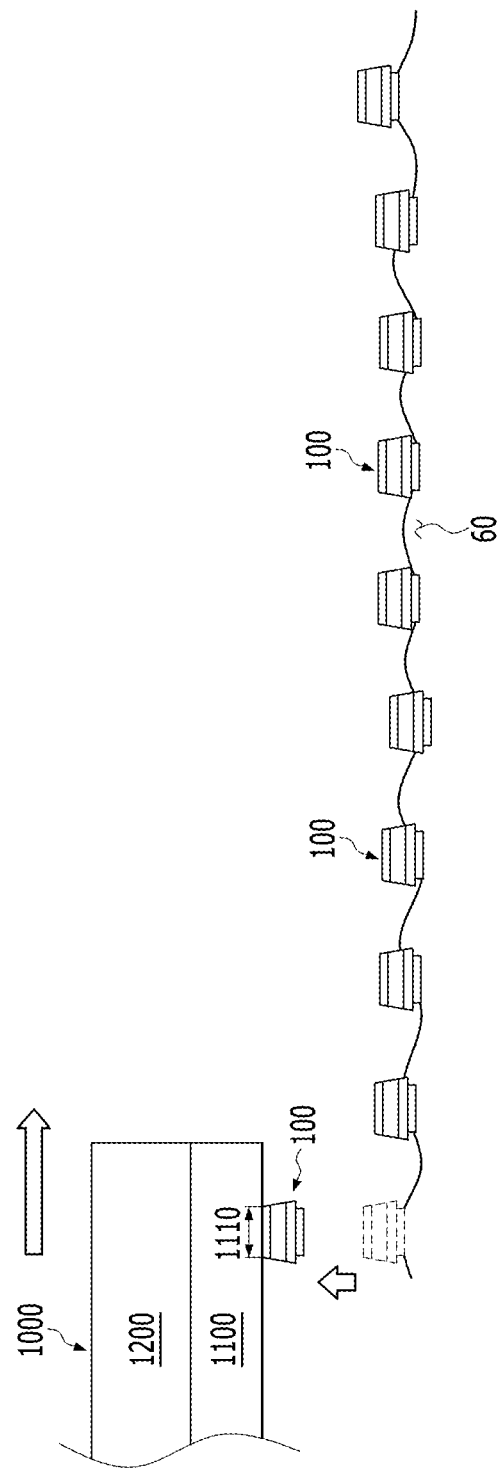
FIG. 6A
FIG. 6B

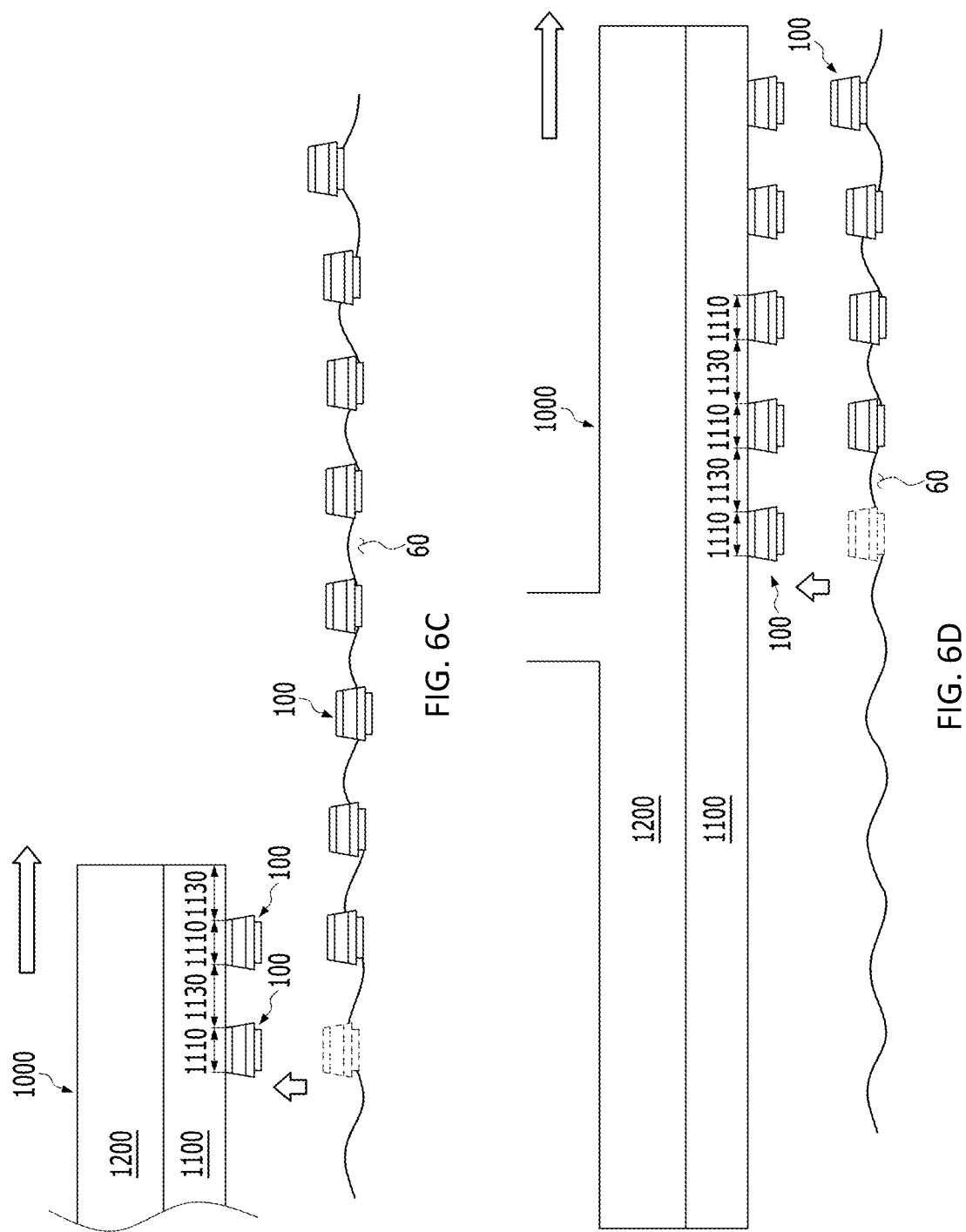

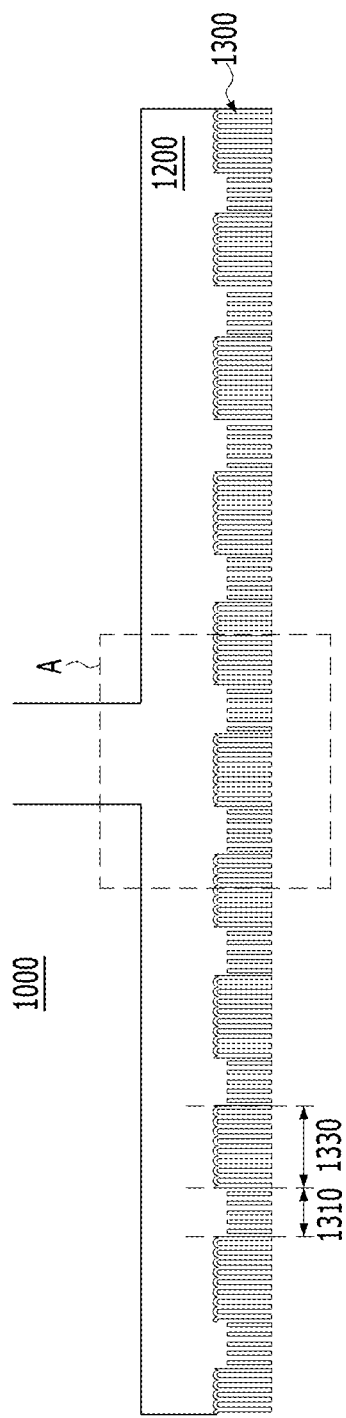
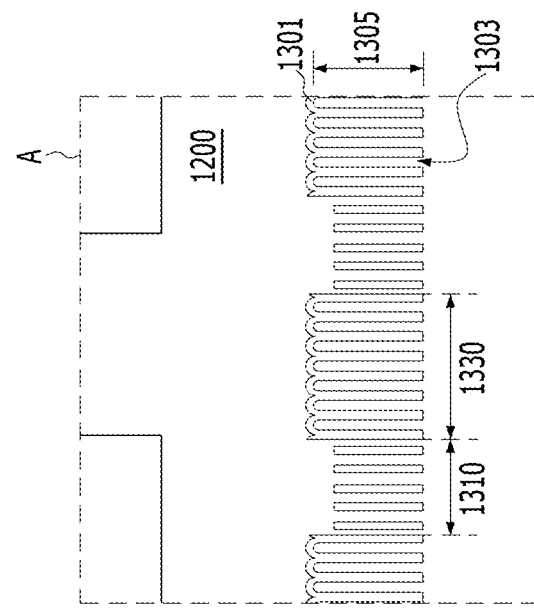

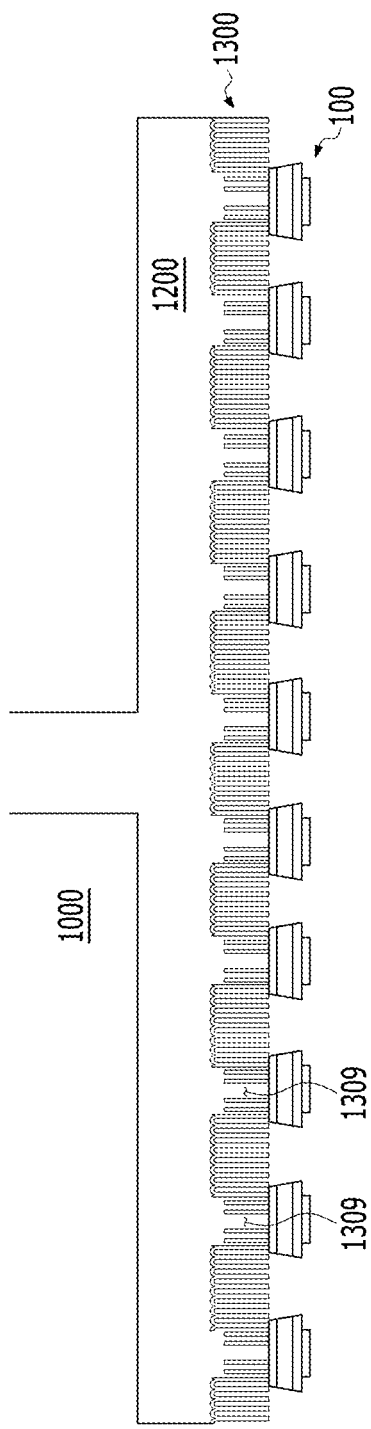
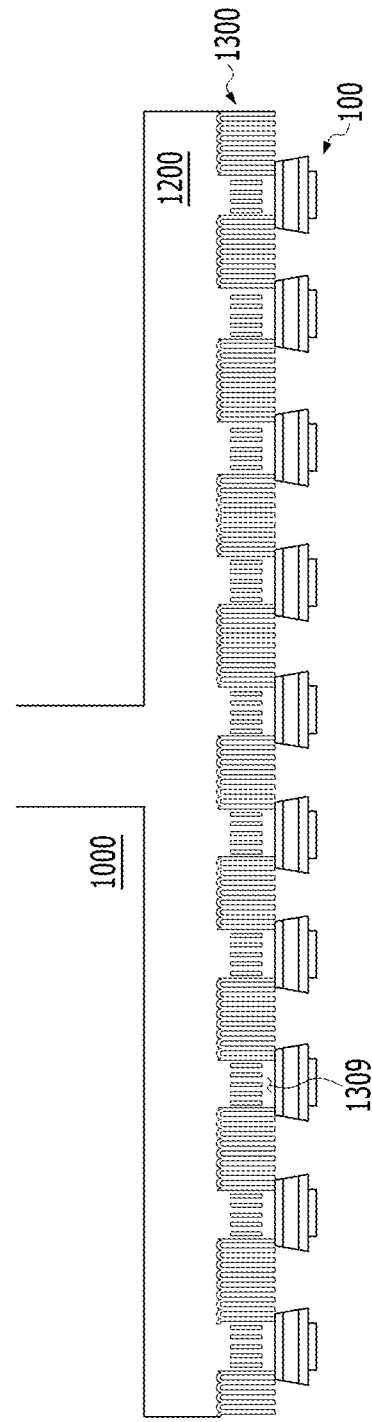
FIG. 11A
FIG. 11B

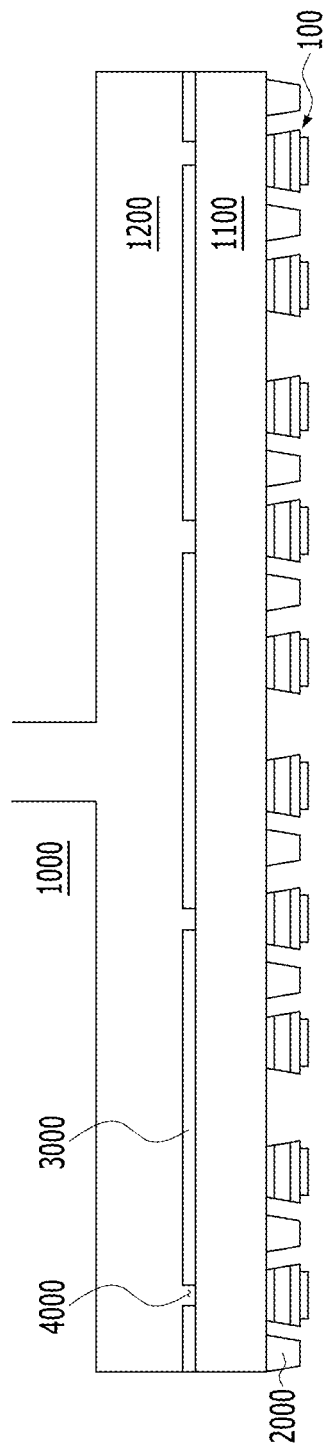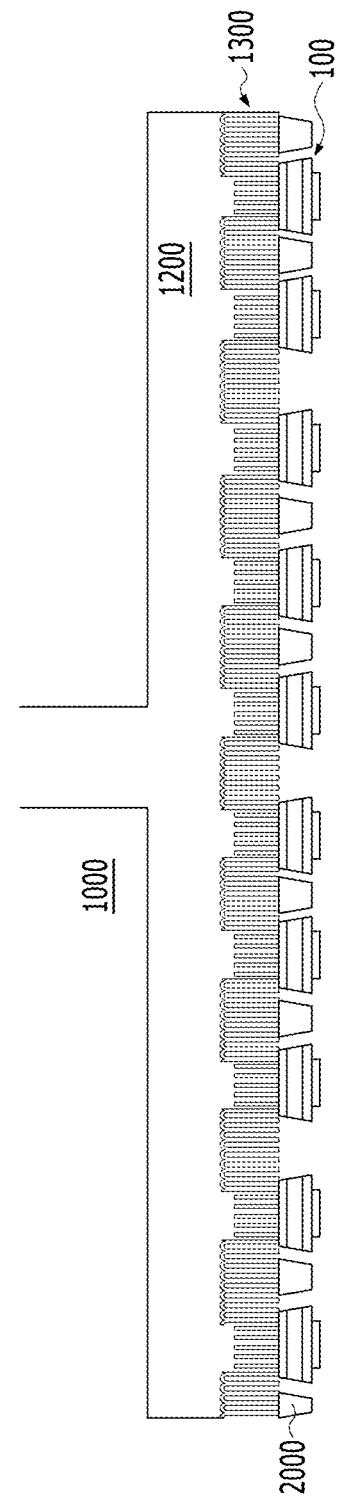
FIG. 19A
FIG. 19B

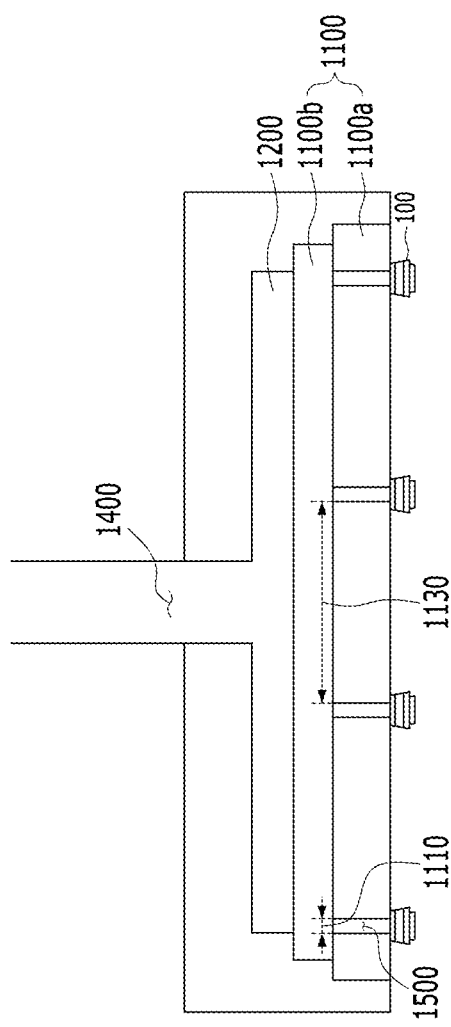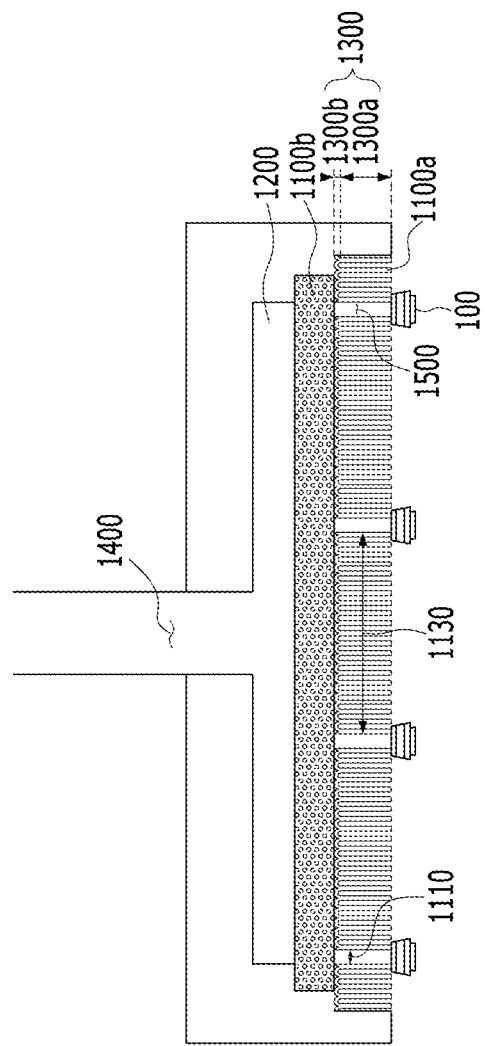

TRANSFER HEAD AND METHOD OF MANUFACTURING MICRO LED DISPLAY USING SAME

BACKGROUND OF THE INVENTION

Field of the Invention

The present invention relates to a transfer head gripping and transferring a micro light-emitting diode (micro LED) and a method of manufacturing a micro LED display using the same.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. Liquid crystal and organic materials are the core materials of LCDs and OLEDs, respectively, whereas the micro LED display uses 1 μm to 100 μm of an LED chip itself as light emitting material.

Since the term "micro LED" emerged in a patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or flexible device using a micro LED device, and techniques of transferring micrometer-sized LED chips and mounting the LED chips on a display pixel electrode are required.

Particularly, with regard to the transfer of the micro LED device to a display substrate, as the LED size is reduced to 1 μm to 100 μm, it is impossible to use a conventional pick-and-place machine, and a technology of a transfer head for higher precision is required. With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of the Related Art 2 is that a voltage is applied to a head portion made of a silicone material so that the head portion comes into close contact with a micro LED due to electrification. However, this method may cause damage to micro LEDs due to electrification caused by the voltage applied to the head portion during induction of static electricity.

X-Celeprint Limited, USA, proposed a method of using an elastic polymer material as a transfer head and transferring a micro LED positioned to a wafer to a target substrate (P) (Korean Patent Application Publication No. 10-2017-0019415, hereinafter referred to as 'Related Art 3'). According to the Related Art 3, there is no damage to micro LEDs as compared with the above-mentioned electrostatic head. However, an adhesive force of the elastic transfer head is required to be higher than that of the target substrate in the transfer process to transfer micro LEDs stably, and an additional process for forming an electrode is required. In addition, maintaining an adhesive strength of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in the Related Art 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Related Art 5'). However, the Related Art 5 has a problem in that continuous use of the adhesive is required, and micro LEDs may be damaged when pressed with the roller.

Samsung Display Co., Ltd proposed a method of transferring a micro-LED to an array substrate according to electrostatic induction by applying a negative voltage to first and second electrodes of the array substrate in a state where the array substrate is immersed in a solution (Korean Patent Application Publication No. 10-2017-0026959, hereinafter referred to as 'Related Art 6'). However, the Related Art 6 has a problem in that a solution is required since micro LEDs are immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Related Art 7'). However, the Related Art 7 has a problem in that an additional process of applying a bonding material having an adhesive force to bonding surfaces of the pick-up heads is required to transfer micro LEDs.

In addition to the problems of the above-described related arts, the related arts have a problem in that, when a transfer head transfers micro LEDs from a growth substrate to a display substrate, it is impossible to selectively sort out defective micro LEDs. Therefore, complicated processes are required in which the micro LEDs are mounted on the display substrate, inspection for defects is performed, and the defective micro LEDs are removed and replaced with normal micro LEDs.

In order to solve the problems of the related arts described above, it is necessary to solve the above-mentioned problems while adopting the basic principles adopted in the related arts. However, there is a limit to solving the problems because such problems are derived from the basic principles adopted in the related arts. Therefore, applicants of the present invention have not only solved the problems of the related arts but also proposed an advanced method which has not been considered in the related arts.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906.

SUMMARY OF THE INVENTION

Accordingly, the present invention has been made keeping in mind the above problems occurring in the related art, and an objective of the present invention to provide a transfer head and a method of manufacturing a micro LED display using the same, the transfer head mounting normal micro LEDs on a display substrate without performing a complicated process of sorting out defective micro LEDs from the micro LEDs mounted on the display substrate and replacing the defective micro LEDs with normal micro LEDs.

In order to achieve the above objective, there is provided a method of manufacturing a micro LED display using a transfer head including a porous member having pores, wherein the porous member includes a grip region on which micro LEDs are gripped and a non-grip region on which micro LEDs are not gripped, the method including: gripping micro LEDs onto the grip region while at least one of the transfer head and the micro LEDs move relative to the other in at least one of a horizontal direction and a vertical direction.

The micro LEDs gripped onto the grip region may be normal micro LEDs.

The transfer head may grip the micro LEDs from above a collecting box where normal micro LEDs are collected.

The micro LEDs gripped onto the grip region may be in a matrix form.

The transfer head may grip the micro LEDs from above a fluid in which normal micro LEDs float.

The movement of the at least one of the transfer head and the micro LEDs relative to the other may be achieved by reciprocation.

The movement of the at least one of the transfer head and the micro LEDs relative to the other may be achieved by rotation.

As described above, a transfer head and a method of manufacturing a micro LED display using the same according to the present invention have the following effects.

Only normal micro LEDs are gripped from a collecting box or a fluid where defective micro LEDs are already removed. Thus, it is possible to omit a complicated process of selectively removing defective micro LEDs among micro LEDs mounted on a display substrate and then replacing the defective micro LEDs with the normal micro LEDs. Accordingly, the process of transferring the micro LEDs can be performed efficiently.

Even when the normal micro LEDs are not regularly arranged in the collecting box or the fluid, the micro LEDs are gripped only onto grip regions while the transfer head moves horizontally, whereby the micro LEDs have a regular arrangement. Therefore, it is possible to efficiently mount the micro LEDs on the display substrate in the regular arrangement.

In addition, since the normal micro LEDs collected in the collecting box or floating in the fluid need not be regularly arranged, the process of sorting the normal micro LEDs and transferring the normal micro LEDs to the collecting box or the fluid can be performed quickly.

Since the grip regions are in the matrix form and the micro LEDs are gripped from the collecting box or the fluid, the problem that occurs when gripping the micro LEDs from the conventional circular growth substrate can be easily solved.

BRIEF DESCRIPTION OF THE DRAWINGS

The above and other objects, features and other advantages of the present invention will be more clearly understood from the following detailed description when taken in conjunction with the accompanying drawings, in which:

FIG. 4A to FIG. 4D are views illustrating examples of grip regions and a non-grip region of the transfer head according to the first embodiment of the present invention;

FIG. 5A to FIG. 5E are views illustrating a method of transferring micro LEDs using the transfer head according to the first embodiment of the present invention;

FIG. 6A to FIG. 6E are views illustrating a method of transferring micro LEDs using the transfer head according to the first embodiment of the present invention;

FIG. 7 is a view illustrating a transfer head according to a second embodiment of the present invention;

FIG. 8 is an enlarged view of portion A of FIG. 7;

FIG. 11A to FIG. 11C are views each illustrating a modification of the second embodiment of the present invention;

FIGS. 19A and 19B are views each illustrating a modification of the fifth embodiment of the present invention;

FIG. 20 is a view illustrating a transfer head according to a sixth embodiment of the present invention;

FIG. 21 is a view illustrating a transfer head according to a seventh embodiment of the present invention;

DETAILED DESCRIPTION OF THE INVENTION

Figure 1:
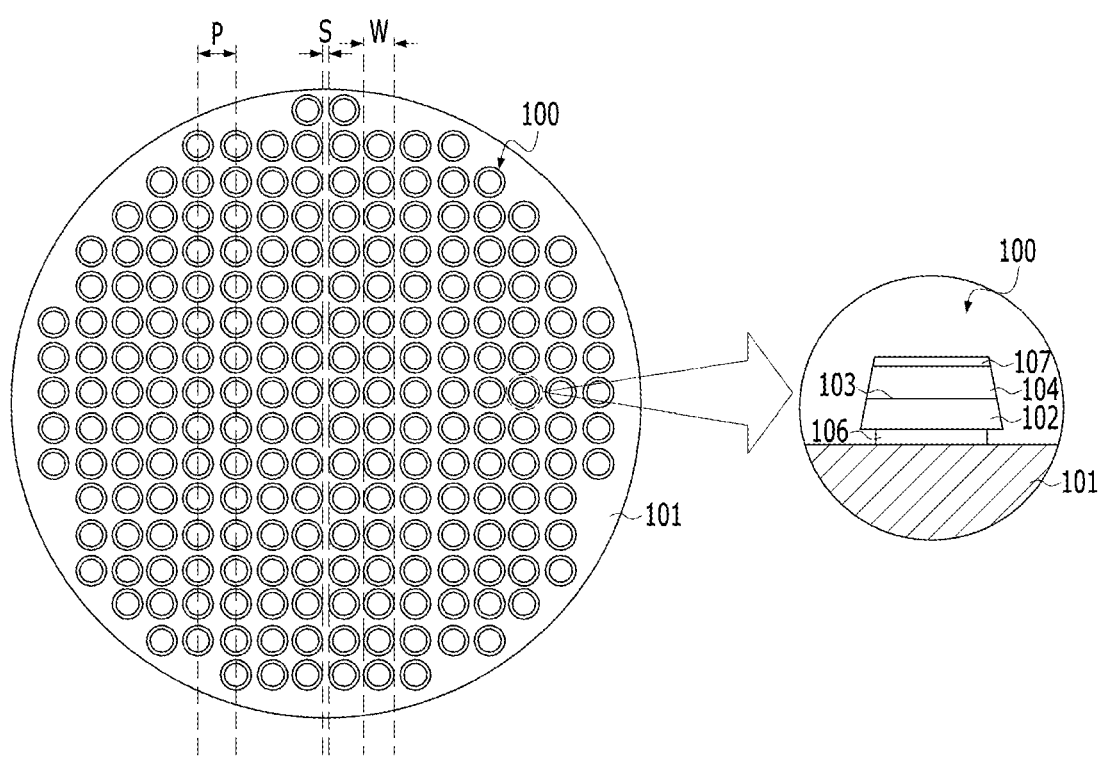
FIG. 1 is a view illustrating micro LEDs to be transferred according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

FIG. 1 is a view illustrating micro LEDs to be transferred according to an embodiment of the present invention.

Micro LEDs 100 are fabricated and disposed on a growth substrate 101.

The growth substrate 101 may be embodied by a conductive substrate or an insulating substrate. For example, the growth substrate 101 is made of at least one selected from among the group consisting of sapphire, SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba.

The second semiconductor layer 104 may be implemented, for example, as an n-type semiconductor layer. An n-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include one or more layers and may be made of various conductive materials including a metal, conductive oxide, and conductive polymer.

The multiple micro LEDs 100 formed on the growth substrate 101 are separated into individual pieces by cutting along a cutting line using a laser or the like or by etching. Then, it is possible to separate the individual micro LEDs 100 from the growth substrate 101 by a laser lift-off process.

In FIG. 1, the letter 'P' denotes a pitch distance between the micro LEDs 100, 'S' denotes a separation distance between the micro LEDs 100, and 'W' denotes a width of each micro LED 100.

Figure 2:
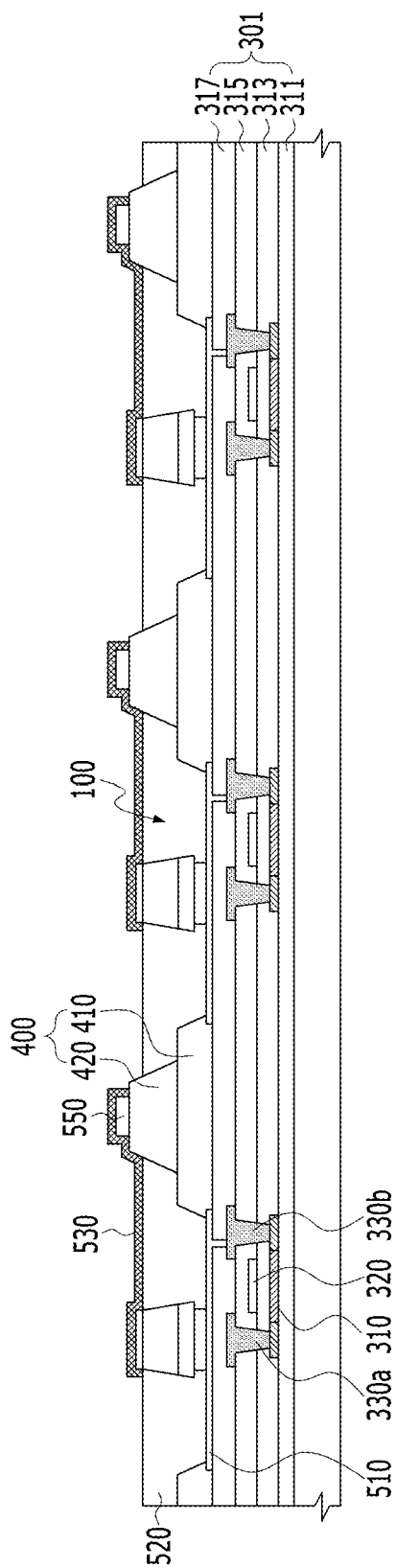
FIG. 2 is a view illustrating a micro LED structure in which the micro LEDs are transferred and mounted to a display substrate according to an embodiment of the present invention.

FIG. 2 is a view illustrating a micro LED structure in which the micro LEDs are transferred and mounted to a display substrate according to the embodiment of the present invention.

A display substrate 301 may include various materials. For example, the display substrate 301 may be made of a transparent glass material having $SiO_2$ as a main component. However, materials of the display substrate 301 are not limited to this, and the display substrate 301 may be made of a transparent plastic material and have solubility. The plastic material may be an organic insulating substance selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not required to be made of a transparent material. In this case, the display substrate 301 may be made of metal.

In the case of forming the display substrate 301 using metal, the display substrate 301 may be made of at least one metal selected from among the group consisting of iron, chromium, manganese, nickel, titanium, molybdenum, stainless steel (SUS), Invar, Inconel, and Kovar, but is not limited thereto.

The display substrate 301 may include a buffer layer 311. The buffer layer 311 provides a flat surface and blocks foreign matter or moisture from penetrating therethrough. For example, the buffer layer 311 may be made of an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed in a stacked manner with the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may contain a semiconductor material, such as amorphous silicon and polycrystalline silicon. However, the present embodiment is not limited thereto, and the active layer 310 may contain various materials. As an alternative embodiment, the active layer 310 may contain an organic semiconductor material or the like.

As another alternative embodiment, the active layer 310 may contain an oxide semiconductor material. For example, the active layer 310 may contain an oxide of a metal element selected from Groups 12, 13, and 14 elements such as zinc (Zn), indium (In), gallium (Ga), tin (Sn), cadmium (Cd), and germanium (Ge), and a combination thereof.

A gate dielectric layer 313 is formed on the active layer 310. The gate dielectric layer 313 serves to isolate the active layer 310 and the gate electrode 320. The gate dielectric layer 313 may be formed into a multilayer or a single layer of a film made of an inorganic substance such as silicon oxide and/or silicon nitride.

The gate electrode 320 is provided on the gate dielectric layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer dielectric film 315 is provided on the gate electrode 320. The interlayer dielectric film 315 isolates the source electrode 330a, the drain electrode 330b, and the gate electrode 320. The interlayer dielectric film 315 may be formed into a multilayer or single layer of a film made of an inorganic substance. For example, the inorganic substance may be a metal oxide or a metal nitride. Specifically, the inorganic substance may include silicon dioxide ($SiO_2$), silicon nitrides ($SiN_x$), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer dielectric film 315. Each of the source electrode 330a and the drain electrode 330b may be formed into a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating steps caused by the TFT and planarizing the top surface. The planarization layer 317 may be formed into a single layer or a multilayer of a film made of an organic substance. The organic substance may include a general-purpose polymer such as polymethyl methacrylate (PMMA) and polystyrene (PS); a polymer derivative having phenols; polyacrylates; polyimides, poly(aryl ethers); polyamides; fluoropolymers; poly-p-xylenes; and polyvinyl alcohols; and a combination thereof. In addition, the planarization layer 317 may be formed into a multi-stack including an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes. For example, the first electrode 510 may be patterned in an island layout. A bank layer 400 defining a pixel region may be disposed on the planarization layer 317. The bank layer 400 may include a recess where each of the micro LEDs 100 will be received. The bank layer 400 may include, for example, a first bank layer 410 defining the recess. A height of the first bank layer 410 may be determined by a height and viewing angle of the micro LED 100. A size (width) of the recess may be determined by resolution, pixel density, and the like, of a display device.

In an embodiment, the height of the micro LED 100 may be greater than the height of the first bank layer 410. The recess may have a quadrangular cross section, but is not limited to this. The recess may have various cross section shapes, such as polygonal, rectangular, circular, conical, elliptical, and triangular.

The bank layer 400 may further include a second bank layer 420 on the first bank layer 410. The first bank layer 410 and the second bank layer 420 have a step difference, and a width of the second bank layer 420 may be smaller than the width of the first bank layer 410. A conductive layer 550 may be disposed on the second bank layer 420. The conductive layer 550 may be disposed in a direction parallel to a data line or a scan line, and may be electrically connected to a second electrode 530. However, the present invention is not limited thereto. The second bank layer 420 may be omitted, and the conductive layer 550 may be disposed on the first bank layer 410. Alternatively, the second bank layer 420 and the conductive layer 550 may be omitted, and the second electrode 530 may be formed over the entire display substrate 301 such that the second electrode 530 serves as a shared electrode that pixels (P) share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 nm to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, polynorbornene, poly(methyl methacrylate) resin, and cyclic polyolefin resin; a thermosetting plastic such as epoxy resin, phenolic resin, urethane resin, acrylic resin, vinyl ester resin, polyimide resin, urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide and inorganic nitride including $SiO_x$, $SiN_x$, $SiN_xO_y$, $AlO_x$, $TiO_x$, $TaO_x$, and $ZnO_x$, but are not limited thereto. In an embodiment, the first bank layer 410 and the second bank layer 420 may be made of an opaque material such as a material of a black matrix. A material of the insulating black matrix may include a resin or a paste including organic resin, glass paste, and black pigment; metal particles such as nickel, aluminum, molybdenum, and alloys thereof; metal oxide particles (e.g., chromium oxide); metal nitride particles (e.g., chromium nitride); or the like. In an alternate embodiment, the first bank layer 410 and the second bank layer 420 may be a distributed Bragg reflector (DBR) having high reflectivity or a mirror reflector made of metal.

Each of the micro LEDs 100 is disposed in each recess. The micro LED 100 may be electrically connected to the first electrode 510 at the recess.

The micro LEDs 100 emit light having wavelengths of different colors such as red, green, blue, white, and the like. With the micro LEDs 100, it is possible to realize white light by using fluorescent materials or by combining colors. Each of the micro LED 100 has a size of 1 μm to 100 μm. The micro LEDs 100 are picked up from the growth substrate 101 individually or collectively by a transfer head according to an embodiment of the present invention, transferred to the display substrate 301, and received in the recess of the display substrate 301.

Each of the micro LEDs 100 includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may be made of at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED 100 in the recess. The passivation layer 520 covers the recess and the first electrode 510 by filling a space between the bank layer 400 and the micro LED 100. The passivation layer 520 may be made of an organic insulating substance. For example, the passivation layer 520 may be made of acrylic, poly(methyl methacrylate) (PMMA), benzocyclobutene (BCB), polyimide, acrylate, epoxy, and polyester, but is not limited thereto.

The passivation layer 520 is formed to have a height not covering an upper portion of the micro LED 100, for example, a height not covering the second contact electrode 107, whereby the second contact electrode 107 is exposed.

The second electrode 530 may be formed on the passivation layer 520 electrically connected to the exposed second contact electrode 107 of the micro LED 100.

The second electrode 530 may be disposed on the micro LED 100 and the passivation layer 520. The second electrode 530 may be made of a transparent conductive substance such as ITO, IZO, ZnO, and $In_2O_3$.

First Embodiment

Figure 3:
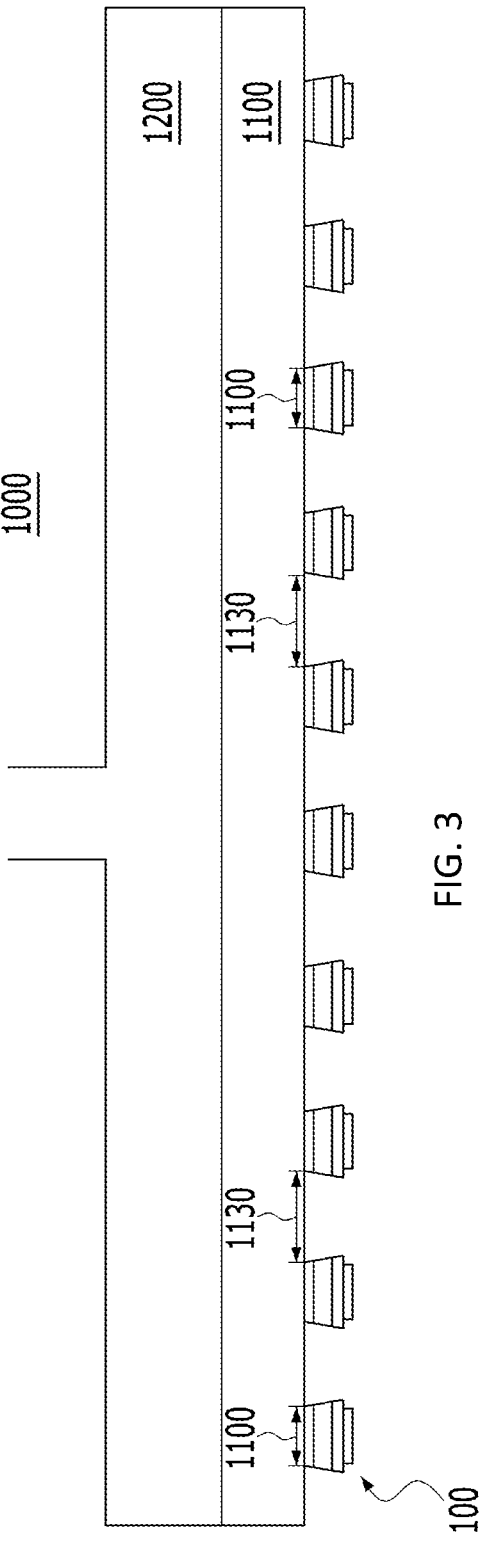
FIG. 3 is a view illustrating a transfer head according to a first embodiment of the present invention.

FIG. 3 is a view of a transfer head according to a first embodiment of the present invention; and FIG. 4A to FIG. 4D are views illustrating examples of grip regions and a non-grip region of the transfer head according to the first embodiment of the present invention.

A transfer head 1000 according to the first embodiment of the present invention includes: a porous member 1100 having pores, wherein the porous member 1100 includes grip regions 1110 on which the micro LEDs 100 are gripped and a non-grip region 1130 on which the micro LEDs 100 are not gripped.

The micro LED transfer head 1000 transfers the micro LEDs 100 to a second substrate (for example, the display substrate 301) from a first substrate (for example, the growth substrate 101) by applying a suction force to the pores of the porous member 1100 or releasing the suction force applied to the pores.

The micro LEDs 100 are gripped onto the grip regions 1110 while the micro LED transfer head 1000 moves relative to the micro LEDs 100 in a horizontal direction. In this case, the horizontal motion of the transfer head 1000 relative to the micro LEDs 100 may be a reciprocating motion. In addition, the horizontal motion of the transfer head 1000 relative to the micro LEDs 100 may be at least one of an X-axis motion or a Y-axis motion.

The micro LEDs 100 are gripped onto the grip regions 1110 while the micro LED transfer head 1000 moves relative to the micro LEDs 100 in a vertical direction. In this case, the vertical motion of the transfer head 1000 relative to the micro LEDs 100 may be a reciprocating motion. In addition, the vertical motion of the transfer head 1000 relative to the micro LEDs 100 may be an up and down motion or a raising and descending motion. In addition, the vertical motion of the transfer head 1000 relative to the micro LEDs 100 may be at least one of Z-axis motions.

The micro LEDs 100 are gripped onto the grip regions 1110 while the micro LED transfer head 1000 moves relative to the micro LEDs 100 in at least one of the vertical direction and the horizontal direction. In other words, while the micro LED transfer head 1000 moves relative to the micro LEDs 100 in at least one of the vertical direction and the horizontal direction, the micro LEDs 100 are gripped onto the grip regions 1110. In this case, while the micro LED transfer head 1000 freely moves reciprocally relative to the micro LEDs 100 on an XY plane, an XZ plane, and a Y-Z plane within a three-dimensional space composed of X-axis, Y-axis, and Z-axis, the micro LED transfer head 1000 grips the micro LEDs 100.

A suction chamber 1200 is provided on the porous member 1100. The suction chamber 1200 is connected to a suction port supplying a suction force or releasing a suction force. The suction chamber 1200 functions to apply a suction force to the multiple pores of the porous member 1100 or to release a suction force applied to the pores according to the operation of the suction port. A structure of engaging the suction chamber 1200 to the porous member 1100 is not limited as long as the structure is suitable for preventing gas or air from leaking to other parts when applying the suction force to the porous member 1100 or releasing the applied suction force.

The gripping of the micro LEDs 100 by the above-described suction chamber 1200 may be realized by vacuum-suction. Therefore, in the following description, the description will be based on the transfer head 1000 gripping the micro LEDs 100 by vacuum-suction.

In order to vacuum-suck the micro LEDs 100, vacuum pressure applied to the suction chamber 1200 is transferred to the multiple pores of the porous member 1100 to generate a vacuum suction force for the micro LEDs 100. In order to detach the micro LEDs 100, the vacuum pressure applied to the suction chamber 1200 is released to remove the vacuum pressure from the multiple pores of the porous member 1100 whereby the vacuum suction force to the micro LEDs 100 is removed.

The porous member 1100 may be composed of a material containing a large number of pores therein, and may be formed in a form of a powder, a thin film, a thick film, or a bulk having a porosity of about 0.2 to 0.95 in a predetermined arrangement or disordered pore structure. The pores of the porous member 1100 are classified according to pore sizes thereof: micropores having a pore diameter of 2 nm or less, mesopores having a pore diameter of 2 nm to 50 nm, and macropores having a pore diameter of 50 nm or more. The porous member 1100 may include at least some of micropores, mesopores, and macropores. Porous materials of the porous member 1100 are classified according to constituent components thereof: organic, inorganic (ceramic), metal, and hybrid type. The porous member 1100 may be embodied by an anodic oxide film in which pores are formed in a predetermined arrangement. The porous member 1100 may be formed in a form of a powder, a coating film, or a bulk form. The powder may have various shapes such as a sphere, a hollow sphere, a fiber, and a tube. The powder may be used as it is in some cases, but it is also possible to prepare a coating film or a bulk form with the powder as a starting material.

When the pores of the porous member 1100 have a disordered pore structure, the multiple pores are connected to each other inside the porous member 1100 such that flow paths are formed and connect upper and lower portions of the porous member 1100. When the pores of the porous member 1100 have a vertical pore structure, the inside of the porous member 1100 is pierced from top to bottom by the vertical pores such that air flow paths are formed.

The porous member 1100 includes the grip regions 1110 on which the micro LEDs 100 are gripped and the non-grip region 1130 on which the micro LEDs 100 are not gripped. The grip regions 1110 are regions where vacuum pressure of the suction chamber 1200 is transferred and the micro LEDs 100 are gripped. The non-grip region 1130 is a region where the vacuum pressure of the suction chamber 1200 is not transferred and thus the micro LEDs 100 are not gripped.

The non-grip region 1130 may be embodied by forming a shielding portion on at least a part of a surface of the porous member 1100. The shielding portion is formed to close the pores exposed at least on a part of a surface of the porous member 1100. The shielding portion may be formed on at least a part of upper and lower surfaces of the porous member 1100. In particular, in the case where the porous member 1100 has the disordered pore structure, the shielding portion may be formed on both the upper and lower surfaces of the porous member 1100.

The shielding portion is not limited in material, shape, and thickness as long as the shielding portion functions to close the pores exposed to the surface of the porous member 1100. Preferably, the shielding portion may be further provided and made of a photoresist (PR, including dry film PR) or a metal or may be embodied by the structure of the porous member 1100 itself. In the case the shielding portion is embodied by the structure of the porous member 1100, for example, in a case where the porous member 1100 to be described later is made of an anodic oxide film, the shielding portion may be a barrier layer or a metal base material.

A size of a horizontal area of each of the grip regions 1110 may be smaller than a size of a horizontal area of an upper surface of each micro LED 100 to prevent a vacuum leak while the micro LEDs 100 are gripped by vacuum-suction, whereby it is possible to perform vacuum-suction easily.

The transfer head 1000 may be provided with a monitoring unit monitoring the degree of vacuum of the suction chamber 1200. The monitoring unit may monitor the degree of vacuum generated in the suction chamber 1200, and a control unit may control the degree of vacuum of the suction chamber 1200 according to the degree of vacuum of the suction chamber 1200. When the monitoring unit monitors that the degree of vacuum of the suction chamber 1200 becomes lower than a predetermined range of the degree of vacuum, the control unit may determine that some of the micro LEDs 100 to be vacuum-sucked onto the porous member 1100 are not vacuum-sucked or may determine that there is a vacuum leak, and thus instruct the transfer head 1000 to operate again. Accordingly, the transfer head 1000 transfers the micro LEDs 100 without error according to the degree of vacuum in the suction chamber 1200.

In detail, the control unit is connected to a sensor measuring the degree of vacuum inside the suction chamber, and the sensor measures the degree of vacuum inside the suction chamber. When the degree of vacuum does not reach a predetermined level, the control unit determines that gripping of all of the micro LEDs 100 to be gripped has failed, and instructs the transfer head 1000 to operate again.

For example, it is supposed that the transfer head 1000 can grip ten thousand micro LEDs 100, and the degree of vacuum measured by the sensor is 100 when the transfer head 1000 grips the ten thousand micro LEDs 100. In this case, the degree of vacuum 100 is a predetermined level. In a case where the transfer head 1000 grips only 9,999 micro LEDs 100, the sensor measures the degree of vacuum and obtains a value of the degree of vacuum which is lower than 100, for example, 99.98. Since the obtained value of the degree of vacuum is lower than the predetermined level, the control unit determines that some of the micro LEDs 100 to be gripped are not gripped and instructs the transfer head 1000 to operate again until the predetermined level of 100 is reached, whereby gripping all of the micro LEDs 100 can be achieved.

In addition, the transfer head 1000 may be provided with a buffer member to buffer the contact between the porous member 1100 and the micro LEDs 100. A material of the buffer member is not limited as long as the buffer member buffers the contact between the porous member 1100 and the micro LED 100 and has an elastic force. The buffer member may be provided between the porous member 1100 and the suction chamber 1200, but a position where the buffer member is mounted is not limited thereto. The buffer member may be provided at any position of the transfer head 1000 as long as the buffer member at a certain position buffers the contact between the porous member 1100 and the micro LED 100.

Figure 4A:
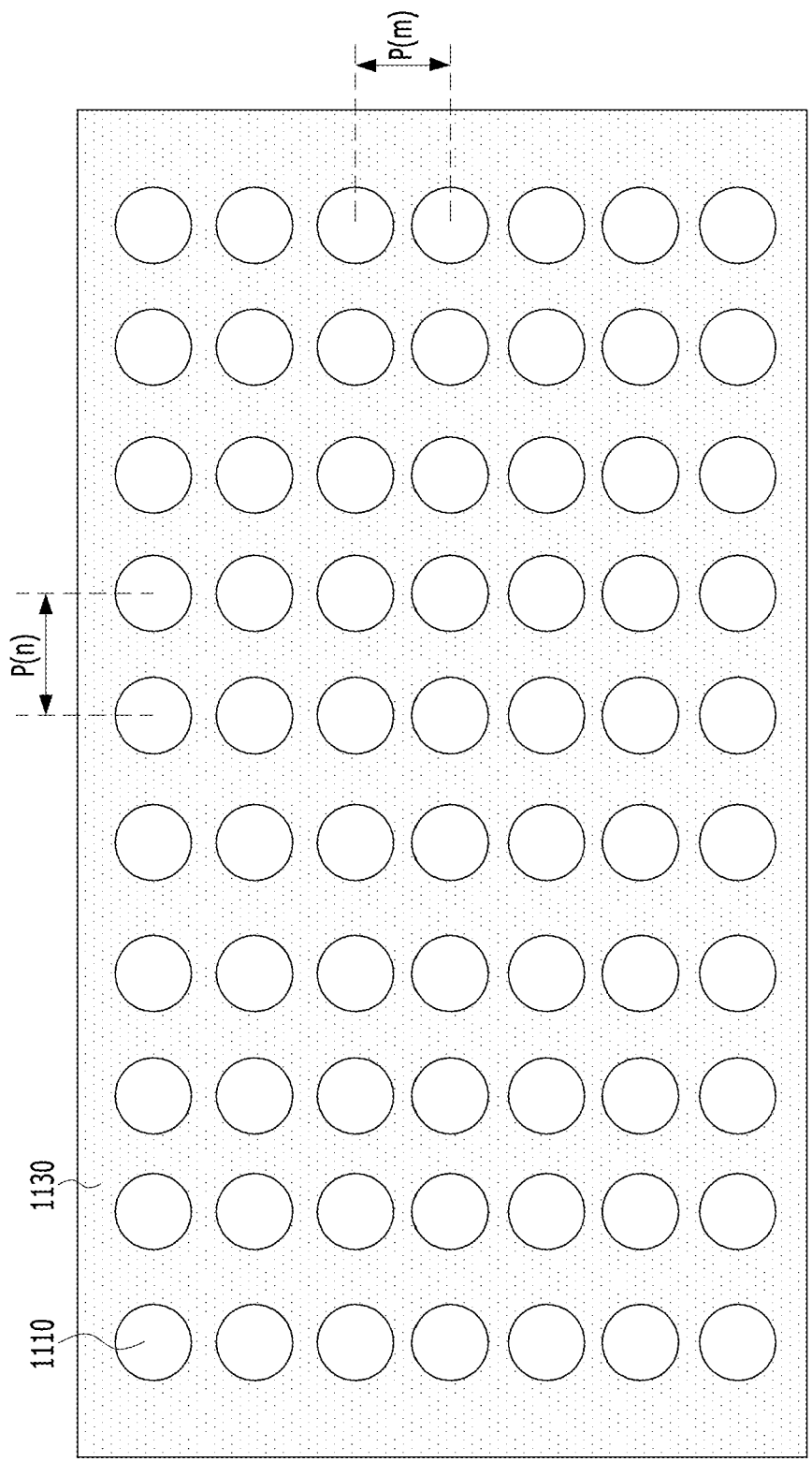

In a case where a pitch distance of the micro LEDs 100 on the growth substrate 101 is P(n) in a column direction and a pitch distance of the micro LEDs 100 on the growth substrate 101 in a row direction is P(m), the grip regions 1110 may be configured with pitch distances equal to the pitch distances of the micro LEDs 100 positioned on the growth substrate 101 as illustrated in FIG. 4A. In other words, when the pitch distances of the micro LEDs 100 positioned on the growth substrate 101 are P(n) in the column direction and P(m) in the row direction, pitch distances of the grip regions 1110 of the transfer head 1000 may be P(n) in a column direction and P(m) in a row direction. According to the above configuration, the micro LED transfer head 1000 vacuum-sucks all of the micro LEDs 100 from the growth substrate 101 at the same time.

Figure 4B:
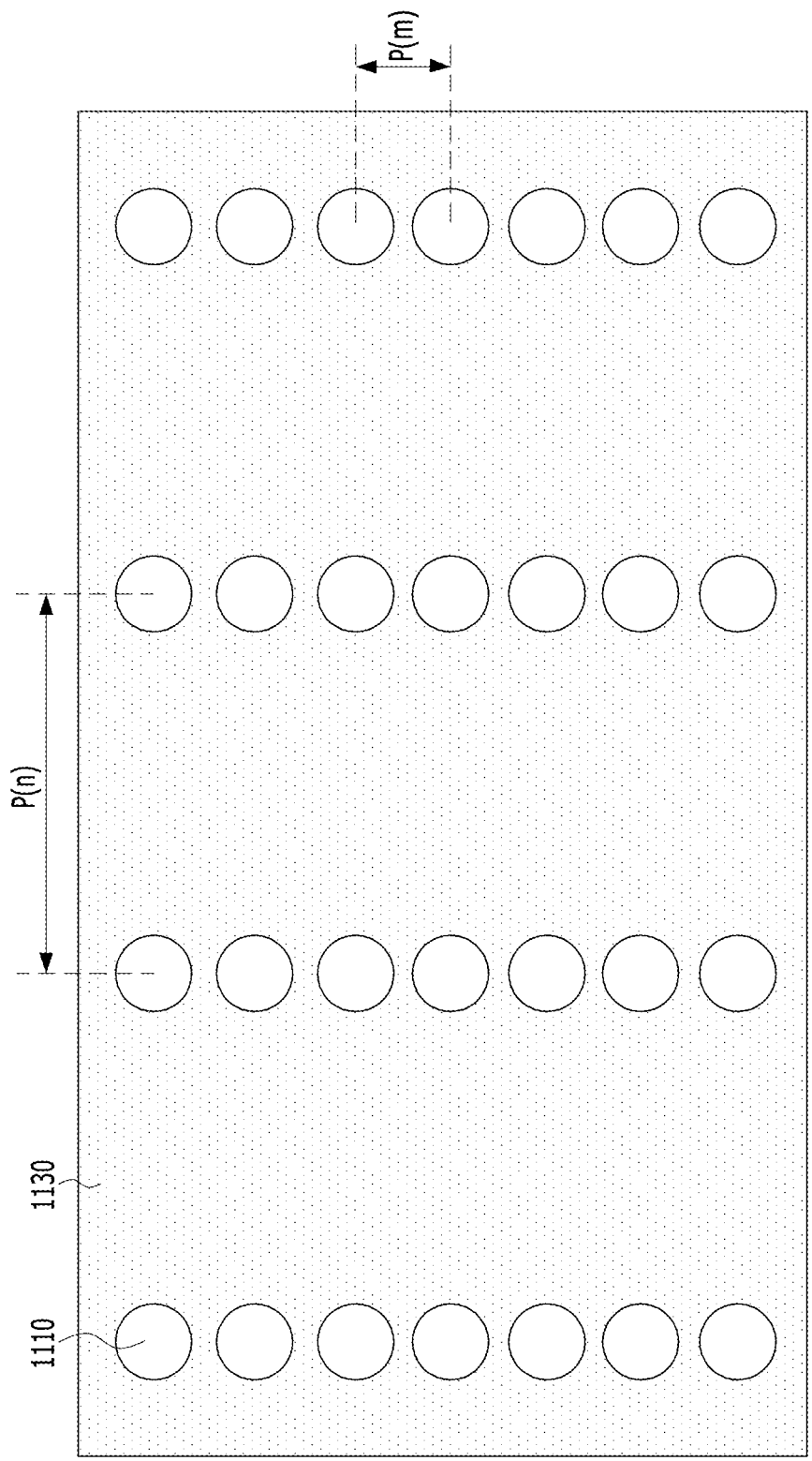

Alternatively, when pitch distances of the micro LEDs 100 positioned on the growth substrate 101 are P(n) in the column direction and P(m) in the row direction, pitch distances of the grip regions 1110 may be 3p(n) in a column direction and p(m) in a row direction as illustrated in FIG. 4B. Here, 3p(n) means 3 times the column pitch distance p(n) illustrated in FIG. 4A. According to the above configuration, only the micro LEDs 100 positioned at (3n)th column are vacuum-sucked and transferred. Here, each of the micro LEDs 100 transferred in the (3n)th column may be any one of red, green, blue, and white LEDs. With the configuration, it is possible to transfer the micro LEDs 100 of the same luminous color mounted on the display substrate 301 with pitch distances of 3p(n).

Alternatively, when pitch distances of the micro LEDs 100 positioned on the growth substrate 101 are P(n) in the column direction and P(m) in the row direction, pitch distances of the grip regions 1110 may be p(n) in a column direction and 3p(m) in a row direction as illustrated in FIG. 4C. Here, 3p(m) means 3 times the row pitch distance p(m) illustrated in FIG. 4A. According to the above configuration, only the micro LEDs 100 positioned at (3n)th row are vacuum-sucked and transferred. Here, each of the micro LEDs 100 transferred in the (3n)th row may be any one of red, green, blue, and white LEDs. With the configuration, it is possible to transfer the micro LEDs 100 of the same luminous color mounted on the display substrate 301 at distances of 3p(m).

Figure 4D:
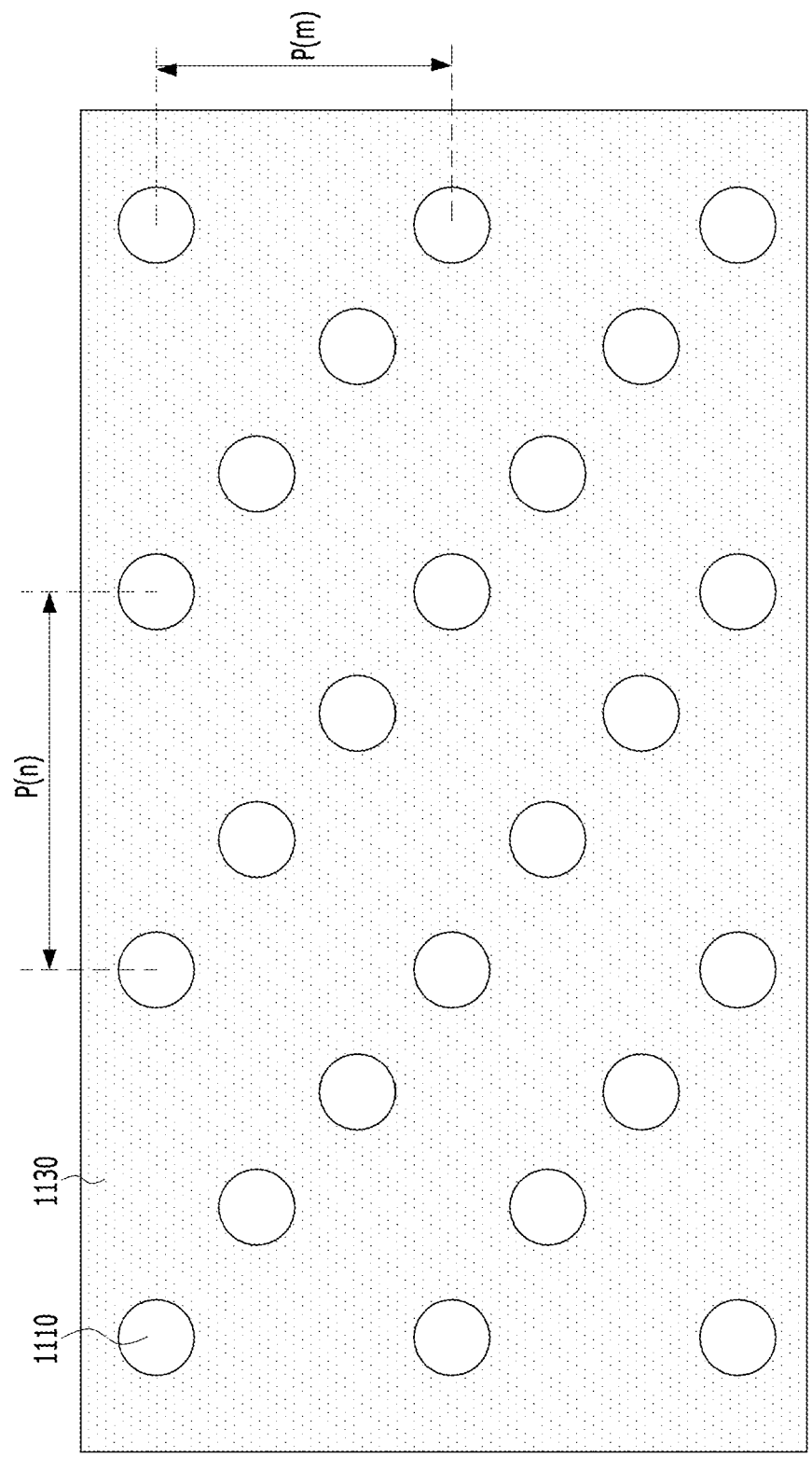

Alternatively, when pitch distances of the micro LEDs 100 positioned on the growth substrate 101 are P(n) in the column direction and P(m) in the row direction, the grip regions 1110 may be configured in a diagonal direction such that pitch distances of the grip regions 1110 are 3p(n) in a column direction and 3p(m) in a row direction as illustrated in FIG. 4D. Here, each of the micro LEDs 100 transferred in the (3n)th row and (3n)th column may be any one of red, green, blue, and white LEDs. According to the above configuration, by arranging the micro LEDs 100 of the same luminous color to be mounted on the display substrate 301 with pitch distances of 3p(n) and 3p(m), the micro LEDs 100 of the same luminous color are transferred in the diagonal direction.

In the case of the present invention, since the micro LEDs 100 have a circular cross section, the grip regions 1110 may also be formed in a circular shape as illustrated in FIG. 4A to FIG. 4D. However, the shape of the grip regions 1110 may vary depending on the cross-sectional shape of the micro LEDs 100. For example, when the micro LEDs 100 have a quadrangular cross section, the grip regions 1110 may have a quadrangular cross section corresponding to the cross-sectional shape of the micro LEDs 100.

Hereinafter, a method of transferring normal micro LEDs 100 collected in a collecting box 50 by using the micro LED transfer head 1000 according to the first embodiment of the present invention will be described with reference to FIG. 5A to FIG. 5E.

FIG. 5A to FIG. 5E are process diagrams illustrating the transfer method using the micro LED transfer head 1000 according to the first embodiment of the present invention.

The multiple micro LEDs 100 on the growth substrate 101 are prepared to be separable from the growth substrate 101.

Product inspection of the multiple micro LEDs 100 separated from the growth substrate 101 is carried out, and normal micro LEDs 100 are transferred to the collecting box 50 and defective micro LEDs 100 are not.

As illustrated in FIG. 5A, the normal micro LEDs 100 transferred to the collecting box 50 are placed in the collecting box 50. In this case, unlike the growth substrate 101, the micro LEDs 100 may have irregular intervals therebetween. This is because even when the micro LEDs 100 have irregular intervals in the collecting box 50, the micro LEDs 100 can be transferred again with regular intervals by grip of the transfer head 1000 which will be described later.

Referring to FIG. 5B, the transfer head 1000 moves in the horizontal direction (right direction in FIG. 5B) over the multiple micro LEDs 100 collected in the collecting box 50 while the suction force of the grip regions 1110 is generated.

In other words, the transfer head 1000 moves in the horizontal direction while a lower surface of the transfer head 1000, that is, the porous member 1100 having the grip regions 1110 and the non-grip region 1130 is spaced apart from upper surfaces of the multiple micro LEDs 100 collected in the collecting box 50 by a predetermined distance. In this case, it is preferable that the predetermined distance is set to a distance that still attracts the micro LEDs 100 with the grip force of the grip regions 1110.

As the suction force is generated in the grip regions 1110 of the transfer head 1000, the leftmost micro LEDs 100 in the collecting box 50 are gripped onto the rightmost grip regions 1110 of the grip regions 1110 of the transfer head 1000.

Figure 5C:
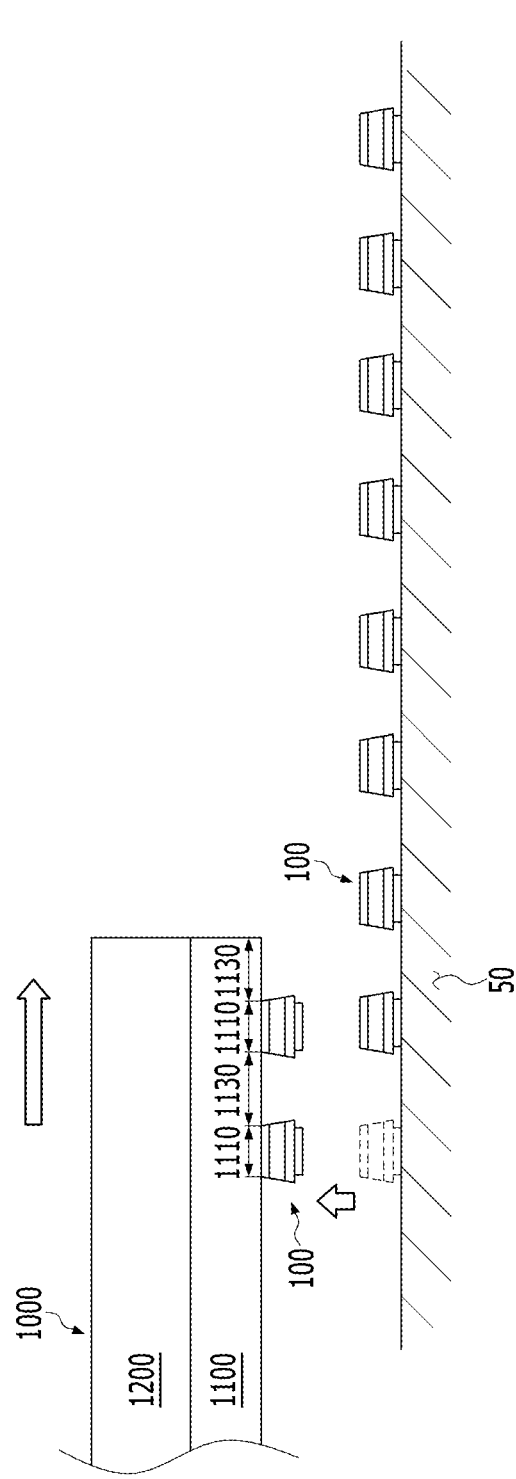

As the transfer head 1000 continues to move in the right direction, micro LEDs 100 on the right side of the gripped micro LEDs 100 are gripped onto the next rightmost grip regions 1110 of the transfer head 1000 as illustrated in FIG. 5C.

Figure 5D:
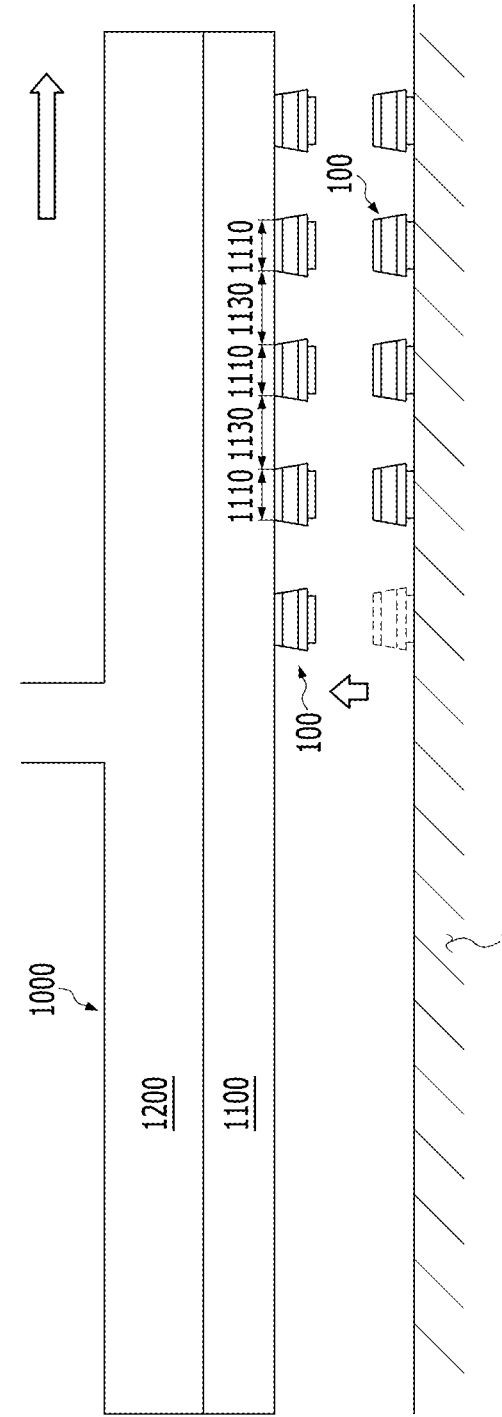
Figure 5E:
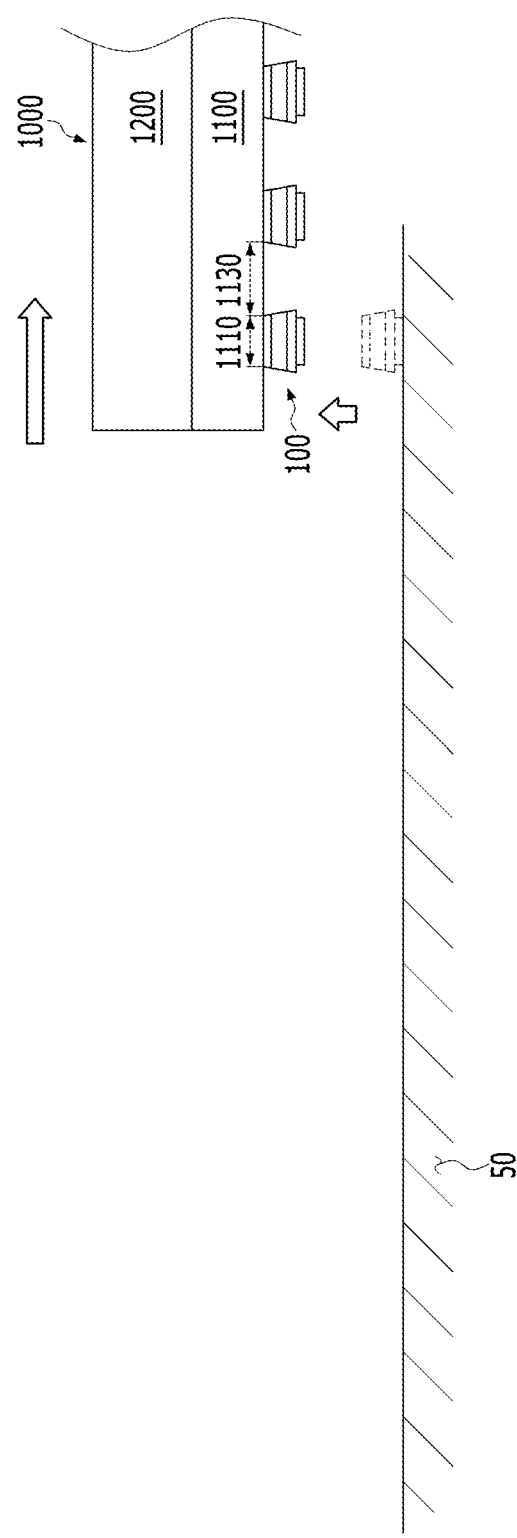

Thereafter, as the transfer head 1000 continues to move in the right direction, the micro LEDs 100 placed in the collecting box 50 are sequentially gripped onto the grip regions 1110 as illustrated in FIG. 5D and FIG. 5E.

The micro LEDs 100 gripped onto the grip regions 1110 of the transfer head 1000 as described above are lowered after the transfer head 1000 moves to the display substrate 301. The descended transfer head 1000 unloads the gripped micro LEDs 100 on the display substrate 301 by releasing the suction force. The unloaded normal micro LEDs 100 are mounted on the display substrate 301.

For the sake of ease of explanation, FIG. 5A to FIG. 5E illustrate that the transfer head 1000 horizontally moves in one direction, that is, in the right direction. However, the transfer head 1000 may freely move horizontally on a plane parallel to the collecting box 50 until all of the normal micro LEDs 100 are gripped onto the grip regions 1110 of the transfer head 1000.

In other words, when it is assumed that the left-right direction of FIG. 5A is an X-axis, and an axis perpendicular to the X-axis and parallel to the collecting box 50 is a Y-axis, the transfer head 1000 moves freely in the X- and Y-axes on an XY plane and grips the normal micro LEDs 100 onto the grip regions 1110 of the transfer head 1000.

In addition, the transfer head 1000 reciprocates on the XY plane until all of the normal micro LEDs 100 are gripped onto the multiple grip regions 1110, whereby all of the normal micro LEDs 100 are gripped onto the multiple grip regions 1110.

In addition, the transfer head 1000 rotates on the XY plane until all of the normal micro LEDs 100 are gripped onto the multiple grip regions 1110, whereby all of the normal micro LEDs 100 are gripped onto the multiple grip regions 1110.

Types of the transfer head 1000 gripping the normal micro LEDs 100 according to the above-described manner include all the transfer head 1000 that grips the micro LEDs 100 by a vacuum, a magnetic force, an electrostatic force, or the like.

The transfer head 1000 may be provided with a grip completion determination unit checking whether the micro LEDs 100 are gripped onto all of the grip regions 1110 of the transfer head 1000. The grip completion determination unit may be provided as a sensor type to determine whether the micro LEDs 100 are gripped onto the grip regions 1110. In a case of the transfer head 1000 gripping the micro LEDs 100 onto the grip regions 1110 using a vacuum or the like, that is, a suction force, the grip completion determination unit measures gas pressure varying depending on vacuum pressure or suction force and checks whether all of the micro LEDs 100 are gripped onto the grip regions 1110 of the transfer head 1000.

As described above, the transfer head 1000 according to the first embodiment of the present invention grips and transfers the normal micro LEDs 100 accommodated in the collecting box 50 while moving in the horizontal direction, and thus the following effects are obtained.

Unlike the related art, only the normal micro LEDs 100 are gripped from the collecting box 50 where defective micro LEDs 100 are already removed according to the present invention. Thus, it is possible to omit a complicated process of selectively removing defective micro LEDs 100 among the micro LEDs 100 mounted on the display substrate 301 and then replacing the defective micro LEDs 100 with the normal micro LEDs 100. Accordingly, the process of transferring the micro LEDs 100 can be performed efficiently.

Even when the normal micro LEDs 100 are not regularly arranged in the collecting box 50, the micro LEDs 100 are gripped only onto the grip regions 1110 while the transfer head 1000 moves horizontally, whereby the micro LEDs 100 gripped on the transfer head 1000 have a regular arrangement. Therefore, it is possible to mount the micro LEDs 100 on the display substrate 301 in the regular arrangement. In addition, since the normal micro LEDs 100 accommodated in the collecting box 50 need not be regularly arranged in the collecting box 50, a process of sorting the normal micro LEDs 100 and collecting the normal micro LEDs 100 in the collecting box 50 can be performed quickly.

In the case of the grip regions 1110 of the transfer head 1000 being configured in a matrix form which is illustrated in FIG. 4A, the normal micro LEDs 100 gripped onto all of the grip regions 1110 of the transfer head 1000 may have the matrix form. In this case, the micro LEDs 100 gripped in the matrix form are gripped onto the grip regions 1110 with a regular interval therebetween.

As described above, since the grip regions 1110 and the non-grip region 1130 are configured such that the grip regions 1110 of the transfer head 1000 are configured in the matrix form, the following effects are obtained.

A conventional system is such that a transfer head grips micro LEDs from a circular shaped growth substrate. Therefore, when transferring the micro LEDs from the circular growth substrate to a rectangular display substrate, it is impossible to grip and transfer the micro LEDs from a circular periphery of the growth substrate.

However, as described above, in the case of the present invention, since the grip regions 1110 are in the matrix form and the micro LEDs 100 are collected from the collecting box 50, the problem caused by the circular growth substrate described above can be solved.

Gripping the micro LEDs 100 from the collecting box 50 using the transfer head 1000 may also be performed in other manners.

For example, unlike the above, while the transfer head 1000 does not move horizontally, a grip force is generated on the grip regions 1110, and the collecting box 50 moves horizontally until all of the normal micro LEDs 100 placed in the collecting box 50 are gripped onto the grip regions 1110 so that gripping of the micro LEDs 100 onto the transfer head 1000 is achieved. In this case, the collecting box 50 may reciprocate in the horizontal direction or move by rotation. Therefore, as the transfer head 1000 moves horizontally or the collecting box 50 moves horizontally, the transfer head 1000 grips the micro LEDs 100 onto the grip regions 1110 while either the transfer head 1000 or the collecting box 50 moves relative to the micro LEDs 100 in the horizontal direction.

Hereinafter, a method of transferring the normal micro LEDs 100 floating in a fluid 60 by using the micro LED transfer head 1000 according to the first embodiment of the present invention will be described with reference to FIG. 6A to FIG. 6E.

The fluid 60 may be a fluid stored in a fluid storage unit, and an area of the fluid storage unit is preferably larger than an area of the transfer head 1000.

Each of the micro LEDs 100 floating in the fluid 60 may have characteristics that a lower portion thereof is heavier than an upper portion thereof. Thus, it is possible to effectively prevent micro LEDs 100 from flipping over in the fluid 60.

The micro LEDs 100 may be surface-treated on each one side thereof so that each one side thereof always faces upward or downward. For example, hydrophobic treatment may be applied to an upper portion of each of the micro LEDs 100 so that when the micro LEDs 100 are turned upside down, the micro LEDs 100 revert to the original state due to the hydrophobic-treated upper portions thereof, thereby effectively preventing the micro LEDs 100 from flipping over in the fluid 60.

FIG. 6A to FIG. 6E are views illustrating a method of transferring the micro LEDs using the transfer head according to the first embodiment of the present invention;

The multiple micro LEDs 100 on the growth substrate 101 are prepared to be separable from the growth substrate 101.

Product inspection of the multiple micro LEDs 100 separated from the growth substrate 101 is carried out, and normal micro LEDs 100 are transferred to the fluid 60 and defective micro LEDs 100 are not.

The normal micro LEDs 100 transferred to the fluid 60 float in the fluid 60, and a part of the lower portions of the micro LEDs 100 may be slightly immersed in the fluid 60.

As illustrated in FIG. 6A, the normal micro LEDs 100 transferred to the fluid 60 float in the fluid 60. In this case, unlike the growth substrate 101, the micro LEDs 100 may have irregular intervals therebetween. This is because even when the micro LEDs 100 floating in the fluid 60 have irregular intervals, the micro LEDs 100 can be transferred again with regular intervals by grip of the transfer head 1000 which will be described later.

Referring to FIG. 6B, the transfer head 1000 moves in the horizontal direction (right direction in FIG. 6B) over the multiple micro LEDs 100 floating in the fluid 60 while the suction force of the grip regions 1110 is generated.

In other words, the transfer head 1000 moves in the horizontal direction while a lower surface of the transfer head 1000, that is, the porous member 1100 having the grip regions 1110 and the non-grip region 1130 is spaced apart from upper surfaces of the multiple micro LEDs 100 floating in the fluid 60 by a predetermined distance. In this case, it is preferable that the predetermined distance is set to a distance that still attracts the micro LEDs 100 with the grip force of the grip regions 1110.

As the suction force is generated in the grip regions 1110 of the transfer head 1000, the leftmost micro LEDs 100 floating in the fluid 60 are gripped onto the rightmost grip regions 1110 of the grip regions 1110 of the transfer head 1000.

As the transfer head 1000 continues to move in the right direction, floating micro LEDs 100 on the right side of the gripped micro LEDs 100 are gripped onto the next rightmost grip regions 1110 of the transfer head 1000 as illustrated in FIG. 6C.

Figure 6E:
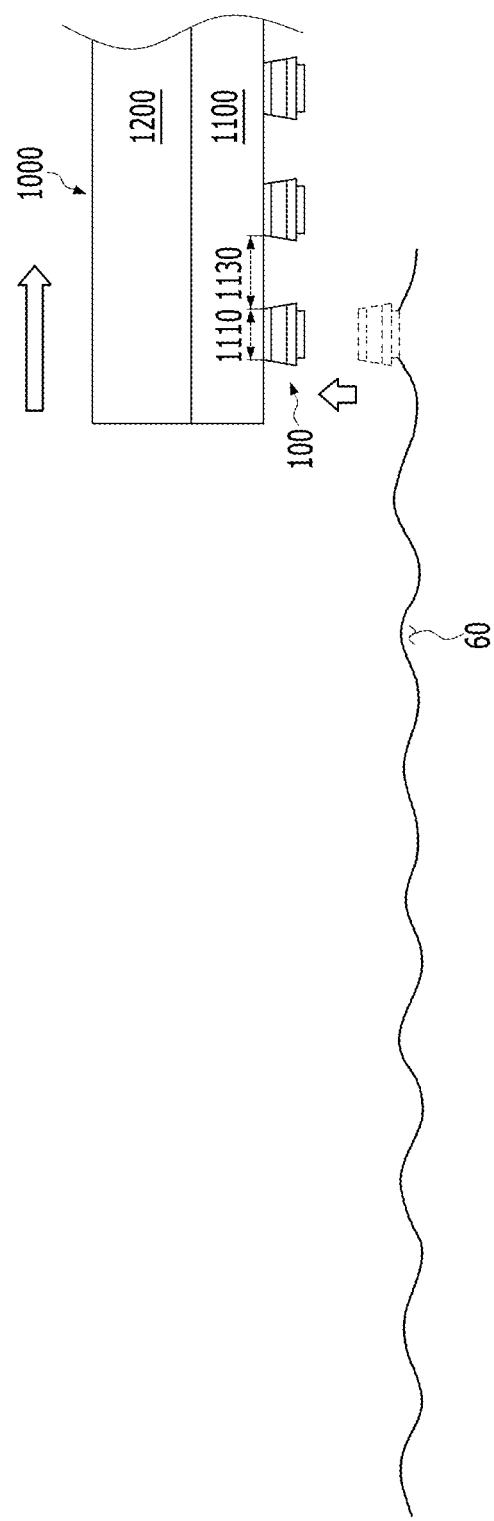

Thereafter, as the transfer head 1000 continues to move in the right direction, the micro LEDs 100 floating in the fluid 60 are sequentially gripped onto the grip regions 1110 as illustrated in FIG. 6D and FIG. 6E.

The micro LEDs 100 gripped onto the grip regions 1110 of the transfer head 1000 as described above are unloaded to the display substrate 301 after the transfer head 1000 moves to the display substrate 301 such that the normal micro LEDs 100 are easily mounted to the display substrate 301.

For the sake of ease of explanation, FIG. 6A to FIG. 6E illustrate that the transfer head 1000 horizontally moves in one direction, that is, in the right direction. However, the transfer head 1000 may freely move horizontally on a plane parallel to a surface of the fluid 60 until all of the normal micro LEDs 100 are gripped onto the grip regions 1110 of the transfer head 1000.

In other words, when it is assumed that the left-right direction of FIG. 6A is an X-axis, and an axis perpendicular to the X-axis and parallel to the surface of the fluid 60 is a Y-axis, the transfer head 1000 moves freely in the X- and Y-axes on an XY plane, thereby gripping the normal micro LEDs 100 onto the grip regions 1110 of the transfer head 1000.

In addition, the transfer head 1000 reciprocates on the XY plane until all of the normal micro LEDs 100 are gripped onto the multiple grip regions 1110, whereby all of the normal micro LEDs 100 are gripped onto the multiple grip regions 1110.

In addition, the transfer head 1000 rotates on the XY plane until all of the normal micro LEDs 100 are gripped onto the multiple grip regions 1110, whereby all of the normal micro LEDs 100 are gripped onto the multiple grip regions 1110.

Types of the transfer head 1000 gripping the normal micro LEDs 100 according to the above-described manner include all the transfer head 1000 that grips the micro LEDs 100 by a vacuum, a magnetic force, an electrostatic force, or the like.

The transfer head 1000 may be provided with a grip completion determination unit checking whether the micro LEDs 100 are gripped onto all of the grip regions 1110 of the transfer head 1000. The grip completion determination unit may be provided as a sensor type to determine whether the micro LEDs 100 are gripped onto the grip regions 1110. In a case of the transfer head 1000 gripping the micro LEDs 100 onto the grip regions 1110 using a vacuum or the like, that is, a suction force, the grip completion determination unit measures gas pressure varying depending on vacuum pressure or suction force and checks whether all of the micro LEDs 100 are gripped onto the grip regions 1110 of the transfer head 1000.

As described above, the transfer head 1000 according to the first embodiment of the present invention grips and transfers the normal micro LEDs 100 floating in the fluid 60 while moving in the horizontal direction, and thus the following effects are obtained.

Unlike the related art, only the normal micro LEDs 100 are gripped from the fluid 60 where defective micro LEDs 100 are already removed according to the present invention. Thus, it is possible to omit a complicated process of selectively removing defective micro LEDs 100 among the micro LEDs 100 mounted on the display substrate 301 and then replacing the defective micro LEDs 100 with the normal micro LEDs 100. Accordingly, the process of transferring the micro LEDs 100 can be performed efficiently.

Even when the normal micro LEDs 100 float in the fluid 60 in a manner not being regularly arranged, the micro LEDs 100 are gripped only onto the grip regions 1110 while the transfer head 1000 moves horizontally, whereby the micro LEDs 100 gripped on the transfer head 1000 have a regular arrangement. Therefore, it is possible to mount the micro LEDs 100 on the display substrate 301 in the regular arrangement.

In addition, since the normal micro LEDs 100 floating in the fluid 60 need not be regularly arranged in the fluid 60, a process of sorting the normal micro LEDs 100 and transferring the normal micro LEDs 100 to the fluid 60 can be performed quickly.

Furthermore, in the case of the collecting box 50 described above, when the micro LEDs 100 are collected in an irregular arrangement, other micro LED 100 may be placed on top of the micro LED 100. However, in the case of the fluid 60, due to the fluidity of the fluid 60, it is difficult for other micro LED 100 to be placed on top of the micro LED 100 floating in the fluid 60. Accordingly, the normal micro LEDs 100 floating in the fluid 60 form into only one layer so that the transfer head 1000 can easily grip the micro LEDs 100.

In the case of the grip regions 1110 of the transfer head 1000 being configured in a matrix form which is illustrated in FIG. 4A, the normal micro LEDs 100 gripped onto all of the grip regions 1110 of the transfer head 1000 may have the matrix form. In this case, the micro LEDs 100 gripped in the matrix form are gripped onto the grip regions 1110 with a regular interval therebetween.

As described above, since the grip regions 1110 and the non-grip region 1130 are configured such that the grip regions 1110 of the transfer head 1000 are configured in the matrix form, the following effects are obtained.

A conventional system is configured such that a transfer head grips micro LEDs from a circular shaped growth substrate. Therefore, when transferring the micro LEDs from the circular growth substrate to a rectangular display substrate, it is impossible to grip and transfer the micro LEDs from a circular periphery of the growth substrate.

However, as described above, in the case of the present invention, since the grip regions 1110 are in the matrix form and the micro LEDs 100 are collected from the fluid 60, the problem caused by the circular growth substrate described above can be solved.

Gripping the micro LEDs 100 from the fluid 60 using the transfer head 1000 may also be performed in other manners.

For example, unlike the above, while the transfer head 1000 does not move, a grip force is generated on the grip regions 1110, and a fluid storage unit where the fluid 60 is stored moves horizontally until all of the normal micro LEDs 100 floating in the fluid 60 are gripped onto the grip regions 1110 so that gripping of the micro LEDs 100 to the transfer head 1000 is achieved. In this case, the movement of the fluid storage unit may be achieved by reciprocation or rotation.

Alternatively, a flow of the fluid 60 stored in the fluid storage unit is generated until all of the normal micro LEDs 100 floating in the fluid 60 are gripped onto the grip regions 1110 while the micro LEDs 100 move relative to the transfer head 1000 that does not move. Thus, the gripping of the micro LEDs 100 onto the transfer head 1000 is achieved. In this case, the movement of the micro LEDs 100 may be achieved by reciprocation or rotation due to the flow of the fluid 60.

Alternatively, the gripping of the micro LEDs 100 by the transfer head 1000 may be achieved by horizontally moving the fluid storage unit where the fluid 60 is stored while the transfer head 1000 does not move. In other words, the LEDs 100 horizontally move relative to the transfer head 1000.

Described in brief, in the present invention, the gripping of the micro LEDs 100 onto the grip regions 1110 of the transfer head 1000 may be achieved by horizontally moving either the transfer head 1000 or the micro LEDs 100 floating in the fluid 60 relative to the other.

As described above, in addition to the reciprocating motion of the transfer head 1000 in the horizontal direction on the XY plane until the transfer head 1000 grips all of the micro LEDs 100, the transfer head 1000 may grip the micro LEDs 100 through an up-and-down reciprocating motion.

The transfer head 1000 repeatedly descends toward the micro LEDs 100 and is raised while the suction force is generated in the grip regions 1110. Thus, the transfer head 1000 can perform the up-and-down reciprocating motion until all of the micro LEDs 100 are gripped onto the grip regions 1110.

That is, the transfer head 1000 moves in the Z-axis direction with the suction force generated in the grip regions 1110, thereby performing the up-and-down reciprocating motion. As a result, the transfer head 1000 moves relative to the micro LEDs 100 in the vertical direction so that the micro LEDs 100 are gripped onto the grip regions 1110.

For example, as illustrated in FIG. 5A to FIG. 5E, in the case that the micro LEDs 100 are collected in the collecting box 50, the transfer head 1000 easily grips the micro LEDs 100 with the suction force generated in the grip regions 1110 by moving or descending toward the normal micro LEDs 100 placed in the collecting box 50, that is, moving downward. Thereafter, the transfer head 1000 moves upward, that is, the transfer head 1000 is raised. When the micro LEDs 100 are not all gripped onto the grip regions 1110, the transfer head 1000 descends again. Accordingly, the up-and-down reciprocating motion can be performed repeatedly until all of the micro LEDs 100 are gripped onto the grip regions 1110. Alternatively, the gripping of the micro LEDs 100 by the transfer head 1000 may be achieved by vertically moving the collecting box 50 without moving the transfer head 1000. In other words, the gripping of the micro LEDs 100 is achieved by vertically moving the collecting box 50 relative to the transfer head 1000, that is, repeatedly raising and descending the collecting box 50, rather than the up-and-down reciprocating movement of the transfer head 1000, that is, repeatedly raising and descending the transfer head 1000.

For example, as illustrated in FIG. 6A to FIG. 6E, in the case that the micro LEDs 100 float in the fluid 60, the transfer head 1000 easily grips the micro LEDs 100 with the suction force generated in the grip regions 1110 by moving or descending toward the normal micro LEDs 100 floating in the fluid 60, that is, moving downward. Thereafter, the transfer head 1000 moves upward, that is, the transfer head 1000 is raised. When the micro LEDs 100 are not all gripped onto the grip regions 1110, the transfer head 1000 descends again. Accordingly, the up-and-down reciprocating motion can be performed repeatedly until all of the micro LEDs 100 are gripped onto the grip regions 1110. Alternatively, the gripping of the micro LEDs 100 by the transfer head 1000 may be achieved by vertically moving the fluid storage unit where the fluid 60 is stored without moving the transfer head 1000. In other words, the gripping of the micro LEDs 100 may be achieved by vertically moving the fluid storage unit relative to the transfer head 1000, that is, repeatedly raising and descending the fluid storage unit, rather than the up-and-down reciprocating movement of the transfer head 1000, that is, repeatedly raising and descending the transfer head 1000.

Of course, the gripping of the micro LEDs 100 by the transfer head 1000 may be achieved by moving both the LEDs 100 and the head 1000 relative to each other.

Here, the gripping of the micro LEDs 100 through the up-and-down movement of the transfer head 1000 relative to the micro LEDs 100, that is, the vertical movement of the transfer head 1000 is more effective when the micro LEDs 100 float in the fluid 60. This is because the fluid 60 prevents impact to the transfer head 1000 and the micro LEDs 100 when the transfer head 1000 descends.

The horizontal movement and the vertical movement of the transfer head 1000 relative to the micro LEDs 100 may be simultaneously performed.

In this case, while the micro LED transfer head 1000 freely moves relative to the micro LEDs 100 reciprocally on an XY plane, an XZ plane, and a Y-Z plane within a three-dimensional space composed of X-axis, Y-axis, and Z-axis in a state in which the suction force is generated in the grip regions 1110, the micro LED transfer head 1000 grips the micro LEDs 100.

With respect to the operation in which the transfer head 1000 grips the micro LEDs 100, the determination as to whether all of the micro LEDs 100 are gripped onto the grip regions 1110 of the transfer head 1000 may be achieved by the control unit and the sensor. In other words, when the sensor measures the degree of vacuum in the suction chamber 1200 and the degree of vacuum does not reach a predetermined level, the control unit determines that some of the micro LEDs 100 are not gripped onto the grip regions 1110 of the transfer head 1000. Therefore, until the degree of vacuum measured by the sensor reaches the predetermined level and the transfer head 1000 grips all of the micro LEDs 100 through either the horizontal movement of the transfer head 1000 relative to the micro LEDs 100 or the vertical movement of the transfer head 1000 relative to the micro LEDs 100, the control unit controls the transfer head 1000 so that all of the micro LEDs 100 are gripped onto the grip regions 1110 of the transfer head 1000. Here, the control unit may control not only the movement of the transfer head 1000, but also the horizontal or vertical movement of the collecting box 50 or the fluid storage unit where the fluid 60 is stored.

In the case of the transfer head 1000 gripping the micro LEDs 100 floating in the fluid 60, in order to remove the fluid 60, a filter may be provided in the suction chamber 1200 of the transfer head 1000, in the suction port communicating with the suction chamber 1200, or in a suction pipe (reference number 1400 of FIG. 20 to FIG. 25) communicating with the suction chamber 1200.

The filter removes the fluid so that the filter serves to prevent reduction in degree of vacuum which is caused by the fluid that may be sucked through the grip regions 1110 and flow into the suction chamber 1200, into the suction port, or into suction pipe.

As described above, in the case of the transfer head 1000 gripping the micro LEDs 100 floating in the fluid 60, after the transfer head 1000 grips all of the micro LEDs 100, a process of cleaning and drying the micro LEDs 100 gripped to the transfer head 1000 may be performed.

The cleaning of the micro LEDs 100 gripped to the transfer head 1000 is performed by a cleaning unit. In this case, the cleaning unit may include at least one of an air spraying unit spraying air onto the lower surfaces of the micro LEDs 100 gripped to the transfer head 1000 to remove foreign substances and a water spraying unit spraying water onto the lower surfaces of the micro LEDs 100 gripped to the transfer head 1000 to remove foreign substances.

The drying of the micro LEDs 100 gripped to the transfer head 1000 is performed by a drying unit. The drying unit may spray air onto the micro LEDs 100 gripped to the transfer head 1000 to dry the micro LEDs 100 or dry the micro LEDs 100 gripped to the transfer head 1000 using a heater.

As described above, the cleaning unit and the drying unit easily clean and dry the micro LEDs 100 gripped from the fluid 60, thereby reducing the defective rate generated when transferring the micro LEDs 100.

The method of transferring the normal micro LEDs 100 from the collecting box 50 or from the fluid 60 by using the micro LED transfer head 1000 according to the first embodiment of the present invention may be applied to micro LED transfer heads according to various embodiments and modifications which will be described below.

Second Embodiment

Hereinafter, a second embodiment of the present invention will be described. It should be noted that the embodiment described below will be described with particular emphasis on characteristic components as compared with the first embodiment, and descriptions of the same or similar components as those of the first embodiment will be omitted.

Figure 9:
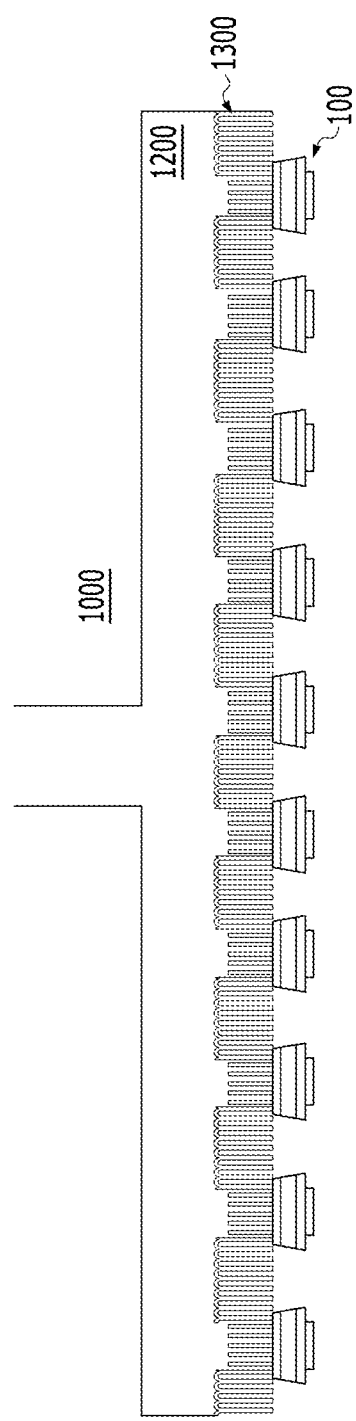
FIG. 9 is a view illustrating a state in which the transfer head according to the second embodiment of the present invention grips micro LEDs.

FIG. 7 is a view illustrating a transfer head according to a second embodiment of the present invention; FIG. 8 is an enlarged view of portion A of FIG. 7; and FIG. 9 is a view illustrating a state in which the transfer head according to the second embodiment of the present invention grips the micro LEDs.

A micro LED transfer head 1000 according to the second embodiment of the present invention is characterized in that the porous member 1100 according to the first embodiment is embodied by an anodic oxide film 1300 having pores formed by anodizing a metal.

The anodic oxide film 1300 is a film formed by anodizing a metal that is a base material, and pores 1303 are pores formed in a process of forming the anodic oxide film 1300 by anodizing the metal. For example, in the case where a metal base material is aluminum (Al) or an aluminum alloy, the anodization of the base material forms the anodic oxide film 1300 consisting of anodized aluminum ($Al_2O_3$) on a surface of the base material. The anodic oxide film 1300 formed as described above includes a barrier layer 1301 in which the pores 1303 are not formed and a porous layer in which the pores 1303 are formed inside. The barrier layer 1301 is positioned on an upper portion of the base material, and the porous layer is positioned below the barrier layer 1301. After removing the base material on which the anodic oxide film 1300 having the barrier layer 1301 and the porous layer is formed, only an anodic oxide film 1300 consisting of anodized aluminum ($Al_2O_3$) remains.

The anodic oxide film 1300 has the pores 1303 configured vertically and having a regular arrangement with a uniform diameter. Accordingly, after removing the barrier layer 1301, the pores 1303 have a structure extending from top to bottom vertically, thereby facilitating the generation of the vacuum pressure in the vertical direction.

The inside of the anodic oxide film 1300 forms air flow paths vertically by the vertical pores 1303. An internal width of the pores 1303 has a size of several nanometers to several hundred nanometers. For example, when a size of the micro LEDs to be vacuum-sucked is 30 μm×30 μm and an internal width of the pores 1303 is several nanometers, it is possible to vacuum-suck the micro LEDs 100 by approximately tens of millions of pores 1303. When a size of the micro LEDs to be vacuum-sucked is 30 μm×30 μm and an internal width of the pores 1303 is several hundred nanometers, it is possible to vacuum-suck the micro LEDs 100 by approximately tens of thousands of pores 1303. The micro LEDs 100 are lightweight because each of the micro LEDs 100 are fundamentally configured with the first semiconductor layer 102, the second semiconductor layer 104, the active layer 103 provided between the first semiconductor layer 102 and the second semiconductor layer 104, the first contact electrode 106, and the second contact electrode 107. Accordingly, it is possible to vacuum-suck the micro LEDs 100 by tens of thousands to tens of millions of pores 1303 formed in the anodic oxide film 1300.

The suction chamber 1200 is provided on the anodic oxide film 1300. The suction chamber 1200 is connected to a suction port providing a vacuum pressure. The suction chamber 1200 functions to apply a vacuum pressure to the multiple vertical pores of the anodic oxide film 1300 or release the vacuum pressure according to the operation of the suction port.

In order to vacuum-suck the micro LEDs 100, a vacuum pressure applied to the suction chamber 1200 is transferred to the multiple pores 1303 of the anodic oxide film 1300 to generate a vacuum suction force for the micro LEDs 100. In order to detach the micro LEDs 100, the vacuum pressure applied to the suction chamber 1200 is released to remove the vacuum pressure from the multiple pores 1303 of the anodic oxide film 1300 whereby the vacuum suction force to the micro LEDs 100 is removed.

The anodic oxide film 1300 includes suction regions 1310 vacuum-sucking the micro LEDs 100 and a non-suction region 1330 not sucking the micro LEDs 100. The suction regions 1310 are regions where vacuum pressure of the suction chamber 1200 is transferred and the micro LEDs 100 are vacuum-sucked. The non-suction region 1330 is a region where the vacuum pressure of the suction chamber 1200 is not transferred and thus the micro LEDs 100 are not sucked.

Preferably, the suction regions 1310 are regions where the pores 1303 extend from top to bottom vertically, and the non-suction region 1330 is a region where at least any one of upper and lower portions of the pores 1303 are closed.

The non-suction region 1330 may be embodied by forming a shielding portion on at least a part of a surface of the anodic oxide film 1300. The shielding portion is formed to close openings of the pores 1303 exposed to at least a part of the surface of the anodic oxide film 1300. The shielding portion may be formed on at least a part of upper and lower surfaces of the anodic oxide film 1300. The shielding portion is not limited in material, shape, and thickness as long as the shielding portion functions to close the openings of the pores 1303 exposed to the surface of the porous member 1100. Preferably, the shielding portion may be further provided and made of a photoresist (PR, including dry film PR) or a metal, and the barrier layer 1301 may be the shielding portion.

The non-suction region 1330 may be formed such that the barrier layer 1301 formed in the fabrication of the anodic oxide film 1300 closes any one of the upper and lower portions of the vertical pores 1303. The suction regions 1310 may be formed such that the barrier layer 1301 is removed by etching or the like so that the upper and lower portions of the vertical pores 1303 extend from top to bottom.

In addition, the anodic oxide film 1300 in the suction regions 1310 has a thickness smaller than the anodic oxide film 1300 in the non-suction region 1330 because the pores 1303 extending from top to bottom are formed by removing a part of the barrier layer 1301.

FIG. 7 illustrates that the barrier layer 1301 is provided at an upper portion of the anodic oxide film 1300 and the porous layer 1305 having the pores 1303 is provided at a lower portion thereof. However, the anodic oxide film 1300 illustrated in FIG. 7 may be inverted to form the non-suction region 1330 such that the barrier layer 1301 is provided at the lower portion of the anodic oxide film 1300.

It has been described that the non-suction region 1330 is configured such that any one of the upper and lower portions of the pores 1303 is closed by the barrier layer 1301. However, the opposite surface, which is not closed by the barrier layer 1301, may be provided with an additional coating layer whereby both the upper and lower portions are closed.

With respect to forming of the non-suction region 1330, the configuration in which both the upper and lower surfaces of the anodic oxide film 1300 are closed is advantageous in that it is possible to reduce the possibility that foreign substances remain in the pores 1303 of the non-suction region 1330 compared with the configuration in which at least one of the upper and lower surfaces of the anodic oxide film 1300 is closed.

Figure 10:
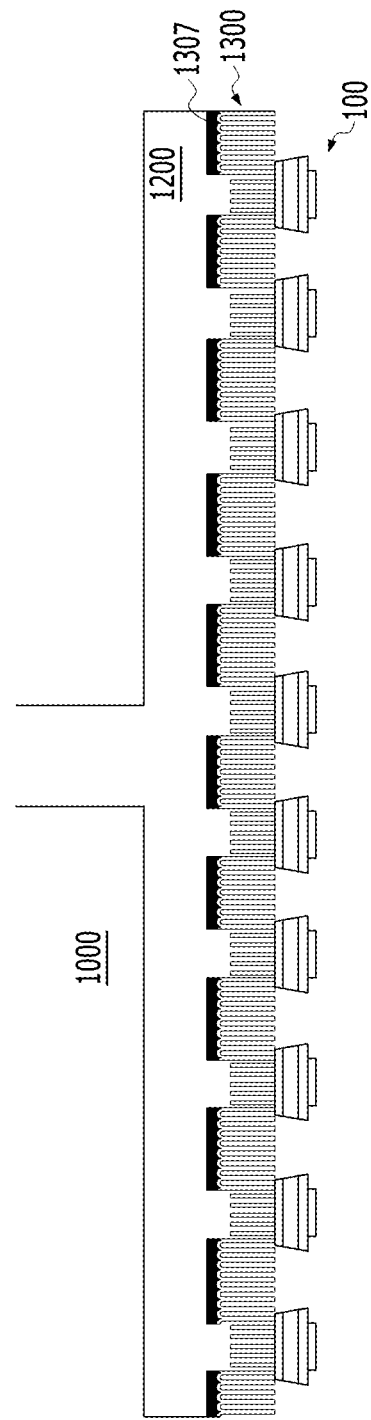
FIG. 10 is a view illustrating a modification of the second embodiment of the present invention.

FIG. 10 is view illustrating a modification of the micro LED transfer head illustrated in FIG. 9. The transfer head illustrated in FIG. 10 is configured such that a supporting portion 1307 is further provided on a non-suction region 1330 to reinforce the strength of an anodic oxide film 1300.

For example, the supporting portion 1307 may be a metal base material. The metal base material used for the anodization is not removed and left on the barrier layer 1301 such that the metal base material can serve as the supporting portion 1307.

Referring to FIG. 10, the non-suction region 1330 is configured with the supporting portion 1307 made of the metal base material, with the barrier layer 1301, and with the porous layer 1305 having the pores 1303. As the supporting portion 1307 made of the metal base material and the barrier layer 1301 are removed, the suction regions 1310 are formed in a manner that the upper and lower portions of the pores 1303 extend from top to bottom. The supporting portion 1307 made of the metal base material is provided on the non-suction region 1330 to secure the strength of the anodic oxide film 1300. Here, the base material serves as the supporting portion 1307.

As the strength of the anodic oxide film 1300 which has a relatively weak strength is increased due to the above-described configuration of the supporting portion 1307, it is possible to configure the transfer head 1000 having the anodic oxide film 1300 to have a large area.

FIG. 11A is view illustrating a modification of the micro LED transfer head illustrated in FIG. 9. The transfer head illustrated in FIG. 11A is configured such that through-holes 1309 are further provided in the suction region 1310 of the anodic oxide film 1300 in addition to the pores 1303 which are formed spontaneously in the anodic oxide film 1300.

The through-holes 1309 are configured to extend from top to bottom of the anodic oxide film 1300. A diameter of the through-holes 1309 is configured to be greater than those of the pores 1303. Compared with the configuration in which the micro LEDs 100 are vacuum-sucked only by the pores 1303, it is possible for the modification to increase the vacuum suction area for the micro LEDs 100 due to the configuration in which the through-holes 1309 having a diameter greater than that of the pores 1303 are provided.

The through-holes 1309 may be formed by etching the anodic oxide film 1300 vertically after forming the anodic oxide film 1300 and the pores 1303.

By using the etching method for forming the through-holes 1309, it is possible to form the through-holes 1309 stably compared with simply forming the through-holes 1309 by reaming the pores 1303.

In other words, when forming the through-holes 1309 by reaming the pores 1303, side surfaces of the pores 1303 are collapsed, leading to damage to the through-holes 1309, for example, a deformation of the through-holes 1309.

However, by forming the through-holes 1309 by etching, the through-holes 1309 are easily formed without damaging the side surfaces of the pores 1303, thereby preventing damage to the through-holes 1309.

It is preferable that each of the through-holes 1309 is configured in each center of the suction regions 1310 in order to prevent vacuum leakage in the suction regions 1310.

With respect to the entire transfer head 1000, the through-holes 1309 may have different sizes and numbers depending on positions of the suction regions 1310.

In the case of the suction port being disposed at the center of the transfer head 1000, the vacuum pressure is gradually decreased from the center to the edge of the transfer head 1000, which may cause unevenness of the vacuum pressure among the suction regions 1310. In this case, a suction area provided by the through-holes 1309 within the suction regions 1310 disposed at the edge side of the transfer head 1000 may be larger than a suction area provided by the through-holes 1309 within the suction regions 1310 disposed at the center side of the transfer head 1000.

By varying the size of the suction area of the through-holes 1309 depending on the positions of the suction regions 1310, it is possible to eliminate unevenness of the vacuum pressure generated in the suction regions 1310 and to provide a uniform vacuum suction force.

FIG. 11B is view illustrating a modification of the micro LED transfer head illustrated in FIG. 9. The micro LED transfer head 1000 illustrated in FIG. 11B is configured such that suction recesses 1309 are further provided at lower portions of the suction regions 1310 of the anodic oxide film 1300.

Each of the suction recesses 1309 has a horizontal area larger than the pores 1303 or the through-holes 1309 but smaller than the upper surface of the micro LED 100.

Accordingly, it is possible to further increase the vacuum suction for gripping the micro LEDs 100 and to provide a uniform vacuum suction area for gripping the micro LEDs 100 because of the suction recesses 1309.

The suction recesses 1309 may be formed by etching a part of the anodic oxide film 1300 to a predetermined depth after forming the anodic oxide film 1300 and the pores 1303.

Figure 11C:
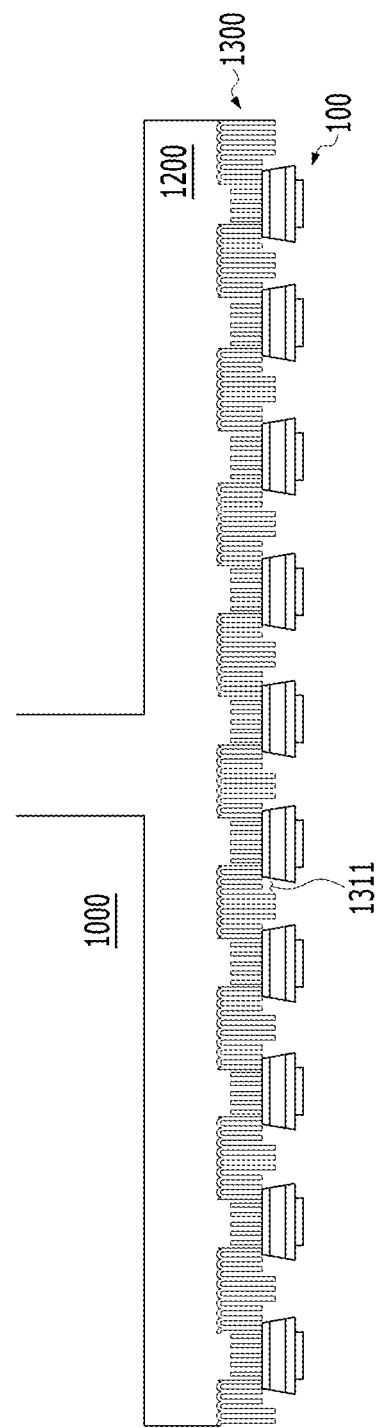

FIG. 11C is view illustrating a modification of the micro LED transfer head illustrated in FIG. 9. As illustrated in FIG. 11C, the transfer head is configured such that receiving recesses 1311 are further provided at lower portions of the suction regions 1310 of the anodic oxide film 1300.

Each of the receiving recesses 1311 has a horizontal area larger than each upper surface of the micro LEDs 100. As a result, the micro LEDs 100 are inserted and seated in the receiving recesses 1311 so that the positions of the micro LEDs 100 are restricted while the transfer head 1000 moves.

The receiving recesses 1311 may be formed by etching a part of the anodic oxide film 1300 to a predetermined depth after forming the anodic oxide film 1300 and the pores 1303.

Figure 12:
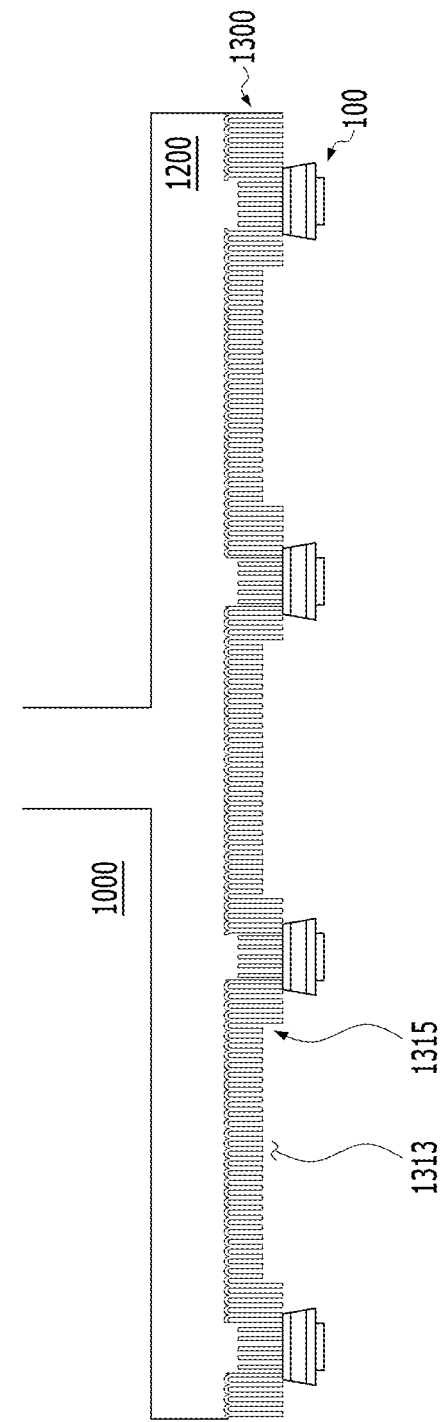
FIG. 12 is a view illustrating a modification of the second embodiment of the present invention.

FIG. 12 is view illustrating a modification of the micro LED transfer head illustrated in FIG. 9. As illustrated in FIG. 12, the transfer head is configured such that escape recesses 1313 are further provided at a lower portion of the non-suction region 1330 of the anodic oxide film 1300.

When the transfer head 1000 descends to vacuum-suck the micro LEDs 100 positioned at a predetermined position, column, or row, the escape recesses 1313 function to prevent interference of the micro LEDs 100 which are not to be gripped.

Due to the configuration of the escape recesses 1313, protruding portions 1315 are provided at lower portions of the suction regions 1310.

The protruding portions 1315 protrude further downward in the vertical direction compared with the escape recesses 1313, and the micro LEDs 100 are gripped at lower portions of the protruding portions 1315.

Each of the protruding portions 1315 is configured to have a horizontal area equal to or larger than the suction regions 1310.

Each horizontal area of the protruding portions 1315 may be configured to be larger than each upper surface of the micro LEDs 100, and each of the suction regions 1310 is configured to have a width smaller than each upper surface of the micro LEDs 100 in order to prevent the vacuum leakage.

Each of the escape recesses 1313 is configured to have a horizontal area larger than at least one micro LED 100.

FIG. 12 illustrates that each of the escape recesses 1313 has a horizontal width equal to a value obtained by summing twice the horizontal width of the micro LEDs 100 and twice the horizontal pitch distance between the micro LEDs 100.

Thus, when descending the transfer head 1000 to vacuum-suck the micro LEDs 100 to be gripped, it is possible to prevent interference of the micro LEDs 100 not to be gripped.

As illustrated in FIG. 12, the micro LEDs 100 to be gripped on the growth substrate 101 are the micro LEDs 100 positioned at the 1st, 4th, 7th, and 10th positions with reference to the left side of the drawing. The transfer head 1000 having the configuration of the escape recesses 1313 vacuum-sucks only the micro LEDs 100 positioned at the 1st, 4th, 7th, and 10th positions without interference of the micro LEDs 100 not to be gripped.

Third Embodiment

Hereinafter, a third embodiment of the present invention will be described. It should be noted that the embodiment described below will be described with particular emphasis on characteristic components as compared with the first embodiment, and descriptions of the same or similar components as those of the first embodiment will be omitted.

Figure 13:
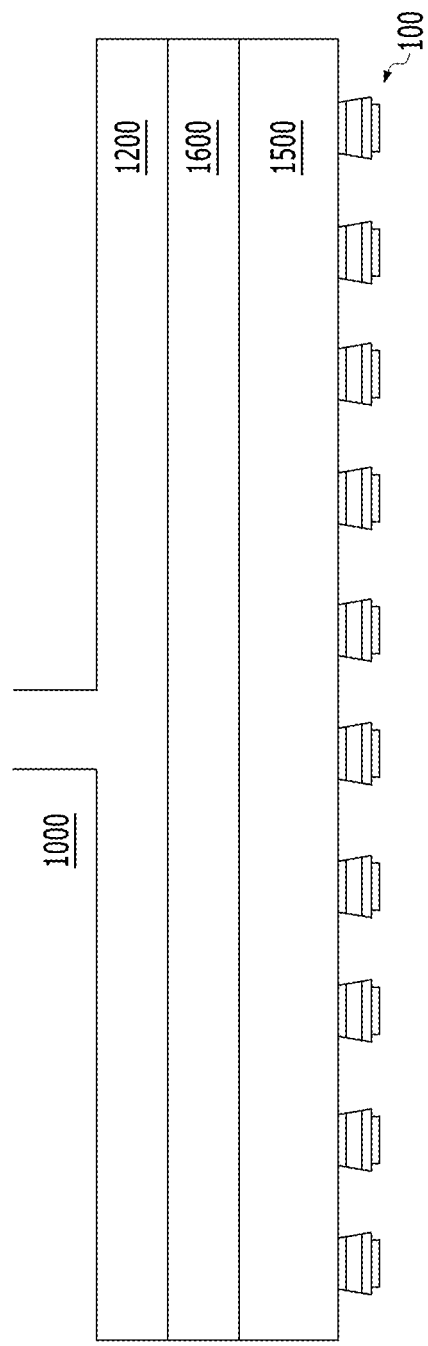
FIG. 13 is a view illustrating a transfer head according to a third embodiment of the present invention.
Figure 14:
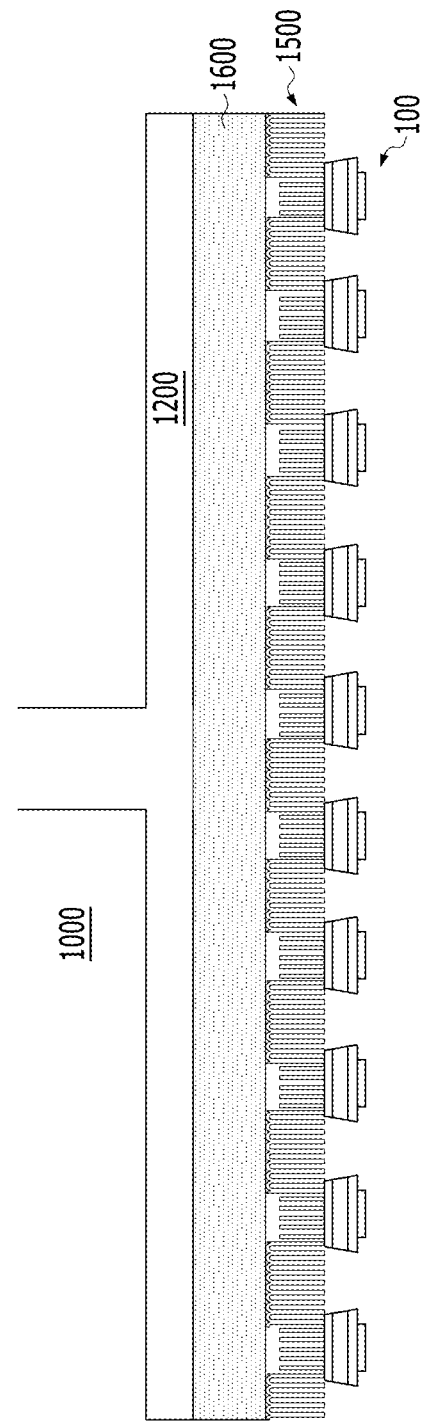
FIG. 14 is a view illustrating a modification of the third embodiment of the present invention.

FIG. 13 is a view illustrating a micro LED transfer head 1000 according to the third embodiment of the present invention; and FIG. 14 is a view illustrating specific means of first and second porous members of FIG. 13.

The micro LED transfer head 1000 according to the third embodiment of the present invention is characterized in that the porous member 1100 according to the first embodiment is embodied by two porous members including a first porous member 1500 and a second porous member 1600.

The second porous member 1600 is provided on the first porous member 1500. The first porous member 1500 functions to vacuum-suck the micro LEDs 100. The second porous member 1600 is disposed between a suction chamber 1200 and the first porous member 1500 to transfer a vacuum pressure of the suction chamber 1200 to the first porous member 1500.

The first and second porous members 1500 and 1600 may have different porous characteristics. For example, the first and second porous members 1500 and 1600 have different characteristics in arrangement and sizes of the pores, and materials and shapes of the porous members.

With respect to the pore arrangement, one of the first and second porous members 1500 and 1600 may have a uniform pore arrangement and the other may have a disordered pore arrangement.

With respect to the pore size, any one of the first and second porous members 1500 and 1600 may have a larger pore size than the other.

Here, the pore size may be the average pore size or may be the maximum pore size. With respect to the material of the porous member, one of the first and second porous members may be made of one of organic, inorganic (ceramic), metal, and hybrid type porous materials, and the other one may be made of one of organic, inorganic (ceramic), metal, and hybrid type porous material different from the first material. With respect to the shape of the porous member, the first and second porous members 1500 and 1600 may have different shapes.

By varying the arrangement and the size of the pores and the material and the shape of the first and second porous members 1500 and 1600 as described above, the transfer head 1000 has various functions, and each of the first and second porous members 1500 and 1600 performs complementary functions. The number of the porous members is not limited to two as in the case of the first and second porous members. As long as individual porous members have mutually complementary functions, providing two or more porous members also falls into the scope of the third embodiment.

Referring to FIG. 14, the first porous member 1500 is embodied by an anodic oxide film having pores formed by anodizing a metal. The first porous member 1500 may be embodied by the configuration of the second embodiment described above and the modifications thereof. The second porous member 1600 may be embodied by a porous scaffold functioning to support the first porous member 1500. A material of the second porous member 1600 is not limited as long as the second porous member 1600 functions to support the first porous member 1500. The second porous member

1600 may have the above-mentioned configuration of the porous member 1100 of the first embodiment. The second porous member 1600 may be embodied by a rigid porous scaffold capable of preventing sagging at the center portion of the first porous member 1500. For example, the second porous member 1600 may be made of a porous ceramic material.

In the case of the second porous member being made of a porous ceramic material, a size of pores is non-uniform, and the pores are formed in various directions so that the vacuum pressure may be supplied non-uniformly depending on the location. On the other hand, pores of an anodic oxide film are uniform in size, and the pores are formed in one direction (for example, the vertical direction) such that the vacuum pressure is supplied uniformly even when the location varies.

Therefore, as described above, in the case that the first porous member 1500 is embodied by the anodic oxide film having pores and the second porous member 1600 is embodied by the porous ceramic material, it is advantageous in terms of the uniformity of the vacuum pressure due to the characteristics of the pores of the anodic oxide film, compared with being embodied by only the porous ceramic material.

Alternatively, the first porous member 1500 may be embodied by the second embodiment and the modifications thereof, and the second porous member 1600 may be embodied by a porous buffer to buffer the contact between the first porous member 1500 and the micro LEDs 100. A material of the second porous member is not limited as long as the second porous member 1600 functions to buffer the contact of the first porous member 1500. The second porous member may have the configuration of the porous member 1100 according to the first embodiment. The second porous member 1600 may be embodied by a soft porous buffer that helps to protect the micro LEDs 100 from damage, which may occur when the micro LEDs 100 and the first porous member 1500 are brought into contact with each other to vacuum-suck the micro LEDs 100. For example, the second porous member 1600 may be embodied by a porous elastic material such as a sponge or the like.

Fourth Embodiment

Hereinafter, a fourth embodiment of the present invention will be described. It should be noted that the embodiment described below will be described with particular emphasis on characteristic components as compared with the first embodiment, and descriptions of the same or similar components as those of the first embodiment will be omitted.

Figure 15:
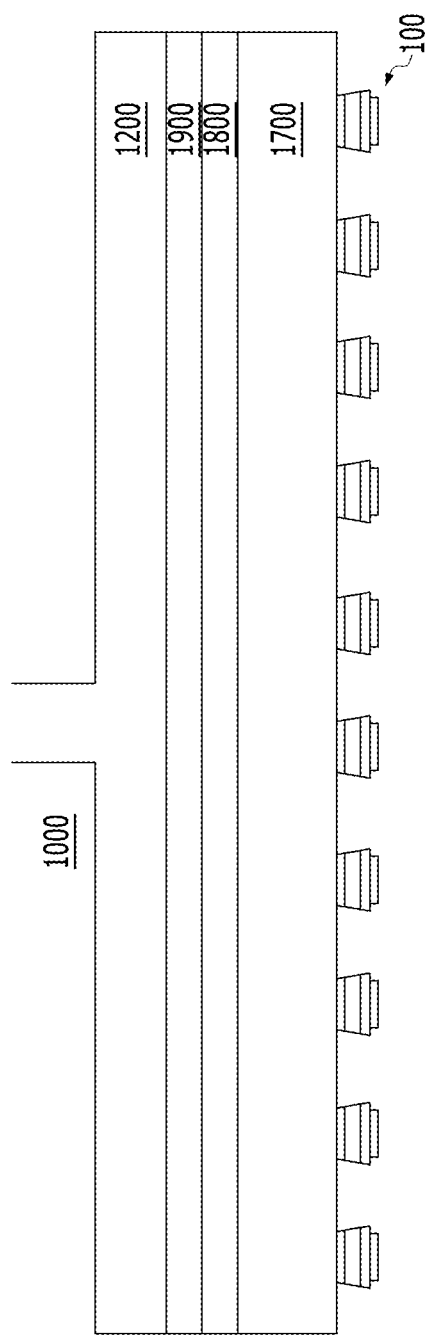
FIG. 15 is a view illustrating a transfer head according to a fourth embodiment of the present invention.

FIG. 15 is a view illustrating a transfer head according to the fourth embodiment of the present invention.

The micro LED transfer head 1000 according to the fourth embodiment of the present invention is characterized in that the porous member 1100 according to the first embodiment is embodied by three porous members including a first porous member 1700, a second porous member 1800, and a third porous member 1900.

The second porous member 1800 is provided on the first porous member 1700, and the third porous member 1900 is provided on the second porous member 1800. The first porous member 1700 functions to vacuum-suck the micro LEDs 100. At least one of the second porous member 1800 and the third porous member 1900 may be embodied by a rigid porous scaffold, and the other may be embodied by a soft porous buffer.

With the above structure, it is possible to vacuum-suck the micro LEDs, prevent the sagging at the center portion of the first porous member 1700, and prevent damage to the micro LEDs 100.

Fifth Embodiment

Hereinafter, a fifth embodiment of the present invention will be described. It should be noted that the embodiment described below will be described with particular emphasis on characteristic components as compared with the first embodiment, and descriptions of the same or similar components as those of the first embodiment will be omitted.

Figure 16:
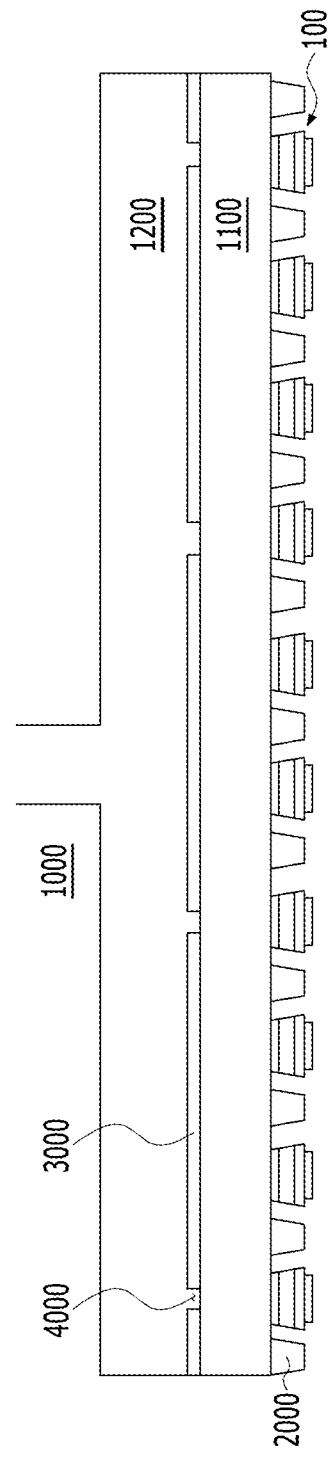
FIG. 16 is a view illustrating a transfer head according to a fifth embodiment of the present invention.
Figure 17:
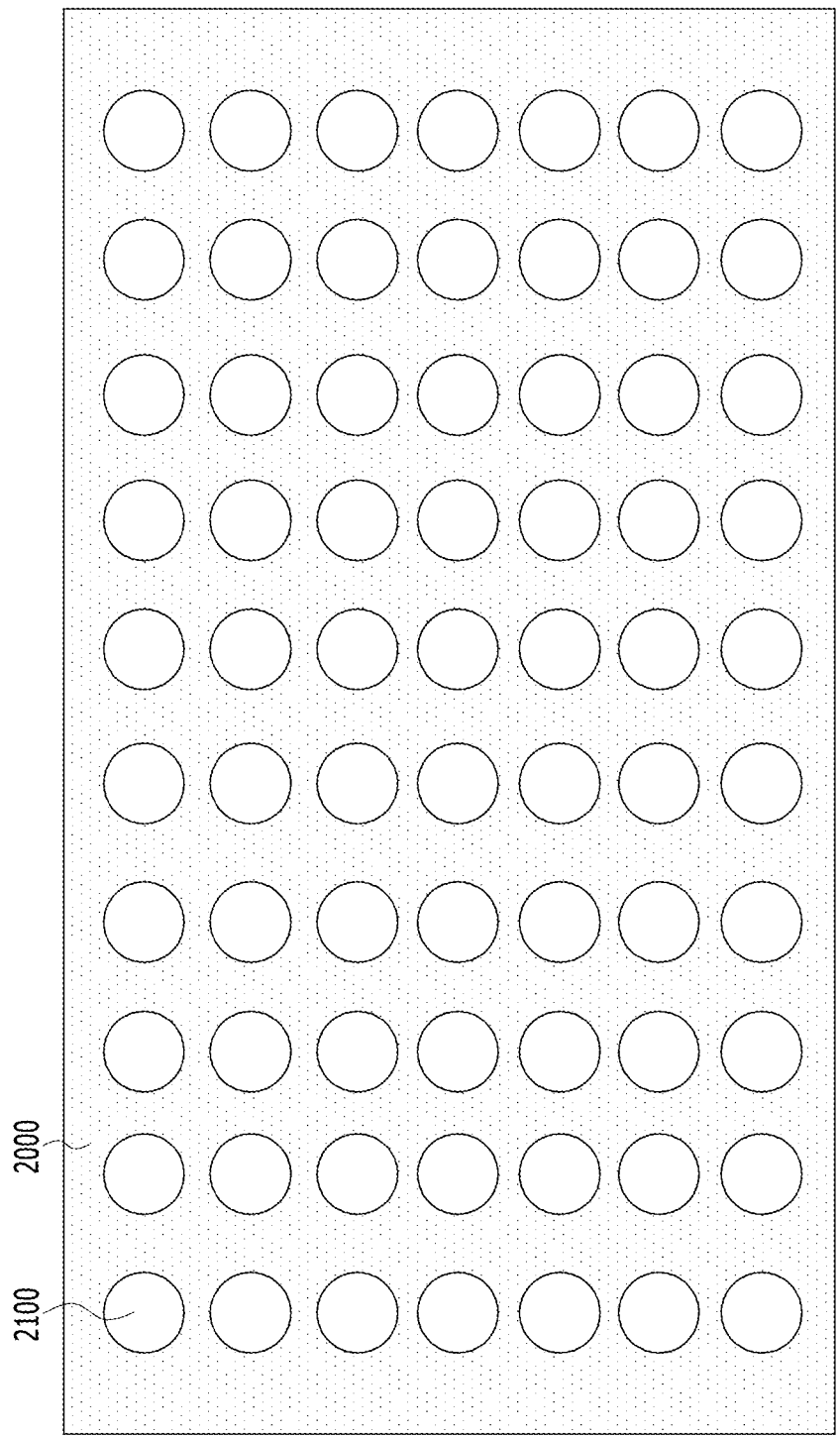
FIG. 17 is a view illustrating an example of a dam of the fifth embodiment of the present invention.

FIG. 16 is a view illustrating a transfer head according to the fifth embodiment of the present invention; and FIG. 17 is a view illustrating an example of a dam of the fifth embodiment of the present invention.

The micro LED transfer head 1000 according to the fifth embodiment of the present invention is characterized in that the porous member 1100 according to the first embodiment is configured with a dam 2000 at a lower portion thereof.

A material of the dam 2000 may be made of a photoresist (PR, including dry film PR) or a metal. The dam 2000 may be made of any material that can be formed on a surface of the porous member 1100 with a predetermined height.

A cross-sectional shape of a protruding portion of the dam 2000 may be any protruding shape such as a quadrangle, a circle, and a triangle.

The cross-sectional shape of the protruding portion of the dam 2000 may be configured in consideration of the shape of the micro LEDs 100.

For example, in the case of the micro LEDs 100 having a structure in which an upper portion thereof is wider than a lower portion thereof, when the protruding portion of the dam 2000 has a structure in which a lower portion thereof has a narrower cross section than an upper portion thereof, it is advantageous in terms of prevention of interference between the dam 2000 and the micro LEDs 100.

Referring to FIG. 16, the protruding portion of the dam 2000 has a cross section tapered downward.

When descending the transfer head 1000 to the suction position to vacuum-suck the micro LEDs 100 positioned on the growth substrate 101, an error in a driving means of the transfer head 1000 may cause the contact between the porous member 1100 and the micro LEDs 100, leading to damage to the micro LEDs 100.

In order to prevent damage to the micro LEDs 100, it is preferable that the lower surface of the porous member 1100 and the upper surfaces of the micro LEDs 100 are spaced apart from each other at a position where the transfer head 1000 sucks the micro LEDs 100. However, when there is a gap between the lower surface of the porous member 1100 and the micro LEDs 100, a larger vacuum pressure is required compared with the case where the micro LEDs 100 and the porous member 1100 are in contact with each other.

However, the configuration of the dam 2000 of the transfer head 1000 according to the fifth embodiment reduces the amount of air flowing into the grip regions from the peripheral region. Thus, the porous member 1100 can vacuum-suck the micro LEDs 100 by a smaller vacuum pressure compared with the configuration in which the dam 2000 is not provided.

There is a case that a length of the protruding portion of the dam 2000 is configured to be longer than the height of the micro LEDs 100. In this case, when descending the transfer head 1000 to the lowermost position, the dam 2000 may come into contact with the growth substrate 101, but the lower surface of the porous member 1100 may not be in contact with the upper surfaces of the micro LEDs 100.

According to the configuration in which the dam 2000 comes into contact with the growth substrate 101 and the lower surface of the porous member 1100 is spaced apart from the upper surfaces of the micro LEDs 100, the dam 2000 more reliably blocks the inflow of air from the peripheral region to the grip regions as compared with the configuration in which the porous member 1100 and the growth substrate 101 are spaced apart from each other. Thus, the porous member 1100 having the dam 2000 can vacuum-suck the micro LEDs 100 easily.

In addition, even when air flow causes the adjacent micro LEDs 100 to move finely, it is possible to physically restrict changes in the positions of the micro LEDs 100 due to the dam 2000.

Shielding portions 3000 are provided on an upper surface of the porous member 1100 to configure a non-grip region. Regions 4000 communicating with the suction chamber 1200 are configured between the shielding portions 3000 to constitute the grip regions.

The shielding portions are not limited in material, shape, and thickness as long as the shielding portions function to close the pores exposed to the surface of the porous member 1100. Preferably, the shielding portions may be further provided and made of a photoresist (PR, including dry film PR) or a metal. In the case of the porous member 1100 being made of an anodic oxide film, the shielding portions may be a barrier layer or a metal base material.

FIG. 17 is a bottom view illustrating the porous member 1100 provided with the dam 2000.

As illustrated in FIG. 17, the dam 2000 is provided on the entire porous member except openings 2100 which become the grip regions.

The openings 2100 of the dam 2000 may be configured with the same pitch distances of the arrangement of the micro LEDs 100 positioned on the growth substrate 101.

The openings 2100 of the dam 2000 may be arranged in an m by n matrix as illustrated in FIG. 17.

When pitch distances of the micro LEDs 100 positioned on the growth substrate 101 are P(n) in the column direction and P(m) in the row direction, pitch distances of the openings 2100 of the dam 2000 are P(n) in a column direction and P(m) in a row direction.

In this case, the openings 2100 of the dam 2000 correspond with the micro LEDs 100 to be gripped on a one-to-one basis.

In the case of the present invention, since the micro LEDs 100 have a circular cross section, the openings 2100 are also formed in a circular shape as illustrated in FIG. 17. However, the shape of the openings 2100 may vary depending on the cross-sectional shape of the micro LEDs 100. For example, when the micro LEDs 100 have a quadrangular cross section, the openings 2100 may have a quadrangular cross section corresponding to the cross-sectional shape of the micro LEDs 100.

Figure 18:
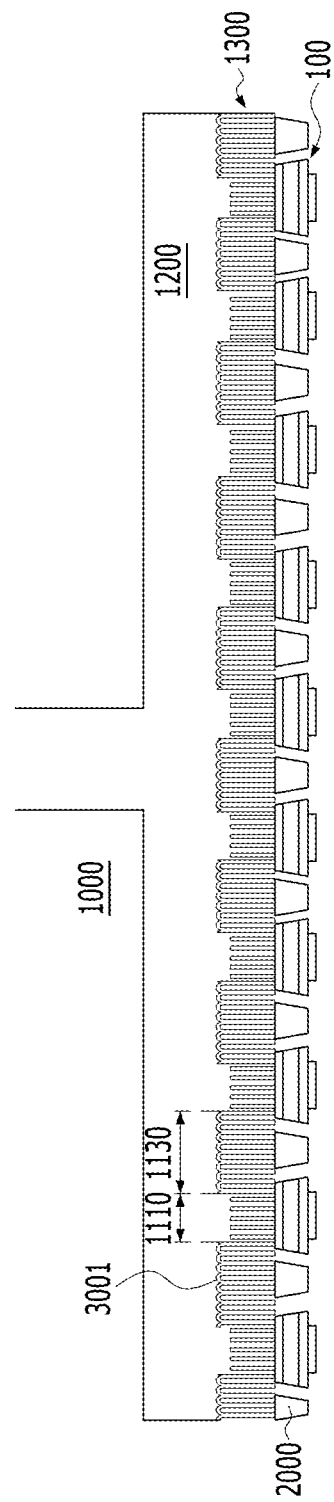
FIG. 18 is a view illustrating a modification of the fifth embodiment of the present invention.

FIG. 18 illustrates a modification in which the porous member 1100 according to the fifth embodiment is embodied by an anodic oxide film 1300 having pores formed by anodizing a metal.

Referring to FIG. 18, the dam 2000 is provided on the lower surface of the anodic oxide film 1300. The anodic oxide film 1300 includes a portion in which a surface of a barrier layer 3001 provided at an upper surface of the anodic oxide film 1300 is removed such that the suction regions 1110 are configured and a portion in which the barrier layer 3001 provided at the upper surface of the anodic oxide film 1300 is not removed such that the non-suction region 1130 is configured.

The barrier layer functions as the shielding portions 3000 illustrated in FIG. 16, and a region where the barrier layer 3001 is not provided functions as the regions 4000 illustrated in FIG. 16 and communicating with the suction chamber 1200.

FIGS. 19A and 19B are views each illustrating a modification of the transfer head according to the fifth embodiment. The dam 2000 is provided only around the micro LEDs 100 to be gripped on the suction regions 1110. As illustrated in FIG. 19A and FIG. 19B, the micro LEDs 100 to be gripped are the micro LEDs 100 positioned at the 1st, 4th, 7th, and 10th positions with reference to the left side of the drawings. The dam 2000 functions to block the inflow of air from the peripheral region to the grip regions 1110 when the transfer head 1000 vacuum-sucks the micro LEDs 100 positioned at the 1st, 4th, 7th, and 10th positions. Here, the dam 2000 provided on the lower surface of the anodic oxide film 1300 may have the shape of the dam 2000 of FIG. 17.

Sixth Embodiment

Hereinafter, a sixth embodiment of the present invention will be described. It should be noted that the embodiment described below will be described with particular emphasis on characteristic components as compared with the first embodiment, and descriptions of the same or similar components as those of the first embodiment will be omitted.

FIG. 20 is a view illustrating a transfer head according to the sixth embodiment of the present invention.

A transfer head 1000 includes a porous member 1100 having pores. The transfer head 1000 functions to apply a vacuum pressure to the pores of the porous member 1100 or to release the vacuum pressure applied to the pores in order to transfer the micro LEDs 100 from a first substrate (for example, the growth substrate 101 or a temporary substrate) to a second substrate (for example, a temporary substrate or the display substrate 301).

A suction chamber 1200 is provided on the porous member 1100. The suction chamber 1200 is connected to a vacuum port providing a vacuum pressure or releasing the vacuum pressure. The suction chamber 1200 functions to apply the vacuum pressure, which is supplied via a suction pipe 1400, to the pores of the porous member 1100 or release the vacuum pressure applied to the pores according to the operation of the vacuum port. A structure in which the suction chamber 1200 is engaged with the porous member 1100 is not limited as long as the structure is suitable for preventing gas or air from leaking to other parts when applying the vacuum pressure to the porous member 1100 or releasing the applied vacuum pressure.

In a case of the porous member 1100 having an arbitrary pore structure, the internal space of the porous member 1100 is present in a disordered manner in a manufacturing process such as sintering, foaming, or the like such that the porous member 1100 has arbitrary pores in which the pores are connected to each other. In a case of the porous member 1100 having the disordered pore structure, the multiple pores are connected to each other inside the porous member 1100 such that air flow paths are formed and connect upper and lower portions of the porous member 1100.

In a case of the porous member 1100 having a vertical pore structure, the inside of the porous member 1100 is pierced from top to bottom by vertical pores such that air flow paths are formed. Here, the vertical pore structure means that the pores are formed in the vertical direction of the porous member but does not mean that the pore shapes are perfectly vertical such that at least one of upper and lower portions of the pores may be closed or extend from top to bottom. The vertical pores may be formed at the time of manufacturing the porous member or may be formed by drilling holes in the porous member after manufacturing the porous member. The vertical pores may be provided throughout the porous member or may be provided only in a part of the porous member.

As described above, the arbitrary pores mean that the directionality of the pores is disordered, and the vertical pores mean that the directionality of the pores is vertical.

As described in FIG. 20, the porous member 1100 is embodied by two porous members including a first porous member 1100a and a second porous member 1100b.

The second porous member 1100b is provided on the first porous member 1100a. The first porous member 1100a functions to vacuum-suck the micro LEDs 100 and includes a grip member. The second porous member 1100b is disposed between the suction chamber 1200 and the first porous member 1100a to transfer a vacuum pressure of the suction chamber 1200 to the first porous member 1100a and support the first porous member 1100a. The second porous member 1100b may include a support member supporting the grip member.

The first and second porous members 1100a and 1100b may have different porous characteristics. For example, the first and second porous members 1100a and 1100b have different characteristics in arrangement and sizes of the pores, and materials and shapes of the porous member 1100.

With respect to the pore arrangement, the first porous member 1100a may have a uniform pore arrangement, and the second porous member 1100b may have a disordered pore arrangement. With respect to the size of the pores, any one of the first and second porous members 1100a and 1100b may have a larger pore size than the other. Here, the pore size may be the average pore size or may be the maximum pore size. With respect to the material of the porous member 1100, one of the first and second porous members may be made of one of organic, inorganic (ceramic), metal, and hybrid type porous materials, and the other one may be made of one of organic, inorganic (ceramic), metal, and hybrid type porous material different from the first material.

With respect to the internal pores of the porous member 1100, the first and second porous members 1100a and 1100b may have different internal pores. In detail, the first porous member 1100a may be embodied by a porous member having vertical pores with a uniform arrangement. The first porous member 1100a may be embodied by a porous member having the vertical pores and include a grip member functioning to grip the micro LEDs 100. The grip member may be embodied by an anodic oxide film 1300 and have vertical pores, wherein the vertical pores are formed in manufacture of the anodic oxide film 1300 or suction holes formed in a separate process in addition to a pore forming process serve as the vertical pores. Alternatively, the grip member may be embodied by a mask configured with openings, and the openings may serve as the vertical pores. Alternatively, the grip member may be configured with vertical pores through a laser processing. Alternatively, the grip member may be configured with vertical pores through etching. The grip member may be embodied by at least one of the above-mentioned examples. As described above, the grip member is embodied by various structures having vertical pores. The second porous member 1100b may be embodied by a porous member having arbitrary pores with a disordered arrangement. The second porous member 1100b may include a support member having the arbitrary pores and supporting the grip member.

By varying the pore arrangement, pore size, material, and internal pores of the first and second porous member 1100a and 1100b as described above, the transfer head 1000 has various functions, and each of the first and second porous members 1100a and 1100b performs complementary functions.

The number of the porous members is not limited to two as in the case of the first and second porous members 1100a and 1100b. As long as individual porous members have mutually complementary functions, providing two or more porous members is also possible. Hereinafter, the porous member 1100 will be described as including two porous members which are the first and second porous members 1100a and 1100b.

The second porous member 1100b may be embodied by a porous member having the arbitrary pores as described above or may be embodied by a porous scaffold functioning to support the first porous member 1100a. A material of the second porous member 1100b is not limited as long as the second porous member 1100b functions to support the first porous member 1100a. The second porous member 1100b may be embodied by a rigid porous scaffold capable of preventing sagging at the center portion of the first porous member 1100a. For example, the second porous member 1100b may be made of a porous ceramic material. The second porous member 1100b functions not only to prevent the first porous member 1100a provided in the form of a thin film from being deformed by the vacuum pressure but also to disperse the vacuum pressure of the suction chamber 1200 to transfer the vacuum pressure to the first porous member 1100a. The vacuum pressure dispersed or diffused by the second porous member 1100b is transmitted to grip regions of the first porous member 1100a, and thus the micro LEDs 100 are gripped. In addition, the vacuum pressure dispersed or diffused by the second porous member 1100b is transmitted to the non-grip region of the first porous member 1100a, and thus the second porous member 1100b grips the first porous member 1100a.

In addition, the second porous member 1100b may be embodied by a porous buffer to buffer the contact between the first porous member 1100a and the micro LEDs 100. A material of the second porous member 1100b is not limited as long as the second porous member 1100b functions to buffer the contact of the first porous member 1100a. The second porous member 1100b may be embodied by a soft porous buffer that helps to protect the micro LEDs 100 from damage, which may occur when the micro LEDs 100 and the first porous member 1100a are brought into contact with each other to vacuum-suck the micro LEDs 100. For example, the second porous member 1100b may be embodied by a porous elastic material such as a sponge or the like.

The first porous member 1100a vacuum-sucking the micro LEDs 100 includes grip regions 1110 on which the micro LEDs 100 are gripped and a non-grip region 1130 on which the micro LEDs 100 are not gripped. The grip regions 1110 are regions where the vacuum pressure of the suction chamber 1200 is transferred and the micro LEDs 100 are gripped. The non-grip region 1130 is a region where the vacuum pressure of the suction chamber 1200 is not transferred and thus the micro LEDs 100 are not gripped.

The non-grip region 1130 may be embodied by forming a shielding portion on at least a part of a surface of the first porous member 1100*a*. The shielding portion is formed to close the pores exposed at least on a part of a surface of the first porous member 1100*a*.

The shielding portion is not limited in material, shape, and thickness as long as the shielding portion functions to close the pores exposed to the surface of the first porous member 1100*a*. Preferably, the shielding portion may be further provided and made of a photoresist (PR, including dry film PR), PDMS, or a metal. Alternatively, the shielding portion may be embodied by the structure of the first porous member 1100*a* itself. In the case of the shielding portion being embodied by the structure of the first porous member 1100*a*, for example, in a case where the first porous member 1100*a* to be described later is embodied by an anodic oxide film 1300, the shielding portion may be a barrier layer or a metal base material.

The transfer head 1000 may be provided with a monitoring unit monitoring the degree of vacuum of the suction chamber 1200. The monitoring unit may monitor the degree of vacuum generated in the suction chamber 1200, and a control unit may control the degree of vacuum of the suction chamber 1200 according to the degree of vacuum of the suction chamber 1200. When the monitoring unit monitors that the degree of vacuum of the suction chamber 1200 becomes lower than a predetermined range of the degree of vacuum, the control unit may determine that some of the micro LEDs 100 to be vacuum-sucked onto the first porous member 1100*a* are not vacuum-sucked or may determine that there is a vacuum leak, and thus instruct the transfer head 1000 to operate again. Accordingly, the transfer head 1000 transfers the micro LEDs 100 without error according to the degree of vacuum in the suction chamber 1200.

A size of a horizontal area of each of the grip regions 1110 may be smaller than a size of a horizontal area of an upper surface of each micro LED 100 to prevent a vacuum leak while the micro LEDs 100 are gripped by vacuum-suction, whereby it is possible to perform vacuum-suction easily.

The grip regions 1110 may be configured to suit the structure of the first porous member 1100*a*. Specifically, in a case of the first porous member 1100*a* being the anodic oxide film 1300 including a barrier layer in which pores are not formed and a porous layer in which pores are formed, at least a part of the barrier layer may be removed to form the grip regions 1110 with only a porous layer having multiple pores. Alternatively, at least a part of the anodic oxide film 1300 may be etched in the vertical direction to form suction holes 1500 having a width larger than the pores of the porous layer, thereby providing the grip regions 1110.

Alternatively, the first porous member 1100*a* may be embodied by a wafer such as a sapphire wafer or a silicon wafer, and the grip regions 1110 may be provided by vertical pores formed by laser etching.

Alternatively, in a case of the first porous member 1100*a* being the grip member embodied by the mask configured with second openings having a predetermined pitch distance, the grip regions 1110 may be provided by opening forming regions where the second openings of the mask are formed. A material of the mask here is not limited as long as the mask can be configured into the form of a thin film.

The grip regions 1110 may be configured with pitch distances equal to the pitch distances of the micro LEDs 100 positioned on the growth substrate 101. Thus, it is possible to vacuum-suck all of the micro LEDs 100 from the growth substrate 101 in a batch manner. The micro LEDs 100 to be gripped onto the grip regions 1110 may be disposed on the growth substrate 101, a temporary substrate, a carrier substrate, or may be disposed on the display substrate 301 or the target substrate (TS). A substrate (S) described below may be at least one of a first substrate including the growth substrate 101, the temporary substrate, and the carrier substrate and a second substrate including the display substrate 301, the target substrate (TS), a circuit board (HS), the temporary substrate, and the carrier substrate.

The grip regions 1110 may have a pitch distance in a column direction (x-direction) three times a pitch distance in the column direction (x-direction) of the micro LEDs 100 positioned on the first substrate. According to the above configuration, the transfer head 1000 vacuum-sucks and transfers only the micro LEDs 100 positioned at (3n)th column. Here, each of the micro LEDs 100 transferred to the (3n)th column may be any one of red, green, blue, and white LEDs. With such a configuration, it is possible to transfer the micro LEDs 100 of the same luminous color to be mounted on the second substrate with the pitch distance of three times the pitch distance in the column direction (x-direction) of the micro LEDs 100 positioned on the first substrate. The transfer head 1000 may be implemented as illustrated in FIG. 20, wherein the transfer head 1000 has the grip regions 1110 in which the pitch distance thereof is three times the pitch distance in the column direction (x-direction) of the micro LEDs 100 positioned on the first substrate. In this case, the micro LEDs 100 to be gripped from the substrate (S) are the micro LEDs 100 positioned at 1st, 4th, 7th, and 10th positions with reference to the left side of FIG. 20.

Alternatively, the grip regions 1110 may have a pitch distance in a row direction (y-direction) three times a pitch distance in the row direction (y-direction) of the micro LEDs 100 positioned on the first substrate. According to the above configuration, the transfer head 1000 vacuum-sucks and transfers only the micro LEDs 100 positioned at (3n)th row. Here, each of the micro LEDs 100 transferred to the (3n)th row may be any one of red, green, blue, and white LEDs. With such a configuration, it is possible to transfer the micro LEDs 100 of the same luminous color to be mounted on the second substrate with the pitch distance of three times the pitch distance in the row direction (y-direction) of the micro LEDs 100 positioned on the first substrate.

Alternatively, the grip regions 1110 may be configured in a diagonal direction of the micro LEDs 100 positioned on the first substrate. In this case, pitch distances of the grip regions 1110 in the column direction (x-direction) and in the row direction (y-direction) may be three times the pitch distances of the micro LEDs 100 positioned on the first substrate in the column direction (x-direction) and in the row direction (y-direction). Here, each of the micro LEDs 100 transferred to the (3n)th row and (3n)th column may be any one of red, green, blue, and white LEDs. With such a configuration, it is possible to transfer the micro LEDs 100 of the same luminous color to be mounted on the second substrate with the pitch distances of three times the pitch distances of the micro LEDs 100 positioned on the first substrate in the column direction (x-direction) and in the row direction (y-direction) such that the micro LEDs 100 of the same luminous color are transferred to diagonal positions.

The transfer head 1000 according to the present invention may transfer the micro LEDs 100 in the following manner. The transfer head 1000 is moved over the first substrate and then lowered. At this point, the porous member 1100 is applied with a vacuum pressure through the vacuum port to vacuum-suck the micro LEDs 100. With respect to the transfer head 1000 gripping the micro LEDs 100 with a suction force, the porous member 1100 of the transfer head 1000 may be brought in close contact with the micro LEDs 100 while vacuum-sucking the micro LEDs 100. However, the micro LEDs 100 may be damaged by the close contact with the porous member 1100. Thus, the micro LEDs 100 may be caused to be gripped onto a lower surface of the first porous member 1100a by a vacuum suction force in a state where the lower surface of the first porous member 1100a, which is the actual grip surface on which the micro LEDs 100 are gripped, and upper surfaces of the micro LEDs 100 are spaced apart from each other by a predetermined distance.

Then, the transfer head 1000 is raised while the vacuum suction force of the transfer head 1000 with respect to the micro LEDs 100 is maintained, and moved.

Thereafter, the transfer head 1000 is moved over the second substrate and then lowered. At this point, the micro LEDs 100 are transferred to the second substrate by releasing the vacuum pressure which is applied to the porous member 1100 through the vacuum port.

Seventh Embodiment

Hereinafter, a seventh embodiment of the present invention will be described. It should be noted that the embodiment described below will be described with particular emphasis on characteristic components as compared with the sixth embodiment, and descriptions of the same or similar components as those of the sixth embodiment will be omitted.

FIG. 21 is a view illustrating a transfer head according to the seventh embodiment of the present invention.

A transfer head 1000 according to the seventh embodiment includes a grip member and a support member, wherein a first porous member 1100a having vertical pores described in the sixth embodiment may be the grip member embodied by an anodic oxide film 1300, and a second porous member 1100b may be the support member having arbitrary pores and supporting the grip member.

In other words, the first porous member 1100a may be the grip member, and the second porous member 1100b may be the support member. Therefore, although the reference numerals of the grip member and the support member are omitted in the following description, the grip member may be designated by reference numeral 1100a of FIG. 21, and the support member may be designated by reference numeral 1100b of FIG. 21.

The transfer head 1000 of the seventh embodiment may include the grip member, the support member, and the suction chamber 1200. Manners of holding the grip member, which is the first porous member 1100a, to the transfer head 1000 may include a manner using a vacuum suction force of the support member, a manner using a sub-pipe separate from the pipe forming the vacuum pressure in the support member, a manner using a physical means such as clips or clamps, or a manner using a chemical means such as an adhesive.

According to the manner of holding the grip member to the transfer head 1000 using the vacuum suction force of the support member, a non-grip region 1130 of the grip member is sucked using the vacuum suction force applied through the pores of the support member so that the support member sucks the grip member. In this case, the vacuum suction force to be transmitted to the support member may be transmitted via the suction chamber 1200 communicating with the pores of the support member.

According to the manner of holding the grip member to the transfer head 1000 using the sub-pipe separate from the pipe forming the vacuum pressure in the support member, the sub-pipe for holding the grip member and the main pipe for applying the vacuum force to the grip regions through the support member are separately provided. Accordingly, the grip member is held to the transfer head 1000 using the sub-pipe, and the main pipe is operated only when the transfer head 1000 grips the micro LEDs 100 so that the micro LEDs 100 are gripped onto the grip member. According to the configuration using the sub-pipe separate from the main pipe, the main pipe is operated only when the transfer head 1000 grips the micro LEDs 100. Thus, it is possible to prevent vortexes from being generated by intake air caused by the operation of the main pipe before gripping the micro LEDs 100. As a result, the transfer head 1000 can grip the micro LEDs 100 more accurately and reliably. In this case, the suction chamber 1200 may be divided into a main chamber transmitting the vacuum suction force to the main pipe and a sub-chamber transmitting the vacuum suction force to the sub-pipe.

The transfer head 1000 according to the seventh embodiment of the present invention includes: the grip member embodied by the anodic oxide film 1300 having the vertical pores; and the support member having the arbitrary pores and supporting the grip member. In addition, the grip member includes grip regions 1110 on which the micro LEDs are gripped with the vacuum suction force and the non-grip region 1130 on which the micro LEDs are not gripped, thereby selectively transferring the micro LEDs 100.

The grip regions 1110 may be defined by removing a barrier layer 1300b formed in manufacture of the anodic oxide film 1300 so that vertical pores extend from top to bottom or may be defined by suction holes 1500 extending from top to bottom and having a width greater than that of the vertical pores formed in manufacture of the anodic oxide film 1300.

The non-grip region 1130 may be formed by a shielding portion closing at least one of upper and lower portions of the vertical pores formed in manufacture of the anodic oxide film 1300, and the barrier layer 1300b formed in manufacture of the anodic oxide film 1300 may serve as the shielding portion.

It should be noted that the seventh embodiment described below will be described with particular emphasis on characteristic components as compared with the sixth embodiment, and descriptions of the same or similar components as those of the sixth embodiment will be omitted.

The grip member is embodied by the anodic oxide film 1300 having the vertical pores and configured with the grip regions 1110 and the non-grip region 1130, wherein the grip regions 1110 grip the micro LEDs 100 with the vacuum suction force applied through the suction holes 1500 having a width greater than that of the vertical pores, and the non-grip region 1130 not gripping the micro LEDs 100 due to the shielding portion closing any one of the upper and lower portions of the vertical pores.

The anodic oxide film 1300 serving as the grip member is a film formed by anodizing a metal that is a base material, and the pores are pores formed in a process of forming the anodic oxide film 1300 by anodizing the metal. For example, in the case where a metal base material is aluminum (Al) or an aluminum alloy, the anodization of the base material forms the anodic oxide film 1300 consisting of anodized aluminum ($Al_2O_3$) on a surface of the base material. The anodic oxide film 1300 formed as described above includes the barrier layer 1301 in which the vertical pores are not formed and a porous layer 1300a in which the pores are formed inside. The barrier layer 1300b is positioned on an upper portion of the base material, and the porous layer 1300a is positioned below the barrier layer 1300b. After removing the base material on which the anodic oxide film 1300 having the barrier layer 1300b and the porous layer 1300a is formed, only an anodic oxide film 1300 consisting of anodized aluminum ($Al_2O_3$) remains.

The anodic oxide film 1300 has the pores configured vertically and having a regular arrangement with a uniform diameter. Accordingly, after removing the barrier layer 1300b, the pores have a structure extending from top to bottom vertically, thereby facilitating the generation of the vacuum pressure in the vertical direction.

The anodic oxide film 1300 includes the grip regions 1110 vacuum-sucking the micro LEDs 100 and the non-grip region 1130 not sucking the micro LEDs 100. The grip regions 1110 of the anodic oxide film 1300 may be formed by removing the barrier layer 1300b formed in manufacture of the anodic oxide film so that the vertical pores extend from top to bottom.

Accordingly, the grip member is embodied by the anodic oxide film 1300 having the vertical pores and configured with the grip regions 1110 and the non-grip region 1130, wherein the grip regions 1110 grip the micro LEDs 100 with the vacuum suction force applied through the vertical pores, and the non-grip region 1130 not gripping the micro LEDs 100 because at least one of the upper and lower portions of the vertical pores are closed.

In other words, the first porous member 1100a may be the grip member, and the grip member may be the anodic oxide film 1300.

The support member is provided on the anodic oxide film 1300, and the suction chamber 1200 is provided on the support member. The suction chamber 1200 functions to apply a vacuum pressure to the support member and to the multiple vertical pores of the grip member embodied by the anodic oxide film 1300 or to release the vacuum pressure according to the operation of the suction port.

In order to vacuum-suck the micro LEDs 100, the vacuum pressure applied to the suction chamber 1200 is transferred to the multiple pores of the anodic oxide film 1300 to generate a vacuum suction force for the micro LEDs 100.

The grip member embodied by the anodic oxide film 1300 includes the grip regions 1110 on which the micro LEDs 100 are gripped with the vacuum suction force and the non-grip region 1130 on which the micro LEDs are not gripped, thereby selectively transferring the micro LEDs 100. The grip member selectively transfers the micro LEDs 100 or transfers the micro LEDs 100 in a batch manner according to pitch distances of the grip regions 1110.

The grip regions 1110 of the grip member embodied by the anodic oxide film 1300 may be defined by the porous layer 1300a in which the vertical pores are formed by removing at least a part of the barrier layer 1300b as described above. Alternatively, as described in FIG. 21, the grip member may be defined by the suction holes 1500 having a width greater than that of the vertical pores formed in manufacture of the anodic oxide film 1300 and extending from top to bottom.

As described above, the barrier layer 1300b may be removed such that the porous layer 1300a serves as the grip regions, or both the barrier layer 1300b and the porous layer 1300a may be removed to form the grip regions. FIG. 21 illustrates that the grip regions are formed by removing both the barrier layer 1300b and the porous layer 1300a.

As illustrated in FIG. 21, it is described that the grip regions 1110 are defined by the suction holes 1500 extending from top to bottom of the anodic oxide film 1300 in the seventh embodiment.

The grip member is further provided with the suction holes 1500 in addition to the pores which are formed spontaneously in the anodic oxide film 1300. The suction holes 1500 are configured to extend from top to bottom of the anodic oxide film 1300. The suction holes 1500 have a width greater than that of the pores. Due to the configuration in which the suction holes 1500 having a width greater than that of the pores are provided, the grip regions 1110 are defined where the micro LEDs 100 are gripped. In addition, it is possible to increase a vacuum suction area for the micro LEDs 100, compared with the configuration in which the micro LEDs 100 are vacuum-sucked only by the pores.

The suction holes 1500 may be formed by etching the anodic oxide film 1300 vertically after forming the anodic oxide film 1300 and the pores. However, by forming the suction holes 1500 by etching, the suction holes 1500 are easily formed without damaging the side surfaces of the pores, thereby preventing damage to the suction holes 1500.

The non-grip region 1130 may be a region where the suction holes 1500 are not formed. The non-suction region 1330 may be a region where at least any one of upper and lower portions of the pores is closed. The non-grip region 1130 may be formed by the shielding portion closing at least one of the upper and lower portions of the vertical pores formed in manufacture of the anodic oxide film 1300. In the case of the seventh embodiment, the shielding portion may be the barrier layer 1300b formed in manufacture of the anodic oxide film 1300. The barrier layer 1300b is formed on at least a part of upper and lower surfaces of the anodic oxide film 1300 and may serve as the shielding portion.

As illustrated in FIG. 21, the non-grip region 1130 according to the seventh embodiment may be configured such that any one of the upper and lower portions of the vertical pores is closed by the barrier layer 1300b when manufacturing the anodic oxide film 1300.

FIG. 21 illustrates that the barrier layer 1300b is provided at an upper portion of the anodic oxide film 1300 and the porous layer 1300a having the pores is provided at a lower portion thereof. However, the anodic oxide film 1300 illustrated in FIG. 21 may be inverted to form the non-grip region 1130 such that the barrier layer 1300b is provided at the lower portion of the anodic oxide film 1300.

It has been described the non-grip region 1130 is configured such that any one of the upper and lower portions of the pores are closed by the barrier layer 1300b. However, the opposite surface, which is not closed by the barrier layer 1300b, may be provided with an additional coating layer whereby both the upper and lower portions are closed. With respect to forming of the non-grip region 1130, the configuration in which both the upper and lower surfaces of the anodic oxide film 1300 are closed is advantageous in that it is possible to reduce the possibility that foreign substances remain in the pores of the non-grip region 1130 compared with the configuration in which at least one of the upper and lower surfaces of the anodic oxide film 1300 is closed.

The grip member may be made of at least one of the anodic oxide film 1300, wafer substrate, Invar, metal, non-metal, polymer, paper, photoresist, and PDMS.

In the case of the grip member being made of a metal, it is possible to prevent the generation of static electricity while transferring the micro LEDs 100. In the case of the grip member being made of a non-metal, it is possible to minimize the influence of the grip member on the micro LEDs 100 having the property of metal. In the case of the grip member being made of silicone (PDMS), it is possible to function as a buffer and minimize damage which may be caused by collision between the grip member and the micro LEDs 100 when a lower surface of the grip member and the upper surfaces of the micro LEDs 100 are brought into contact with each other. In the case of the grip member being made of polymer, it is possible to facilitate the manufacture of the grip member.

The grip member including the grip regions 1110 on which the micro LEDs 100 are gripped with the vacuum suction force and the non-grip region 1130 on which the micro LEDs are not gripped may be supported by the support member having arbitrary pores communicating with the suction regions 1110 via air flow paths.

The support member may be provided on the porous member and embodied by a porous material. Specifically, the support member may be embodied by a porous material having arbitrary pores.

The support member supports the grip member by sucking the non-grip region 1130 of the grip member with the vacuum suction force and grips the micro LEDs 100 onto the grip regions 1110 by communicating with the grip regions 1110 of the grip member via the air flow paths.

The transfer head 1000 according to the seventh embodiment includes the grip member, the support member, and the suction chamber 1200 such that the vacuum pressure of the suction chamber 1200 is reduced by the porous material of the support member and then transferred to the grip regions 1110 of the grip member, whereby the transfer head 1000 grips the micro LEDs 100. In this case, the vacuum pressure of the suction chamber 1200 is transferred to the non-grip region 1130 of the grip member due to the porous material of the support member, thereby sucking the grip member.

As described above, the grip regions 1110 of the grip member may be defined by the porous layer 1300*a* having the vertical pores formed therein by removing at least a portion of the barrier layer 1300*b*, or may be defined by the suction holes 1500 having a width greater than that of the vertical pores formed in manufacture of the anodic oxide film 1300 and extending from top to bottom.

As illustrated in FIG. 21, the grip regions 1110 may have a pitch distance in a column direction (x-direction) three times a pitch distance in the column direction (x-direction) of the micro LEDs 100 positioned on the substrate (S). Here, the substrate (S) may mean the first substrate (for example, the growth substrate 101 or the temporary substrate).

In other words, the grip regions 1110 may be configured such that a pitch distance in the x-direction is three times the pitch distance in the x-direction of the micro LEDs 100 disposed on the first substrate and a pitch distance in the y-direction is one time the pitch distance in the y-direction of the micro LEDs 100 disposed on the first substrate, whereby the transfer head 1000 selectively grips the micro LEDs 100 disposed on the first substrate. According to the above configuration, the transfer head 1000 vacuum-sucks and transfers only the micro LEDs 100 positioned at (3n)th column of the substrate (S). In this case, the transfer head 1000 grips the micro LEDs 100 positioned at 1st, 4th, 7th, and 10th positions with reference to the left side of FIG. 21.

A modification of the grip regions 1110 to be described later is described as an example in which the pitch distance in the column direction (x-direction) is three times the pitch distance in the column direction (x-direction) of the micro LEDs 100.

Alternatively, the grip regions 1110 may be configured such that the pitch distance in the x-direction is three times the pitch distance in the x-direction of the micro LEDs 100 disposed on the first substrate and the pitch distance in the y-direction is three times the pitch distance in the y-direction of the micro LEDs 100 disposed on the first substrate, whereby the transfer head 1000 selectively grips the micro LEDs 100 disposed on the first substrate.

Alternatively, the grip regions 1110 may be configured such that a pitch distance in a diagonal direction is the same as a pitch distance in the diagonal direction of the micro LEDs 100 disposed on the first substrate, whereby the transfer head 1000 selectively grips the micro LEDs 100 disposed on the first substrate.

The pitch distances in the column direction (x-direction) and in the row direction (y-direction) of the grip regions 1110 is not limited to the accompanying drawings. For example, the pitch distances in the column direction (x-direction) or in the row direction (y-direction) of the grip regions 1110 may be three times the pitch distances in the column direction (x-direction) or in the row direction (y-direction) of the micro LEDs 100 positioned on the substrate (S). Alternatively, the grip regions 1110 may be configured such that the pitch distances in the column direction (x-direction) and in the row direction (y-direction) are suitable for a pixel arrangement in which the micro LEDs 100 are to be transferred and disposed on a substrate (for example, the second substrate such as the display substrate 301), such as the pitch distance in the diagonal direction of the micro LEDs 100 positioned on the substrate (S).

Eighth Embodiment

Hereinafter, an eighth embodiment of the present invention will be described. It should be noted that the embodiment described below will be described with particular emphasis on characteristic components as compared with the sixth embodiment, and descriptions of the same or similar components as those of the sixth embodiment will be omitted.

Figure 22:
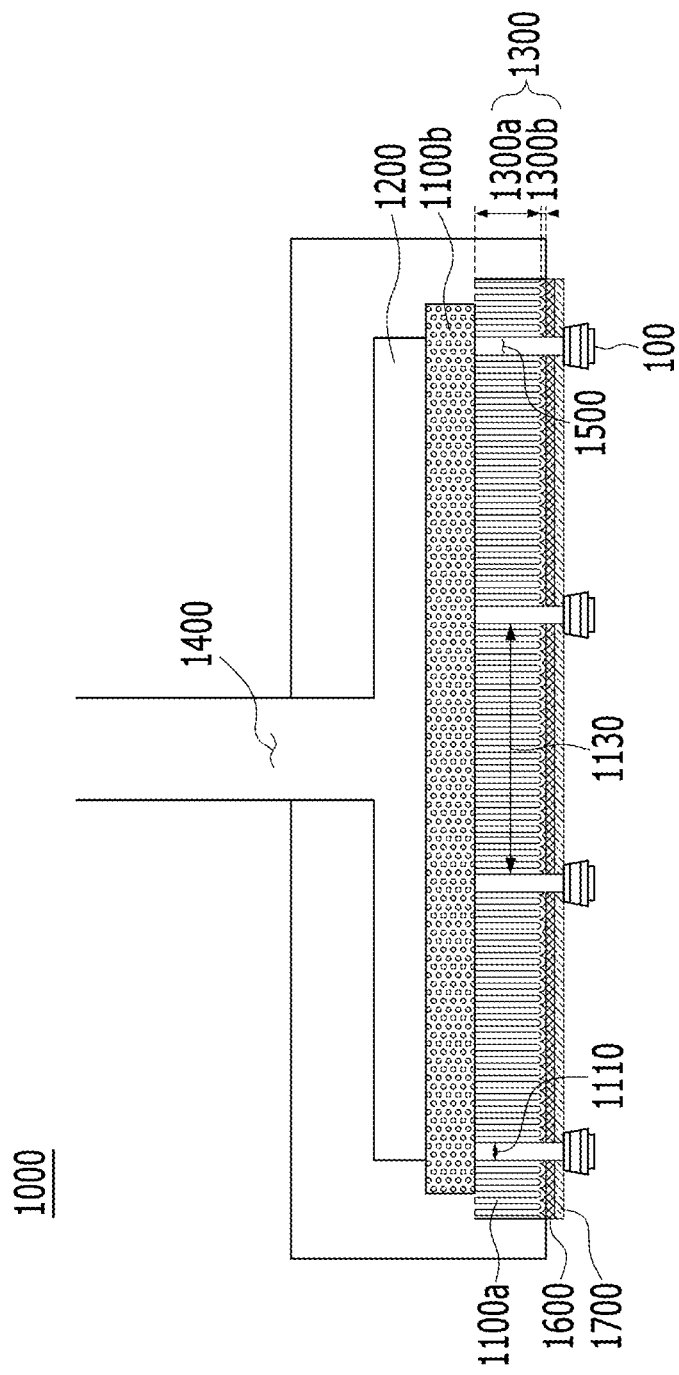
FIG. 22 is a view illustrating a transfer head according to an eighth embodiment of the present invention.

FIG. 22 is a view illustrating a transfer head according to the eighth embodiment of the present invention.

FIG. 22 is a view illustrating a transfer head 1000 according to the eighth embodiment of the present invention. The transfer head 1000 according to the eighth embodiment of the present invention includes: a grip member embodied by an anodic oxide film 1300 and having grip regions 1110 on which the micro LEDs 100 are gripped and a non-grip region 1130 on which the micro LEDs 100 are not gripped; and a support member having arbitrary pores and supporting the grip member from an upper surface of the grip member.

In the same manner as that described for the transfer head 1000 according to the seventh embodiment, the transfer head 1000 according to the eight embodiment may be configured such that a first porous member 1100*a* having vertical pores is the grip member, and a second porous member 1100*b* is the support member having arbitrary pores and supporting the grip member.

In other words, the first porous member 1100*a* may be the grip member, and the second porous member 1100*b* may be the support member. Therefore, although the reference numerals of the grip member and the support member are omitted in the following description, the grip member may be designated by reference numeral 1100*a* of FIG. 22, and the support member may be designated by reference numeral 1100*b* of FIG. 22.

The eighth embodiment differs from the seventh embodiment in that the grip member is configured such that a barrier layer 1300*b* is positioned at a lower portion of the anodic oxide film 1300. In addition, the eight embodiment differs from the seventh embodiment in that a buffer part 1600 and a metal part 1700 are provided underneath the grip member.

It should be noted that the eight embodiment described below will be described with particular emphasis on characteristic components as compared with the seventh embodiment, and detailed descriptions of the same or similar components as those of the seventh embodiment will be omitted.

The grip member includes the grip regions 1110 on which the micro LEDs 100 are gripped with a vacuum suction force and the non-grip region 1130 on which the micro LEDs 100 are not gripped.

The grip member is supported by the support member provided on the porous member.

The support member is provided separately from the grip member. The support member disperses the suction force of a suction chamber 1200 through a pore structure thereof and transfers the suction force to the grip regions 1110. As a result, the vacuum suction force is generated in the grip member so that the micro LEDs 100 are gripped onto a grip surface of the grip member.

As illustrated in FIG. 22, the support member is provided on a side opposite to the grip surface of the grip member and has the arbitrary pores communicating with the grip regions 1110 via air flow paths. The support member supports the grip member by sucking the non-grip region 1130 of the grip member with the vacuum suction force and grips the micro LEDs 100 onto the grip regions 1110 by communicating with the grip member via the air flow paths.

As illustrated in FIG. 22, the grip member may be embodied by the anodic oxide film 1300 including the porous layer 1300a and the barrier layer 1300b.

In other words, the first porous member 1100a is the grip member, and the grip member may be the anodic oxide film 1300.

The anodic oxide film 1300 may be configured such that the barrier layer 1300b is positioned at a lower portion of the anodic oxide film 1300, and the porous layer 1300a is positioned on the barrier layer 1300b.

The barrier layer 1300b may have a flat surface. Therefore, in the case of the barrier layer 1300b being positioned at the lower portion of the anodic oxide film 1300, the non-grip region 1130 provided by the barrier layer 1300b may have a flat surface.

In the case of the barrier layer 1300b being positioned at the lower portion of the anodic oxide film 1300, the grip member may have a flat lower surface. This makes it easier to form the buffer part 1600 preventing damage to the micro LEDs 100 when gripping the micro LEDs 100 and to form the metal part 1700 preventing the generation of static electricity.

Specifically, as illustrated in FIG. 22, since the barrier layer 1300b is provided at the lower portion of the anodic oxide film 1300, it is possible to form the lower surface of the anodic oxide film 1300 flat compared with a configuration in which the porous layer 1300a is positioned at the lower portion of the anodic oxide film 1300. At least a part of the lower exposed surface of the grip member is in contact with the micro LEDs 100 when gripping the micro LEDs 100 so that the transfer head 1000 grips the micro LEDs 100 onto the grip regions 1110. Here, the lower exposed surface of the grip member may be the non-grip region 1130. In this case, the micro LEDs 100 may be damaged by the contact with the grip member embodied by the anodic oxide film 1300 having a high hardness. Therefore, it is preferable to combine the buffer part 1600 with the lower exposed surface of the grip member, the buffer part 1600 performing the buffering function.

The buffer part 1600 may be made of an elastic material. The buffer part 1600 may be made of a photoresist (PR), PDMS, or a metal, and may be formed through an exposure process or sputtering.

When detaching the micro LEDs 100 from the using laser lift-off (LLO) process, the buffer part 1600 performs the buffering function preventing damage to the micro LEDs 100. For example, in the case that the first substrate is the growth substrate 101, when detaching the micro LEDs 100 from the growth substrate 101 using the LLO process, the micro LEDs 100 may be repelled from the growth substrate 101 toward the transfer head 1000 due to the gas pressure. In this case, the buffer part 1600 made of the elastic material functions to support the micro LEDs 100 in the upward direction while being in contact with the micro LEDs 100 and performs the buffering function.

Even in a case that the first substrate is a temporary substrate or a carrier substrate, the buffer part 1600 made of the elastic material prevents damage to the micro LEDs 100. For example, in a case that GaN is selected for semiconductor materials of the first semiconductor layer 102 and the second semiconductor layer 104 included in each of the micro LEDs 100, the first semiconductor layer 102 and the second semiconductor layer 104 may be damaged due to weak rigidity of GaN when the transfer head 1000 and the micro LEDs 100 are brought into close contact with each other. However, since the buffer part 1600 made of the elastic material is provided, the buffer part 1600 functions as a buffer when the transfer head 1000 and the micro LEDs 100 are brought into close contact with each other, thereby preventing damage to layers of the micro LEDs 100 such as the first semiconductor layer 102 and the second semiconductor layer 104.

The metal part 1700 may be provided below the buffer part 1600 provided on the exposed surface of the non-grip region 1130. The metal part 1700 having openings formed at positions corresponding to openings of the grip member and openings of the buffer part 1600 may be provided and bonded to the exposed surface excluding the openings of the grip member and the openings of the buffer part 1600.

As illustrated in FIG. 22, the metal part 1700 may be configured with the openings at the positions corresponding to the openings of the grip member and the openings of the buffer part 1600. In this case, the area of the openings of the metal part 1700 may be the same as the area of the openings of the grip member and the area of the openings of the buffer part 1600.

The metal part 1700 may be made of a metal. Therefore, it is possible to prevent the generation of electrostatic force that interferes with the process in which the transfer head 1000 transfers the micro LEDs 100.

In detail, an electrostatic force caused by electrification may undesirably occur between the first substrate (for example, the growth substrate 101, a temporary substrate, or a carrier substrate (C)) and the transfer head 1000 or between the second substrate (for example, the display substrate 301, a temporary substrate, a target substrate, or a circuit board (HS)) and the transfer head 1000 due to friction or the like in the process in which the transfer head 1000 transfers the micro LEDs 100. This undesirable electrostatic force has a great influence on the micro LEDs 100 having a size of 1 µm to 100 µm even when the electrostatic force is caused by small charges.

In other words, after the transfer head 1000 grips the micro LEDs 100 from the first substrate, when an electrostatic force is generated in the unloading process in which the micro LEDs 100s are mounted on the second substrate, the micro LEDs 100 may stick to the transfer head 1000 and be unloaded to the second substrate with wrong positions, or unloading may not be performed at all.

To this end, the metal part 1700 made of a metal is provided on the exposed surface of the buffer part 1600, whereby an electrostatic force having negative effects and generated in the process in which the transfer head 1000 transfers the micro LEDs 100 can be removed.

In addition, the metal part 1700 may be configured to have an electrode pattern and thus electrically connected to the contact electrodes 106 and 107 of the micro LEDs 100, thereby checking whether the micro LEDs 100 are defective in an electrical manner.

Ninth Embodiment

Hereinafter, a ninth embodiment of the present invention will be described. It should be noted that the embodiment described below will be described with particular emphasis on characteristic components as compared with the sixth embodiment, and descriptions of the same or similar components as those of the sixth embodiment will be omitted.

Figure 23A:
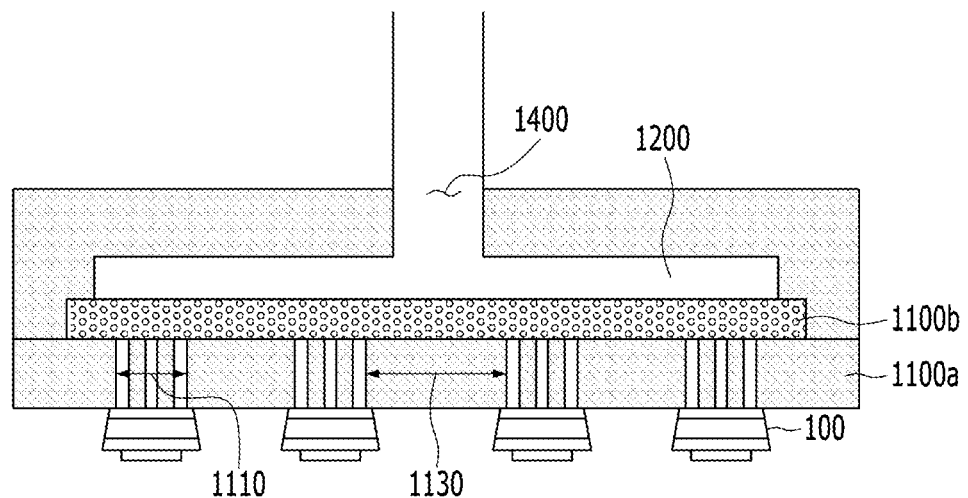
FIG. 23A is a view illustrating a transfer head according to a ninth embodiment of the present invention.
Figure 23B:
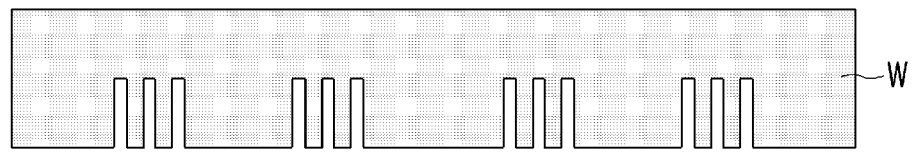
FIG. 23B to FIG. 23D are views illustrating a process of manufacturing the transfer head according to the ninth embodiment of the present invention.
Figure 23C:
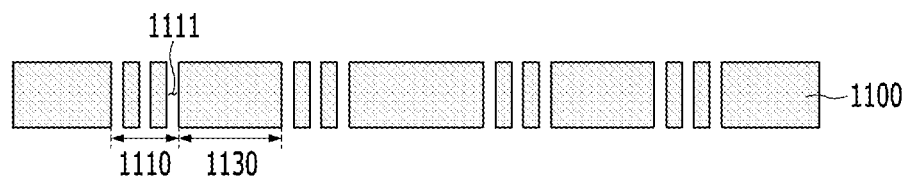
Figure 23D:
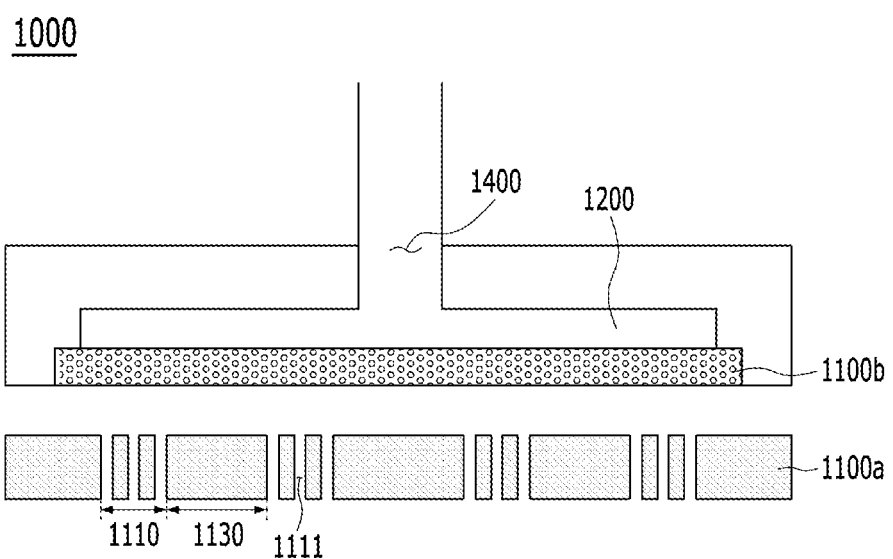

FIG. 23A is a view illustrating a transfer head according to the ninth embodiment of the present invention; and FIG. 23B to FIG. 23D are views illustrating a process of manufacturing the transfer head according to the ninth embodiment of the present invention.

FIG. 23A illustrates a transfer head 1000 according to the ninth embodiment gripping the micro LEDs 100 of a substrate (S).

As illustrated in FIG. 23a, the transfer head 1000 according to the ninth embodiment includes: a grip member having vertical pores formed by etching; and a support member supporting the grip member from an upper surface of the grip member.

The transfer head 1000 according to the ninth embodiment may be configured such that a first porous member 1100a having through-holes 1111, which are vertical pores, is the grip member, and a second porous member 1100b is the support member having arbitrary pores and supporting the grip member.

In other words, the first porous member 1100a may be the grip member, and the second porous member 1100b may be the support member. Therefore, although the reference numerals of the grip member and the support member are omitted in the following description, the grip member may be designated by reference numeral 1100a of FIG. 23A and FIG. 23D, and the support member may be designated by reference numeral 1100b of FIG. 23A and FIG. 23D.

The grip member according to the ninth embodiment is configured such that the through-holes 1111 are formed by etching, and each of the through-holes 1111 defines one grip region 1110. Although FIG. 23A to FIG. 23D illustrate that multiple vertical pores define one grip region 1110, one vertical pore formed by etching may define one grip region 1110.

The grip member includes: the grip regions 1110 defined by the through-holes 1111 and gripping the micro LEDs 100; and a non-grip region 1130 having no through-holes 1111. The grip member may be embodied by a wafer substrate (w).

The through-holes 1111 may be the vertical pores formed by etching. The through-holes 1111 extend from top to bottom of the grip member whereby the grip member is provided with the grip regions 1110. The through-holes 1111 perform the same function as the suction holes 1500 defining the grip regions 1110 of the transfer head according to the above-described embodiments.

The wafer substrate (w) made of silicon is provided to form the grip member in which the grip regions 1110 are defined by the through-holes 1111.

Then, as illustrated in FIG. 23B, the through-holes 1111 are formed by etching. The through-holes 1111 may be formed by etching at least a part of the wafer substrate (w). FIG. 23A illustrates the wafer substrate (w) being partly etched from the bottom in the depth direction to form the multiple through-holes 1111. However, the wafer substrate (w) may be partly etched from the top in the depth direction. An etching method here may be wet etching, dry etching, or the like which is conventionally used in a semiconductor manufacturing process.

The grip regions 1110 of the grip member of the transfer head 1000 according to the ninth embodiment are defined by the through-holes 1111. The through-holes 1111 defining one grip region 1110 are formed by etching, and the multiple grip regions 1110 are formed by the same process, whereby the grip regions 1110 are provided to grip the micro LEDs 100 from the substrate (S). In this case, each of the grip regions 1110 is configured to have an area smaller than the horizontal area of the upper surface of each of the micro LEDs 100, thereby preventing vacuum leak.

The grip regions 1110 defined by the through-holes 1111 may be configured such that pitch distances thereof in a column direction (x-direction) and in a row direction (y-direction) are the same as pitch distances in the column direction (x-direction) and in the row direction (y-direction) of the micro LEDs 100 positioned on the substrate (S) or three times the pitch distances of the micro LEDs 100. FIG. 23A to FIG. 23D illustrate the grip regions 1110 being configured such that the pitch distance thereof in the column direction (x-direction) is the same as the pitch distance in the column direction (x-direction) of the micro LEDs 100 positioned on the substrate (S).

FIG. 23B illustrates a process of forming the through-holes 1111 defining the grip regions 1110.

In this case, the through-holes 1111 constituting one grip region 1110 are formed with a constant pitch distance, and then the through-holes 1111 are formed with a constant pitch distance at positions spaced apart from the previous through-holes 1111 in consideration of the pitch distance of the grip regions 1110.

Although FIG. 23A to FIG. 23D illustrate an example in which the three through-holes 1111 constitute one grip region 1110, the number of multiple through-holes 1111 constituting one grip region 1110 is not limited. However, since each of the grip regions 1110 is required to have an area smaller than the horizontal area of the upper surface of each of the micro LEDs 100, the multiple through-holes 1111 are preferably provided so that each of the grip regions 1110 has an area smaller than the horizontal area of each of the micro LEDs 100.

Then, as illustrated in FIG. 23C, the opposite surface of the etched surface of the wafer substrate (w) is removed. Accordingly, the multiple through holes 1111 formed in FIG. 23B extend from top to bottom of the wafer substrate (w), whereby the grip member having the through-holes 1111 formed by etching is provided. The multiple grip regions 1110 defined by the through-holes 1111 are formed in the grip member. The grip member may be configured in the same manner as that described for the seventh embodiment and the eight embodiment.

Then, as illustrated in FIG. 23D, the porous member is combined with a lower portion of the support member having the arbitrary pores and supporting the grip member. The support member supports the grip member from the upper surface of the grip member. In a case that the wafer substrate (w) provided in the form of a thin plate is etched to form tens of thousands of through-holes and not provided with a support member, there is a high possibility that brittle fracture occurs in the grip member due to the high vacuum suction force. Therefore, it is required to support the grip member using the support member such as a porous ceramic member.

With respect to the transfer head 1000 according to the ninth embodiment provided with the grip member having the multiple grip regions 1110 having the vertical pores formed by etching the wafer described with reference to FIG. 23B to FIG. 23D, the grip regions 1110 are configured such that the pitch distances in the column direction (x-direction) and in the row direction (y-direction) are the same as the pitch distances in the column direction (x-direction) and in the row direction (y-direction) of the micro LEDs 100 disposed on the substrate (S), whereby the transfer head 1000 grips all of the micro LEDs 100 from the substrate (S) in a batch manner. Alternatively, the grip regions 1110 are configured such that the pitch distances in the column direction (x-direction) and in the row direction (y-direction) are more than three times the pitch distances in the column direction (x-direction) and in the row direction (y-direction) of the micro LEDs 100 disposed on the substrate (S), whereby the transfer head 1000 selectively grips and transfers the micro LEDs 100 disposed on the substrate (S).

The vacuum pressure is reduced by the arbitrary pores of the support member and transmitted to the through-holes 1111 of the grip member so that the transfer head 1000 according to the ninth embodiment grips the micro LEDs 100. In addition, the vacuum pressure is transmitted to the non-grip region 1130 by the arbitrary pores of the support member, thereby sucking the grip member.

Tenth Embodiment

Hereinafter, a tenth embodiment of the present invention will be described. It should be noted that the embodiment described below will be described with particular emphasis on characteristic components as compared with the sixth embodiment, and descriptions of the same or similar components as those of the sixth embodiment will be omitted.

Figure 24:
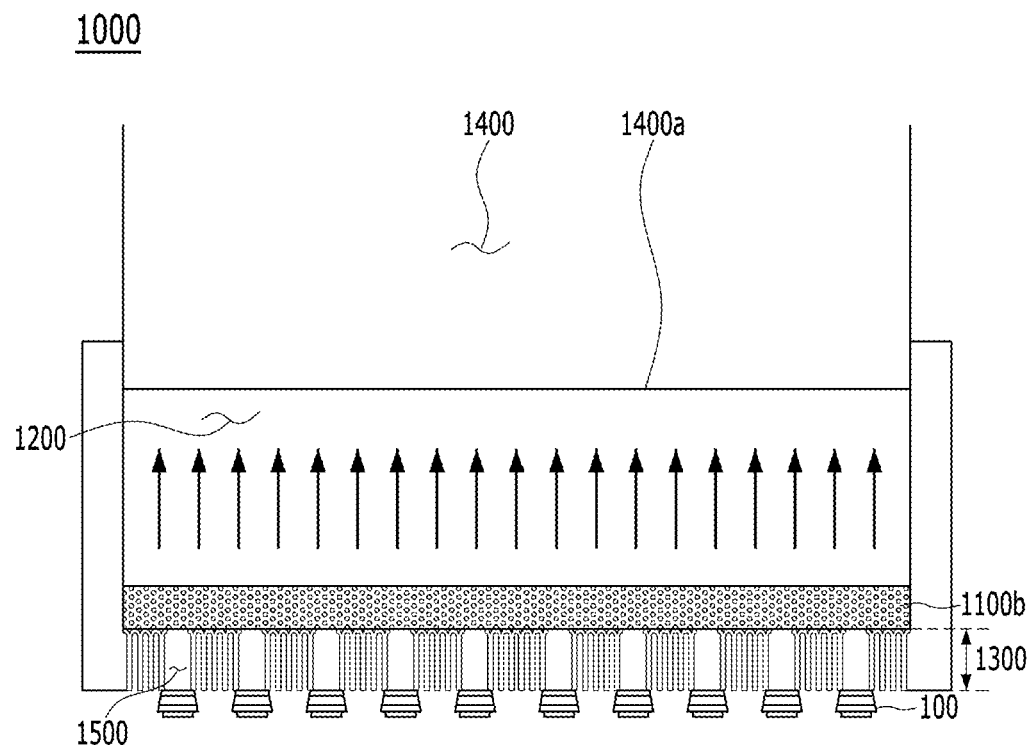
FIG. 24 is a view illustrating a transfer head according to a tenth embodiment of the present invention.

FIG. 24 is a view illustrating a transfer head according to the tenth embodiment of the present invention.

Although FIG. 24 illustrates the transfer head according to the tenth embodiment having the same structure as the transfer head according to the seventh embodiment, the transfer head according to the tenth embodiment is not limited to this and may have the same structures as the transfer heads according to the sixth, eighth, and ninth embodiments.

The transfer head 1000 according to the tenth embodiment may be configured such that a first porous member having through-holes 1500, which are vertical pores, is a grip member, and a second porous member 1100b is a support member having arbitrary pores and supporting the grip member.

In other words, the first porous member may be the grip member, and the second porous member 1100b may be the support member. Therefore, although the reference numeral of the support member is omitted in the following description, the support member may be designated by reference numeral 1100b of FIG. 24.

In addition, the grip member may be provided as an anodic oxide film 1300. Therefore, although the reference numerals of the first porous member and the grip member are omitted in the following description, the first porous member and the grip member may be designated by reference numeral 1300 of FIG. 24.

In the transfer head 1000, a suction pipe 1400 includes a connection portion 1400a, wherein the connection portion 1400a connects between the suction chamber 1200 and the suction pipe 1400 to supply a vacuum pressure to the suction chamber 1200. A horizontal area of the connection portion 1400a is configured to be equal to a horizontal area of an upper surface of the grip member.

The transfer head 1000 may be configured such that the grip member is embodied by the anodic oxide film 1300 including a barrier layer and the second porous member 1100b is embodied by the porous member having arbitrary pores. In this case, the grip member may be the grip member embodied by the anodic oxide film 1300 as an example or may be embodied by the first porous member having the vertical pores. The grip member may be configured according to the seventh to ninth embodiments.

As illustrated in FIG. 24, the suction pipe 1400 is provided on the suction chamber 1200, and the connection portion 1400a is provided between the suction chamber 1200 and the suction pipe 1400. The suction chamber 1200 and the suction pipe 1400 are connected to each other by the connection portion 1400a. A horizontal area of the connection portion 1400a is configured to be equal to the horizontal area of the upper surface of the grip member functioning to grip the micro LEDs 100.

The suction pipe 1400 may be configured to have a horizontal area equal to the horizontal area of the upper surface of the grip member, the suction pipe 1400 being connected to an upper portion of the suction chamber 1200 in the vertical direction by the connection portion 1400a having the horizontal area equal to the horizontal area of the grip member. Since the connection portion 1400a is configured to have the same horizontal area as the grip member, a uniform vacuum suction force is generated over the entire grip surface of the grip member of the transfer head 1000.

Specifically, the connection portion 1400a functions to connect between the suction chamber 1200 and the suction pipe 1400 to allow a vacuum pressure to introduce into the suction chamber 1200 when the vacuum pressure supplied by a vacuum pump is introduced through the suction pipe 1400. In this case, a horizontal range of the vacuum pressure introduced into the support member and the grip member may vary depending on the horizontal area of the connection portion 1400a. For example, the horizontal area of the connection portion 1400a connecting between the suction chamber 1200 and the suction pipe 1400 is smaller than the horizontal area of the upper surface of the grip member, and the vacuum pressure supplied from the vacuum pump is transmitted to the support member and the grip member through the suction pipe 1400 and the connection portion 1400a. In this case, the vacuum pressure supplied to the suction pipe 1400 is transmitted to the suction chamber 1200 through the connection portion 1400a, and then the vacuum pressure is transmitted from the suction chamber 1200 to the grip regions 1110 of the grip member embodied by the anodic oxide film 1300 through the support member, whereby the vacuum pressure can be transmitted to the grip regions 1110 at positions corresponding to a position where the connection portion 1400a is provided. In a case of the connection portion 1400a having a horizontal area smaller than the horizontal area of the upper surface of the grip member, the grip regions 1110 at the positions corresponding to the position where the connection portion 1400a is provided and the grip regions 1110 at positions corresponding to a position where the connection portion 1400*a* is not provided may be different from each other with respect to the vacuum pressure transmitted from the suction chamber 1200 through the connection portion 1400*a*. As a result, the grip force on the grip surface of the transfer head 1000 may become uneven.

However, in the transfer head 1000 of the present invention, the connection portion 1400*a* connecting between the suction chamber 1200 and the suction pipe 1400 is configured to have the horizontal area equal to the horizontal area of the upper surface of the grip member so that a uniform grip force is generated over the entire micro LED grip surface which is the lower surface of the grip member, compared with the configuration in which the connection portion 1400*a* has the horizontal area smaller than the horizontal area of the upper surface of the grip member. As a result, it is possible to solve a problem that when the transfer head 1000 grips the micro LEDs 100, the micro LEDs 100 positioned at the edge side of the substrate (S) are not gripped onto the grip surface due to uneven grip force of the grip surface and thus the micro LEDs 100 are detached.

The arrows illustrated in FIG. 24 indicate a direction of the uniform grip force generated on the grip surface of the grip member, that is, the first porous member or the anodic oxide film 1300, due to the vacuum pressure transmitted from the suction chamber 1200.

Eleventh Embodiment

Hereinafter, an eleventh embodiment of the present invention will be described. It should be noted that the embodiment described below will be described with particular emphasis on characteristic components as compared with the tenth embodiment, and descriptions of the same or similar components as those of the tenth embodiment will be omitted.

Figure 25:
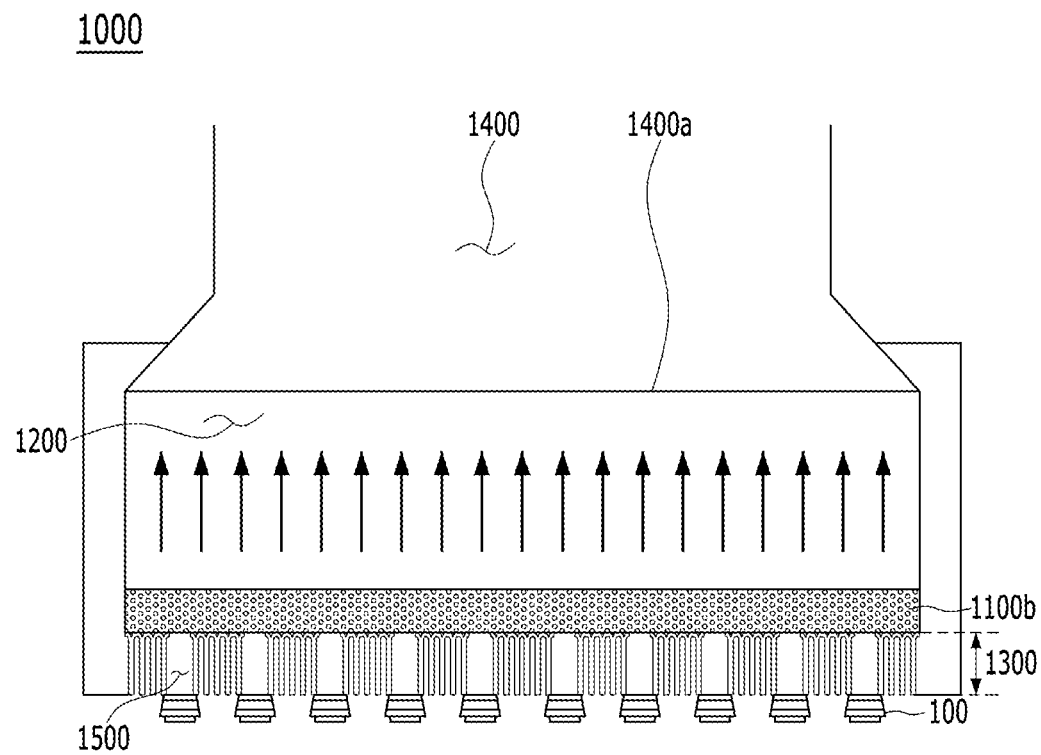
FIG. 25 is a view illustrating a transfer head according to an eleventh embodiment of the present invention.

FIG. 25 is a view illustrating a transfer head according to the eleventh embodiment of the present invention.

Although FIG. 25 illustrates the transfer head according to the eleventh embodiment having the same structure as the transfer head according to the seventh embodiment, the transfer head according to the eleventh embodiment is not limited to this and may have the same structures as the transfer heads according to the sixth, eighth, and ninth embodiments.

The transfer head 1000 according to the eleventh embodiment may be configured such that a first porous member having through-holes 1500, which are vertical pores, is a grip member, and a second porous member 1100*b* is the support member having arbitrary pores and supporting the grip member.

In other words, the first porous member may be the grip member, and the second porous member 1100*b* may be the support member. Therefore, although the reference numeral of the support member is omitted in the following description, the support member may be designated by reference numeral 1100*b* of FIG. 25.

In addition, the grip member may be provided as an anodic oxide film 1300. Therefore, although the reference numerals of the first porous member and the grip member are omitted in the following description, the first porous member and the grip member may be designated by reference numeral 1300 of FIG. 25.

A transfer head 1000 according to the eleventh embodiment differs from the transfer head 1000 according to the tenth embodiment in that a suction pipe 1400 has the same horizontal area as a connection portion 1400*a* but different shapes.

As illustrated in FIG. 25, the suction pipe 1400 is configured such that a lower portion thereof is expanded and the horizontal area of the connection portion 1400*a* is the same as the horizontal area of the upper surface of the grip member. An outer diameter of the lower portion of the suction pipe 1400 becomes greater in the downward direction where the suction chamber 1200 is disposed so that the suction pipe 1400 is connected to the suction chamber 1200. Accordingly, the suction pipe 1400 is configured in an expanded shape as the outer diameter of the lower portion thereof is increased in the downward direction such that the horizontal area of the connection portion 1400*a* of the suction pipe 1400 is the same as the horizontal area of the upper surface of the grip member.

With such structure, the suction chamber 1200 allows a uniform grip force to generate on a grip surface of the grip member. As a result, the grip surface of the transfer head 1000 can ensure the uniform grip force, and the micro LEDs 100 can be gripped from the substrate (S) without a problem that the grip force is weakened at any positions on the grip surface so that the micro LEDs 100 are not gripped.

The connection portion 1400*a* of the suction pipe 1400 may be provided with a dispersion member. The dispersion member may be provided in the suction pipe 1400 or in the connection portion 1400*a* of the suction pipe 1400 inside the suction chamber 1200. The dispersion member performs a buffer function to make air pressure generated by a vacuum pump uniform on the sides of the support member and the grip member. The dispersion member may be embodied by a porous member having arbitrary pores or a porous member having vertical pores. In the case of the dispersion member being embodied by a porous member having arbitrary pores, it is possible to disperse the air pressure in the horizontal direction. Accordingly, the vacuum pressure of the grip member that provides the grip surface can be uniform. Alternatively, in the case of the dispersion member being embodied by a porous member having vertical pores, it is possible to eliminate concentration of the vacuum pressure of the grip member providing the grip surface in which multiple vertical pores are provided. The dispersion member may be configured to have a hole structure constituting the dispersion member such that the number of lower holes provided at a lower end portion of the dispersion member is greater than the number of upper holes provided at an upper end portion of the dispersion member. In this case, the upper holes and the lower holes may communicate with each other via multiple air flow paths. With this structure, the dispersion member can uniformize the air pressure at lower hole positions.

Alternatively, multiple suction pipes 1400 may be provided and supply the vacuum pressure to the suction chamber 1200. Each of the suction pipes 1400 includes a connection portion 1400*a*. In the case of the multiple suction pipes 1400, the transfer head 1000 may include a collective pipe connecting the multiple suction pipes 1400 in a collective manner.

The multiple suction pipes 1400 may be provided at positions where the vacuum pressure can be uniformly transmitted to the upper surface of the grip member via the suction chamber 1200. In this case, the multiple suction pipes 1400 may be provided in consideration of a micro LED present region where the micro LEDs 100 are present on the substrate (S).

For example, in a case of the transfer head 1000 being provided with three suction pipes 1400, a first suction pipe, a second suction pipe, and a third suction pipe that includes a third connection portion are provided, wherein the first suction pipe includes a first connection portion at a position connected to the center of the suction chamber 1200, and the second suction pipe includes a second connection portion at a position connected to the outer periphery of the suction chamber 1200. Here, the center of the suction chamber 1200 refers to a position corresponding to the center in the micro LED present region, and the outer periphery of the suction chamber 1200 refers to a position corresponding to one end and the other end in the micro LED present region. The first to third suction pipes are connected with each other via the collective pipe, and the vacuum pressure supplied from the vacuum pump is transmitted to the multiple suction pipes 1400 via the collective pipe.

A horizontal area of the first connection portion of the first suction pipe may be different from a horizontal area of each connection portion of the second and third suction pipes. Specifically, the first connection portion, which is connected to the center of the suction chamber 1200 and into which to easily introduce the vacuum pressure supplied from the vacuum pump, is configured to have a smaller horizontal area than the second and third connection portions, which are connected to the outer periphery of the suction chamber 1200 and into which to introduce the vacuum pressure with difficulty. The first to third connection portions are configured to have different horizontal areas so that the micro LED transfer head adjusts the amount of vacuum pressure to be introduced, thereby generating a uniform grip force on the grip surface. In other words, in the case of the multiple suction pipes 1400, connection portions 1400a of the suction pipes 1400 are configured to have different horizontal areas in consideration that inflow amount of vacuum pressure supplied from the vacuum pump differs depending on positions of the suction pipes 1400. As a result, a uniform grip force can be generated on the grip surface.

In the case of the multiple suction pipes 1400, vortex generating means in the form of a spiral may be provided in each suction pipe 1400. The vortex generating means may be provided inside the second and third suction pipes connected to the outer periphery of the suction chamber 1200. The vortex generating means functions to induce the flow of air to be accelerated so that the vacuum pressure supplied from the vacuum pump can be easily transmitted to the suction chamber 1200 via the second and third connection portions.

The multiple suction pipes 1400 may not be connected with each other via the collective pipe but may be connected to individual vacuum pumps capable of being controlled individually to supply the vacuum pressure.

Alternatively, the multiple suction pipes 1400 may include: a first suction pipe connected to the center of the suction chamber 1200; and a second suction pipe connected to the outer periphery of the suction chamber 1200 while continuously surrounding the first suction pipe. Also, in this case, the connection portions of the first and second suction pipes may have different horizontal areas. Specifically, the connection portion of the first suction pipe, which is easy to introduce the vacuum pressure, may be configured to have a smaller horizontal area than the connection portion of the second suction pipe. As a result, a uniform grip force can be generated on the entire grip surface of the transfer head 1000.

The connection portions of the multiple suction pipes 1400 may be provided with a dispersion member. In the case of the multiple suction pipes 1400, the dispersion member may be provided in the suction pipe 1400 or in the connection portions 1400a of the suction pipes 1400 inside the suction chamber 1200 and/or at a connection part of the suction pipes 1400. The connection part of the suction pipes 1400 refers to a portion where the suction pipes 1400 and the collective pipe are connected with each other in a collective manner between the suction pipes 1400 and the collective pipe. In this case, the dispersion member may be embodied by a porous member having arbitrary pores or a porous member having vertical pores as described above.

A micro LED display may include the display substrate 301. The above-mentioned method of manufacturing the micro LED display includes a method performed in the final process of manufacturing the structure including the display substrate 301. Therefore, the method of manufacturing the micro LED display according to the present invention includes not only the process in which the above-described transfer head transfers the micro LEDs to the display substrate 301 but also a process in which the above-described transfer head transfers the micro LEDs to a temporary substrate or a carrier substrate before transferring to the display substrate 301.

As described above, the present invention has been described with reference to the preferred embodiments. However, those skilled in the art will appreciate that various modifications, additions and substitutions are possible, without departing from the scope and spirit of the invention as disclosed in the accompanying claims.

What is claimed is:

1. A method of manufacturing a micro LED display using a transfer head including a porous member having pores, wherein the porous member includes one or more grip regions on which micro LEDs are gripped and one or more non-grip regions on which micro LEDs are not gripped, the method comprising:
    gripping micro LEDs onto the grip regions, while a grip force of the grip regions is generated, the transfer head moves relative to the micro LEDs in a horizontal direction, and a lower surface of the transfer head is spaced apart from upper surfaces of the micro LEDs by a predetermined distance,
    wherein the predetermined distance is set to a distance sufficient to attract the micro LEDs with the grip force of the grip regions, and
    wherein the movement of the transfer head relative to the micro LEDs is achieved by reciprocation.

2. The method of claim 1, wherein the micro LEDs gripped onto the grip regions are normal micro LEDs.

3. The method of claim 1, wherein the transfer head grips the micro LEDs from above a collecting box where normal micro LEDs are collected.

4. The method of claim 1, wherein the micro LEDs gripped onto the grip regions are in a matrix form.

5. The method of claim 1, wherein the transfer head grips the micro LEDs from above a fluid in which normal micro LEDs float.

* * * * *